(12) United States Patent
Takahashi et al.

(10) Patent No.: US 8,995,606 B2
(45) Date of Patent: Mar. 31, 2015

(54) SCANNING SIGNAL LINE DRIVE CIRCUIT AND DISPLAY DEVICE PROVIDED WITH SAME

(75) Inventors: Yoshihisa Takahashi, Osaka (JP); Yasuaki Iwase, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 158 days.

(21) Appl. No.: 13/805,781

(22) PCT Filed: May 20, 2011

(86) PCT No.: PCT/JP2011/061626
§ 371 (c)(1),
(2), (4) Date: Dec. 20, 2012

(87) PCT Pub. No.: WO2011/162057
PCT Pub. Date: Dec. 29, 2011

(65) Prior Publication Data
US 2013/0093743 A1    Apr. 18, 2013

(30) Foreign Application Priority Data

Jun. 25, 2010   (JP) ................................ 2010-145627

(51) Int. Cl.
| | | |
|---|---|---|
| G11C 19/00 | (2006.01) | |
| G09G 5/00 | (2006.01) | |
| G11C 19/28 | (2006.01) | |
| G09G 3/36 | (2006.01) | |
| G11C 19/18 | (2006.01) | |

(52) U.S. Cl.
CPC ............. *G09G 5/001* (2013.01); *G11C 19/28* (2013.01); *G09G 2310/0286* (2013.01); *G09G 3/3677* (2013.01); *G09G 2310/06* (2013.01); *G11C 19/184* (2013.01)
USPC .................. 377/64; 377/78; 377/79

(58) Field of Classification Search
None
See application file for complete search history.

(56) References Cited

U.S. PATENT DOCUMENTS 8,494,109 B2 *   7/2013   Ohara ............................. 377/64
8,565,369 B2 * 10/2013   Takahashi et al. ............. 377/64
(Continued)

FOREIGN PATENT DOCUMENTS

| JP | 2003-202840 A | 7/2003 |
|---|---|---|
| JP | 2006-127630 A | 5/2006 |

(Continued)

OTHER PUBLICATIONS

Official Communication issued in International Patent Application No. PCT/JP2011/061626, mailed on Aug. 23, 2011.

*Primary Examiner* — Tuan T Lam
(74) *Attorney, Agent, or Firm* — Keating & Bennett, LLP

(57) ABSTRACT

A stage constituent circuit of a display device drive circuit includes a first-node to a third-node, a thin-film transistor that changes a potential of a scanning signal toward a VDD potential when a potential of the first-node is in a HIGH level, a thin-film transistor that changes a potential of a different stage control signal toward a potential of a clock when a potential of the second-node is in the HIGH level, a capacitor between the first-node and the second-node, and a capacitor between the second-node and the third-node. The potential of the first-node is raised on the basis of a different stage control signal output from the stage constituent circuit in the different stage, and then the potential of the second-node and a potential of the third-node are sequentially raised. Herein, an amplitude of the clock is set to be smaller than an amplitude of the scanning signal.

20 Claims, 36 Drawing Sheets

(56) References Cited

U.S. PATENT DOCUMENTS

| | | | |
|---|---|---|---|
| 8,605,028 B2 * | 12/2013 | Sakamoto et al. | 345/100 |
| 8,643,584 B2 * | 2/2014 | Han et al. | 345/100 |
| 8,649,477 B2 * | 2/2014 | Matsui | 377/64 |
| 2003/0174118 A1 | 9/2003 | Sato et al. | |
| 2006/0262074 A1 | 11/2006 | Shimoda | |
| 2007/0248205 A1 | 10/2007 | Deane | |
| 2008/0054992 A1 | 3/2008 | Kajiwara et al. | |
| 2008/0062071 A1 * | 3/2008 | Jeong | 345/46 |
| 2008/0226013 A1 | 9/2008 | Deane | |
| 2010/0259525 A1 | 10/2010 | Ohkawa et al. | |
| 2012/0044132 A1 * | 2/2012 | Koga et al. | 345/100 |
| 2013/0028370 A1 * | 1/2013 | Kikuchi et al. | 377/64 |
| 2013/0044854 A1 * | 2/2013 | Yonemaru et al. | 377/64 |
| 2013/0177128 A1 * | 7/2013 | Ko et al. | 377/64 |
| 2013/0266113 A1 * | 10/2013 | Tsuge et al. | 377/64 |
| 2014/0093028 A1 * | 4/2014 | Wu | 377/64 |
| 2014/0105351 A1 * | 4/2014 | Chan et al. | 377/64 |

FOREIGN PATENT DOCUMENTS

| | | |
|---|---|---|
| JP | 2006-351165 A | 12/2006 |
| JP | 2008-61323 A | 3/2008 |
| JP | 2008-508654 A | 3/2008 |
| JP | 2008-537275 A | 9/2008 |
| WO | 2009/084267 A1 | 7/2009 |

* cited by examiner

SCANNING SIGNAL LINE DRIVE CIRCUIT AND DISPLAY DEVICE PROVIDED WITH SAME

TECHNICAL FIELD

The present invention relates to a display device and a drive circuit thereof, specifically, a scanning signal line drive circuit including a shift register for driving a scanning signal line disposed in a display part of the display device.

BACKGROUND ART

In recent years, as for liquid crystal display devices, a gate driver (a scanning signal line drive circuit) for driving gate bus lines (scanning signal lines) have been increasingly monolithic. Heretofore, a gate driver has been often mounted as an IC (Integrated Circuit) chip around a substrate that forms a liquid crystal panel. On the other hand, recently, a structure that a gate driver is directly formed on a substrate has been gradually and increasingly adopted. Such a gate driver is called a "monolithic gate driver" or the like. In a liquid crystal display device including the monolithic gate driver, typically, a thin-film transistor made of amorphous silicon (a-Si) has been adopted as a driving element. However, recently, a thin-film transistor made of polycrystalline silicon, microcrystalline silicon, an oxide semiconductor (e.g., IGZO) or the like tends to be adopted as the driving element.

By the way, a display part of an active matrix-type liquid crystal display device includes a pixel circuit including a plurality of source bus lines (video signal lines), a plurality of gate bus lines, and a plurality of pixel formation portions formed in correspondence with intersections between the plurality of source bus lines and the plurality of gate bus lines respectively. The plurality of pixel formation portions are arranged in a matrix to form a pixel array. Each of the pixel formation portions includes a thin-film transistor which is a switching element having a gate terminal connected to the gate bus line passing through the corresponding intersection and a source terminal connected to the source bus line passing through this intersection, a pixel capacitance for holding a pixel voltage value, and the like. Moreover, the active matrix-type liquid crystal display device includes such a gate driver as described above, and a source driver (a video signal line drive circuit) for driving the source bus line.

A video signal indicating the pixel voltage value is transmitted by the source bus line. However, the respective source bus lines are incapable of concurrently (simultaneously) transmitting the video signals indicating the pixel voltage values on the plural rows. Therefore, the writing of the video signals into (electrical charging to) the pixel capacitances of the pixel formation portions arranged in the matrix is sequentially performed on a row-by-row basis. Hence, the gate driver is configured with a shift register including a plurality of stages in order that the plurality of gate bus lines are sequentially selected every predetermined period. Then, active scanning signals are sequentially output from the respective stages of the shift register (hereinafter, a circuit that constitutes each stage of the shift register will also be referred to as a "stage constituent circuit"), so that the video signals are sequentially written into the pixel capacitances on the row-by-row basis, as described above.

In a conventional display device, each stage (each stage constituent circuit) of a shift register is configured as shown in FIG. 36 (FIG. 2 in Japanese Patent Application Laid-Open No. 2006-127630), for example. As shown in FIG. 36, the stage constituent circuit includes an output control transistor having a source terminal connected to an output terminal for a scanning signal, and a drain terminal to which a clock signal is fed. Then, an ON/OFF state of the output control transistor is controlled in such a manner that a potential of a node connected to a gate terminal of the output control transistor is controlled, and a potential of the clock signal at the time when the output control transistor is in the ON state appears as a scanning signal. Herein, according to the configuration shown in FIG. 36, a gate voltage of the output control transistor (a voltage of the node A) is raised step by step using the scanning signal to be output from the stage prior to the two stages and the scanning signal to be output from the preceding stage. Thus, the gate voltage of the output control transistor is remarkably raised, and the rising and falling of the scanning signal is rapidly performed. Note that, in the following, a period in which the scanning signal fully rises and the inherent writing (of video signal) into the pixel capacitance is performed is referred to as a "full charge period". Moreover, a period from a point in time at which the scanning signal starts to rise to a point in time at which the scanning signal starts to fall (a period in which an operation for the writing into the pixel capacitance is performed) is referred to as a "writing operation period".

In addition to Japanese Patent Application Laid-Open No. 2006-127630 described above, Published Japanese Translation of PCT Application No. 2008-508654, Published Japanese Translation of PCT Application No. 2008-537275, Japanese Patent Application Laid-Open No. 2003-202840 and Japanese Patent Application Laid-Open No. 2008-61323 each disclose a configuration of a shift register provided in a display device or the like.

PRIOR ART DOCUMENTS

Patent Documents

[Patent Document 1] Japanese Patent Application Laid-Open No. 2006-127630
[Patent Document 2] Published Japanese Translation of PCT Application No. 2008-508654
[Patent Document 3] Published Japanese Translation of PCT Application No. 2008-537275
[Patent Document 4] Japanese Patent Application Laid-Open No. 2003-202840
[Patent Document 5] Japanese Patent Application Laid-Open No. 2008-61323

SUMMARY OF THE INVENTION

Problems to be Solved by the Invention

As described above, in the conventional configuration, the clock signal is fed to the drain terminal of the output control transistor. Then, an amplitude of the clock signal appears as almost an amplitude of the scanning signal. Typically, an amplitude of a scanning signal is set to be larger than a voltage amplitude, which is required for a switching operation of a transistor, such that desired electrical charging is performed on a pixel capacitance irrespective of the magnitude of a video signal voltage. Therefore, the amplitude of the clock signal is set to be larger than the voltage amplitude which is required for the switching operation of the transistor. Moreover, typically, since a large-size transistor is adopted as the output control transistor, a parasitic capacitance of a clock wire (a signal wire for transmitting a clock signal) becomes large. Since a power consumption becomes large as the amplitude of the clock signal or the parasitic capacitance of the clock wire is large, heretofore, there is a challenge of reducing a power consumption in a gate driver. With regard to this point, if the amplitude of the clock signal is set to be small in order to reduce the power consumption in the conventional configuration, the amplitude of the scanning signal also becomes small. Accordingly, in a case where the amplitude of the clock signal is set to be small to such a degree that an effect of reduction in power consumption is satisfactorily attained, it is impossible to obtain such a scanning signal that electrical charging to a pixel capacitance is satisfactorily performed.

Hence, an object of the present invention is to reduce a power consumption as compared with a conventional one, without lowering a voltage of a scanning signal to be applied to a gate bus line as compared with a conventional one, in a monolithic gate driver.

Means for Solving the Problems

A first aspect of the present invention is directed to a scanning signal line drive circuit of a display device, for driving a plurality of scanning signal lines disposed in a display part, the scanning signal line drive circuit comprising:
a shift register including a plurality of stages and sequentially outputting ON-level scanning signals in order to sequentially drive the plurality of scanning signal lines, on the basis of a plurality of externally input clock signals, wherein
a stage constituent circuit that constitutes each stage of the shift register has
  a first-output-node for outputting the scanning signal that drives the scanning signal line, the first-output-node being connected to the scanning signal line,
  a second-output-node for outputting a different stage control signal that controls an operation of the stage constituent circuit in the different stage,
  a first output control switching element having a second electrode to which an ON-level DC power supply potential is fed, and a third electrode connected to the first-output-node,
  a second output control switching element having a second electrode to which the clock signal is fed, and a third electrode connected to the second-output-node,
  a first-node connected to a first electrode of the first output control switching element,
  a node region formed by one or more nodes including a second-node connected to a first electrode of the second output control switching element,
  a third-node configured to change from an OFF level to an ON level in a period from a point in time at which the second-node is brought into the ON level to a point in time of termination of a full charge period that is a period in which the scanning signal to be output from the first-output-node should be brought into the ON level,
  a first potential difference holding part for holding a difference in potential between the first-node and the second-node, and
  a second potential difference holding part for holding a difference in potential between the second-node and the third-node;
  to each of the stage constituent circuits,
  the different stage control signal to be output from the stage constituent circuit in the stage prior to the two or more stages with respect to the relevant stage constituent circuit is fed as a first-node set signal, and
  one or more signals among the different stage control signals, which are output from the stage constituent circuits in the prior stages with respect to the relevant stage constituent circuit and are output from the stage constituent circuits in the subsequent stages with respect to the stage constituent circuit that outputs the different stage control signal as the first-node set signal, are fed as a node region set signal including a second-node set signal;
  in each of the stage constituent circuits,
  the first-node changes from the OFF level to the ON level on the basis of the first-node set signal,
  the second-node changes from the OFF level to the ON level on the basis of the second-node set signal,
  the third-node changes from the OFF level to the ON level after the second-node changes from the OFF level to the ON level,
  the first-node is brought into a floating state in a period in which the node that forms the node region changes from the OFF level to the ON level and a period in which the third-node changes from the OFF level to the ON level, and
  the node that forms the node region is brought into the floating state in the period in which the third-node changes from the OFF level to the ON level; and
  an amplitude of the clock signal is set to be smaller than an amplitude of the scanning signal.

According to a second aspect of the present invention, in the first aspect of the present invention,
the node region is formed by only the second-node;
to each of the stage constituent circuits, only the second-node set signal is fed as the node region set signal; and
the first potential difference holding part includes a capacitor having one end connected to the first-node, and the other end connected to the second-node.

According to a third aspect of the present invention, in the second aspect of the present invention,
to each of the stage constituent circuits, the different stage control signal to be output from the stage constituent circuit in the next stage with respect to the relevant stage constituent circuit is fed as a reset signal; and
each of the stage constituent circuits further has
  a first-node turn-off switching element for changing the level of the first-node toward the OFF level on the basis of the reset signal, and
  a second-node turn-off switching element for changing the level of the second-node toward the OFF level on the basis of the reset signal.

According to a fourth aspect of the present invention, in the third aspect of the present invention,
the first-node turn-off switching element has a first electrode to which the reset signal is fed, a second electrode connected to the first-node, and a third electrode connected to the second-node.

According to a fifth aspect of the present invention, in the third aspect of the present invention,
the second-node turn-off switching element has a first electrode to which the reset signal is fed, a second electrode connected to the second-node, and a third electrode connected to the first-output-node or the second-output-node.

According to a sixth aspect of the present invention, in the fifth aspect of the present invention,
each of the stage constituent circuits further has a output-node turn-off switching element for changing the level of the node connected to the third electrode of the second-node turn-off switching element toward the OFF level, on the basis of the reset signal.

According to a seventh aspect of the present invention, in the third aspect of the present invention, the second-node turn-off switching element has a first electrode to which the reset signal is fed, a second electrode connected to the second-node, and a third electrode connected to the first-node.

According to an eighth aspect of the present invention, in the second aspect of the present invention, clock signals, which are set at substantially ½ with regard to an on-duty and are shifted in phase by 180 degrees with each other, are fed to the second electrodes of the two second output control switching elements included in the stage constituent circuits in the adjacent two stages; and each of the stage constituent circuits further has a first third-node turn-on switching element for changing the third-node from the OFF level to the ON level at a point in time of a start of the full charge period, on the basis of the different stage control signal to be output from the relevant stage constituent circuit or the clock signal to be fed to the second electrode of the second output control switching element included in the relevant stage constituent circuit, and a third-node turn-off switching element for maintaining the third-node at the OFF level before the start of the full charge period, on the basis of the different stage control signal to be output from the stage constituent circuit in the preceding stage with respect to the relevant stage constituent circuit or the clock signal to be fed to the second electrode of the second output control switching element included in the stage constituent circuit in the preceding stage with respect to the relevant stage constituent circuit.

According to a ninth aspect of the present invention, in the eighth aspect of the present invention, in each of the stage constituent circuits, the third-node changes from the OFF level to the ON level on the basis of the different stage control signal to be output from the relevant stage constituent circuit.

According to a tenth aspect of the present invention, in the eighth aspect of the present invention, in each of the stage constituent circuits, the third-node changes from the OFF level to the ON level on the basis of the clock signal to be fed to the second electrode of the second output control switching element included in the relevant stage constituent circuit.

According to an eleventh aspect of the present invention, in the eighth aspect of the present invention, each of the stage constituent circuits has, as the first third-node turn-on switching element, a switching element for changing the third-node from the OFF level to the ON level on the basis of the different stage control signal to be output from the relevant stage constituent circuit, and a switching element for changing the third-node from the OFF level to the ON level on the basis of the clock signal to be fed to the second electrode of the second output control switching element included in the relevant stage constituent circuit.

According to a twelfth aspect of the present invention, in the eighth aspect of the present invention, each of the stage constituent circuits further has a second first-output-node turn-off switching element for changing the level of the first-output-node toward the OFF level, the second first-output-node turn-off switching having a second electrode connected to the first-output-node and having a third electrode to which an OFF-level DC power supply potential is fed, a fourth-node connected to a first electrode of the second first-output-node turn-off switching element, a fourth-node control switching element having a first electrode to which the clock signal to be fed to the second electrode of the second output control switching element included in the stage constituent circuit in the preceding stage with respect to the relevant stage constituent circuit is fed, a second electrode connected to the third-node, and a third electrode connected to the fourth-node, and a fourth-node turn-off switching element for changing the level of the fourth-node toward the OFF level on the basis of the first-node set signal or a potential of the first-node.

According to a thirteenth aspect of the present invention, in the eighth aspect of the present invention, in each of the stage constituent circuits, the different stage control signal to be output from the relevant stage constituent circuit or the clock signal to be fed to the second electrode of the second output control switching element included in the relevant stage constituent circuit is fed to the first electrode and the second electrode of the first third-node turn-on switching element, and the third electrode of the first third-node turn-on switching element is connected to the third-node.

According to a fourteenth aspect of the present invention, in the eighth aspect of the present invention, each of the stage constituent circuits further has a third-node control switching element for maintaining the third-node at the OFF level before the start of the full charge period, and changing the third-node from the OFF level to the ON level at the point in time of the start of the full charge period, on the basis of a potential of the first-node or a potential of the second-node.

According to a fifteenth aspect of the present invention, in the first aspect of the present invention, each of the stage constituent circuits further has a first first-output-node turn-off switching element for changing the level of the first-output-node toward the OFF level on the basis of the reset signal.

According to a sixteenth aspect of the present invention, in the first aspect of the present invention, each of the stage constituent circuits further has a third-node control switching element for maintaining the third-node at the OFF level before a start of the full charge period, and changing the third-node from the OFF level to the ON level in a period from the point in time at which the second-node is brought into the ON level to the point in time of the termination of the full charge period, on the basis of a potential of the first-node or a potential of the second-node.

According to a seventeenth aspect of the present invention, in the first aspect of the present invention, the third-node and the second-output-node are identical with each other.

According to an eighteenth aspect of the present invention, in the first aspect of the present invention, each of the stage constituent circuits further has a second-node set signal turn-off switching element for changing the level of the second-node set signal toward the OFF level on the basis of a potential of the third-node.

According to a nineteenth aspect of the present invention, in the eighteenth aspect of the present invention, the third-node is maintained at the ON level in a period before the point in time at which the first-node changes from the OFF level to the ON level and a period after the point in time of termination of the full charge period.

According to a twentieth aspect of the present invention, in the nineteenth aspect of the present invention, to each of the stage constituent circuits, the different stage control signal to be output from the stage constituent circuit in the subsequent stage with respect to the relevant stage constituent circuit is fed as a reset signal; and each of the stage constituent circuits further has a second third-node turn-on switching element for changing the level of the third-node toward the ON level on the basis of the reset signal.

According to a twenty-first aspect of the present invention, in the twentieth aspect of the present invention, the second third-node turn-on switching element has a first electrode and a second electrode to which the reset signal is fed, and a third electrode connected to the third-node.

According to a twenty-second aspect of the present invention, in the first aspect of the present invention, the node region is formed by m (where m is an integer of 2 or more) nodes including the second-node;

the first potential difference holding part includes m capacitors connected in series between the first-node and the second-node through the node other than second-node among the nodes that form the node region;

to each of the stage constituent circuits, m signals are fed as the node region set signal;

the m nodes that form the node region sequentially change from the OFF level to the ON level on the basis of the node region set signal; and each of the nodes that form the node region changes from the OFF level to the ON level, and then is brought into a floating state in a period until a point in time of a start of the full charge period.

According to a twenty-third aspect of the present invention, in the twenty-second aspect of the present invention, in each of the stage constituent circuits, the kth (where k is an integer from 1 or more to m or less) electrically closest node to the first-node among the m nodes that form the node region changes from the OFF level to the ON level on the basis of a signal to be output from the stage constituent circuit in the kth stage among the m stage constituent circuits outputting m signals to be fed as the node region set signal to the relevant stage constituent circuit.

According to a twenty-fourth aspect of the present invention, in the twenty-second aspect of the present invention, to each of the stage constituent circuits, the different stage control signal to be output from the stage constituent circuit in the subsequent stage with respect to the relevant stage constituent circuit is fed as a reset signal; and each of the stage constituent circuits further has m second-node turn-off switching elements for changing the levels of the m nodes that form the node region toward the OFF level on the basis of the reset signal.

According to a twenty-fifth aspect of the present invention, in the twenty-fourth aspect of the present invention, as for the switching element among the m second-node turn-off switching elements, which is provided in correspondence with the node other than the second-node among the m nodes that form the node region and is disposed at the zth (where z is an integer from 1 or more to m−1 or less) electrically closest position to the first-node, the reset signal is fed to a first electrode, a second electrode is connected to the node at the zth electrically closest position to the first-node among the m nodes that form the node region, and a third electrode is connected to one of the node at the xth (where x is an integer from z+1 or more to m or less) electrically closest position to the first-node among the m nodes that form the node region, the first-node, the first-output-node and the second-output-node.

According to a twenty-sixth aspect of the present invention, in the first aspect of the present invention, the scanning signal line drive circuit further comprises an operation start signal generation circuit for generating signals to be set as the first-node set signal and the node region set signal on the basis of externally input one start pulse signal.

According to a twenty-seventh aspect of the present invention, in the first aspect of the present invention, to the shift register, two clock signals, which are set at substantially ½ with regard to an on-duty and are shifted in phase by 180 degrees with each other, are input as the plurality of clock signals.

According to a twenty-eighth aspect of the present invention, in the first aspect of the present invention, all the switching elements included in each of the stage constituent circuits are thin-film transistors which are identical in channel with one another.

A twenty-ninth aspect of the present invention is directed to a display device comprising:

the display part, and the scanning signal line drive circuit according to any one of the first to twenty-eighth aspect of the present invention.

A thirtieth aspect of the present invention is directed to a method for driving a plurality of scanning signal lines disposed in a display part, by a scanning signal line drive circuit including a shift register that includes a plurality of stages and operates on the basis of a plurality of externally input clock signals, the method comprising, as for a stage constituent circuit that constitutes each stage of the shift register:

a first-node turn-on step of changing a first-node included in the stage constituent circuit from an OFF level to an ON level, a second-node turn-on step of changing a second-node included in the stage constituent circuit from the OFF level to the ON level, and a third-node turn-on step of changing a third-node included in the stage constituent circuit from the OFF level to the ON level, wherein the stage constituent circuit has a first-output-node for outputting a scanning signal that drives the scanning signal line, the first-output-node being connected to the scanning signal line, a second-output-node for outputting a different stage control signal that controls an operation of the stage constituent circuit in the different stage, a first output control switching element having a second electrode to which an ON-level DC power supply potential is fed, and a third electrode connected to the first-output-node, a second output control switching element having a second electrode to which the clock signal is fed, and a third electrode connected to the second-output-node, the first-node connected to a first electrode of the first output control switching element, the second-node connected to a first electrode of the second output control switching element, the third-node, a first potential difference holding part for holding a difference in potential between the first-node and the second-node, and a second potential difference holding part for holding a difference in potential between the second-node and the third-node;

in each of the stage constituent circuits, the respective steps are executed in order of the first-node turn-on step, the second-node turn-on step and the third-node turn-on step, in the first-node turn-on step, the first-node changes from the OFF level to the ON level, on the basis of the different stage control signal to be output from the stage constituent circuit in the stage prior to the two or more stages with respect to the relevant stage constituent circuit, in the second-node turn-on step, the second-node changes from the OFF level to the ON level, on the basis of the different stage control signal which is output from the stage constituent circuit in the prior stage with respect to the relevant stage constituent circuit and is output from the stage constituent circuit in the subsequent stage with respect to the stage constituent circuit that outputs the different stage control signal used in the first-node turn-on step, upon execution of the second-node turn-on step, the first-node is brought into a floating state, and upon execution of the third-node turn-on step, the first-node and the second-node are brought into the floating state; and an amplitude of the clock signal is set to be smaller than an amplitude of the scanning signal.

Effects of the Invention

According to the first aspect of the present invention, each of the stage constituent circuits of the shift register outputs a scanning signal that drives the scanning signal line connected to the relevant stage constituent circuit, and a different stage control signal that controls the stage constituent circuit which is different in stage from the relevant stage constituent circuit. Herein, a DC power supply potential is fed to the second electrode of the first output control switching element for controlling a potential of the scanning signal. On the other hand, a clock signal is fed to the second electrode of the second output control switching element for controlling a potential of the different stage control signal. In the configuration described above, the first-node connected to the first electrode of the first output control switching element changes from the OFF level to the ON level on the basis of a first-node set signal (a different stage control signal to be output from the stage constituent circuit in the stage prior to the two or more stages with respect to the relevant stage constituent circuit), and then further changes toward the ON level by bootstrapping to be performed multiple times. Therefore, even when the shift register is operated using a clock signal with a relatively small amplitude, the level of the scanning signal in the full charge period is allowed to reach to such a degree that writing into a pixel capacitance is satisfactorily performed. From the above, a power consumption in the shift register can be reduced as compared with a conventional one, without lowering a voltage to be applied to the scanning signal line in the full charge period as compared with a conventional one.

Moreover, a parasitic capacitance of a clock wire becomes small, and the power consumption is reduced, as compared with conventional ones. Further, since an influence to be exerted on the clock signal by a load of the clock wire becomes small, a waveform of the clock signal is restrained from being deformed, and the stability in circuit operation is enhanced. As the result, display quality is improved. Furthermore, the potential of the scanning signal changes step by step toward the ON level from before the start of the full charge period. Therefore, in the full charge period, the scanning signal rapidly reaches a satisfactory level, and electrical charging to the pixel capacitance is satisfactorily performed. Thus, the display quality is improved.

According to the second aspect of the present invention, similar effects to those in the first aspect of the present invention are attained with a relatively simple configuration.

According to the third aspect of the present invention, the first-node and the second-node are brought into the OFF level with reliability after the termination of the writing operation period. Therefore, noise is restrained from being generated from the scanning signal and the different stage control signal in the normal operation period.

According to the fourth aspect of the present invention, a voltage corresponding to the difference between the potential of the first-node and the potential of the second-node is applied between the second electrode and the third electrode of the first-node turn-off switching element. Since the potential of the second-node changes toward the ON level in the writing operation period, the voltage between the second electrode and the third electrode of the first-node turn-off switching element in this period becomes relatively low. Thus, in the writing operation period, electrical charges are restrained from being flown out from the first-node through the first-node turn-off switching element. As the result, the potential of the first-node is restrained from changing toward the OFF level in the writing operation period, and the stability in circuit operation is enhanced.

According to the fifth aspect of the present invention, a voltage corresponding to the difference between the potential of the second-node and the potential of the first-output-node or the second-output-node is applied between the second electrode and the third electrode of the second-node turn-off switching element. Since the potential of the first-output-node (the potential of the scanning signal) and the potential of the second-output-node (the potential of the different stage control signal) change toward the ON level in the writing operation period, the voltage between the second electrode and the third electrode of the second-node turn-off switching element in this period becomes relatively low. Thus, in the writing operation period, electrical charges are restrained from being flown out from the second-node through the second-node turn-off switching element. As the result, the potential of the second-node is restrained from changing toward the OFF level in the writing operation period, and the stability in circuit operation is enhanced.

According to the sixth aspect of the present invention, the potential of the first-output-node or the second-output-node is brought into the OFF level with reliability after the termination of the writing operation period. Therefore, noise is restrained from being generated from the scanning signal or the different stage control signal in the normal operation period.

According to the seventh aspect of the present invention, since the third electrode of the second-node turn-off switching element is connected to the first-node, the potential of the second-node changes in accordance with the change in the potential of the first-node. Therefore, the time elapsed until the second-node is brought into the OFF level after the termination of the writing operation period becomes relatively long. Thus, the different stage control signal is rapidly brought into the OFF level through the second output control switching element after the termination of the writing operation period.

According to the eighth aspect of the present invention, on the basis of the different stage control signal or the clock signal, the third-node is maintained at the OFF level before the start of the full charge period, and the third-node is brought into the ON level at the point in time of the start of the full charge period. As described above, the potential of the third-node can be controlled without depending on the potential of the first-node or the second-node.

According to the ninth aspect of the present invention, the first third-node turn-on switching element for bringing the third-node into the ON level is brought into the ON state on the basis of the different stage control signal. Herein, the different stage control signal is brought into the ON level only in one horizontal scanning period in one vertical scanning period. Accordingly, a period in which a high voltage is applied between the second electrode and the third electrode of the first third-node turn-on switching element becomes short even in the case where the third-node is brought into the OFF level in the normal operation period, and the first third-node turn-on switching element is restrained from being degraded. Therefore, a waveform at the time when the third-node changes from the OFF level to the ON level is restrained from being degraded, and the shift register can be operated in a stable manner for a long period.

According to the tenth aspect of the present invention, electrical charges are supplied to the third-node at a relatively short cycle. Thus, during the normal operation period, even when an electric current is leaked from the switching element connected to the third-node, the third-node is maintained at the ON level with reliability. Thus, the stability in circuit operation is enhanced.

According to the eleventh aspect of the present invention, as in the ninth aspect of the present invention, a waveform at the time when the third-node changes from the OFF level to the ON level is restrained from being degraded, and the shift register can be operated in a stable manner for a long period. Moreover, as in the tenth aspect of the present invention, the third-node is maintained at the ON level with reliability in the normal operation period, and the stability in circuit operation is enhanced.

According to the twelfth aspect of the present invention, when the fourth-node is in the ON level, the second first-output-node turn-off switching element is brought into the ON state, and the potential of the scanning signal is drawn into the OFF level. In the writing operation period, the fourth-node should be maintained at the OFF level such that the second first-output-node turn-off switching element is brought into the OFF state. Since the writing operation period is longer than a clock cycle, a complicated configuration is required for bringing the fourth-node into the ON level using the clock signal. Moreover, with regard to the configuration for bringing the fourth-node into the ON level at the point in time of the termination of the full charge period, the different stage control signal to be output from the stage constituent circuit in the subsequent stage can be used. However, when the leakage of an electric current occurs, the potential of the fourth-node changes toward the OFF level in the normal operation period, and the circuit operation becomes unstable. With regard to this point, according to the twelfth aspect of the present invention, each time the clock signal to be fed to the first electrode of the fourth-node control switching element is brought into the ON level, electrical charges are supplied from the third-node to the fourth-node. From the above, with a simple configuration, the fourth-node can be maintained at the ON level in the normal operation period while the fourth-node is maintained at the OFF level in the writing operation period, and noise is restrained from being generated from the scanning signal in the normal operation period.

According to the thirteenth aspect of the present invention, a voltage between the first electrode and the second electrode of the first third-node turn-on switching element becomes zero. Therefore, in the case where the third-node is maintained at the ON level in the normal operation period, even when the potential of the first electrode of the first third-node turn-on switching element is brought into the OFF level, the voltage to be applied between the first electrode and the third electrode of the first third-node turn-on switching element also becomes zero, and the first third-node turn-on switching element is restrained from being degraded.

According to the fourteenth aspect of the present invention, the level of the third-node can be rapidly changed.

According to the fifteenth aspect of the present invention, the scanning signal can be brought into the OFF level with reliability after the termination of the full charge period.

According to the sixteenth aspect of the present invention, the potential of the third-node can be controlled with a relatively simple configuration.

According to the seventeenth aspect of the present invention, the number of the switching elements to be required for the stage constituent circuit that forms the shift register can be set to be relatively small. Therefore, a mount area is reduced, and the display device can be reduced in size or the display region can be enlarged.

According to the eighteenth aspect of the present invention, when the third-node is in the ON level, the potential of the second-node set signal is drawn into the OFF level, and the second-node can be brought into the floating state with reliability. Therefore, the second-node is brought into the ON level with reliability in the full charge period, and the stability in circuit operation is improved.

According to the nineteenth aspect of the present invention, the potential of the second-node set signal is drawn into the OFF level during the normal operation period. Therefore, in each of the stage constituent circuits, an influence of noise from the different stage control signal to be fed from the prior stage is restrained, and the stability in circuit operation is improved.

According to the twentieth aspect of the present invention, the third-node changes toward the ON level on the basis of the reset signal, after the termination of the full charge period. Therefore, after the termination of the full charge period, even when the first-node and the second-node change from the ON level toward the OFF level, the third-node is not brought into the OFF level. Accordingly, during the normal operation period, the third-node is maintained at the ON level with reliability. Thus, in each of the stage constituent circuits, an influence of noise from the different stage control signal to be fed from the prior stage is restrained with reliability, and the stability in circuit operation is improved.

According to the twenty-first aspect of the present invention, as in the thirteenth aspect of the present invention, the second third-node turn-on switching element is restrained from being degraded.

According to the twenty-second aspect of the present invention, the first-node changes from the OFF level to the ON level on the basis of the first-node set signal, and then further changes toward the ON level by the bootstrapping performed three or more times. Therefore, even when the shift register is operated using a clock signal with a smaller amplitude, the level of the scanning signal in the full charge period is allowed to reach to such a degree that the writing into the pixel capacitance is satisfactorily performed. Thus, a power consumption in the shift register can be remarkably reduced as compared with a conventional one, without lowering a voltage to be applied to the scanning signal line in the full charge period as compared with a conventional one.

According to the twenty-third aspect of the present invention, as in the twenty-second aspect of the present invention, a power consumption in the shift register can be remarkably reduced as compared with a conventional one, without lowering a voltage to be applied to the scanning signal line in the full charge period as compared with a conventional one.

According to the twenty-fourth aspect of the present invention, the node that forms the node region is brought into the OFF level with reliability after the termination of the writing operation period. Therefore, the stability in circuit operation is enhanced in the normal operation period.

According to the twenty-fifth aspect of the present invention, a voltage between the second electrode and the third electrode of the second-node turn-off switching element is lowered. Thus, in the writing operation period, electrical charges are restrained from being flown out through the second-node turn-off switching element. As the result, the potential of the node that forms the node region is restrained from changing toward the OFF level in the writing operation period, and the stability in circuit operation is enhanced.

According to the twenty-sixth aspect of the present invention, the number of signals to be required for starting the operations of the shift register is reduced.

According to the twenty-seventh aspect of the present invention, since the number of clock signals for use in the operations of the shift register is relatively small and the frequency of the clock signal becomes relatively low, a power consumption is reduced more effectively.

According to the twenty-eighth aspect of the present invention, the manufacturing cost of the scanning signal line drive circuit can be reduced.

According to the twenty-ninth aspect of the present invention, the display device including the scanning signal line drive circuit that achieves similar effects to those in any one of the first to twenty-eighth aspects of the present invention is realized.

MODES FOR CARRYING OUT THE INVENTION

With reference to the attached drawings, hereinafter, description will be given of embodiments of the present invention. Note that, in the following description, as for a thin-film transistor, a gate terminal (a gate electrode) corresponds to a first electrode, a drain terminal (a drain electrode) corresponds to a second electrode, and a source terminal (a source electrode) corresponds to a third electrode. Moreover, the description is given on the assumption that all thin-film transistors provided in a shift register are of an n channel type.

1. First Embodiment 1.1 General Configuration and Operations

Figure 2:
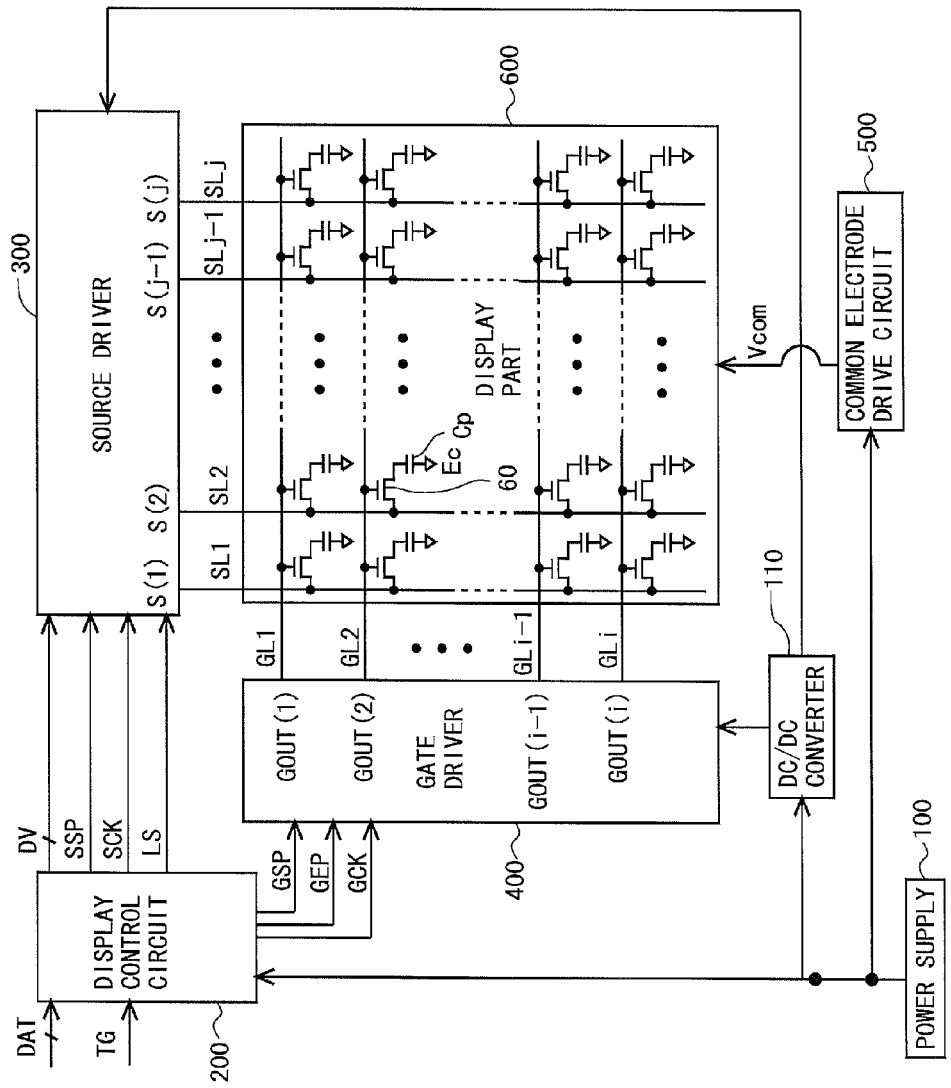
FIG. 2 is a block diagram showing a general configuration of the liquid crystal display device, in the first embodiment.

FIG. 2 is a block diagram showing a general configuration of an active matrix-type liquid crystal display device according to a first embodiment of the present invention. As shown in FIG. 2, this liquid crystal display device includes a power supply 100, a DC/DC converter 110, a display control circuit 200, a source driver (a video signal line drive circuit) 300, a gate driver (a scanning signal line drive circuit) 400, a common electrode drive circuit 500 and a display part 600. The gate driver 400 is formed on a display panel including the display part 600, using amorphous silicon, polycrystalline silicon, microcrystalline silicon, an oxide semiconductor (e.g., IGZO) or the like. That is, in the present embodiment, the gate driver 400 and the display part 600 are formed on the same substrate (an array substrate which is one of two substrates that form a liquid crystal panel).

The display part 600 has a pixel circuit including a plurality (j) of source bus lines (video signal lines) SL1 to SLj, a plurality (i) of gate bus lines (scanning signal lines) GL1 to GLi, and a plurality (i×j) of pixel formation portions provided in correspondence with intersections between the source bus lines SL1 to SLj and the gate bus lines GL1 to GLi respectively. The plurality of pixel formation portions are arranged in a matrix to form a pixel array. Each of the pixel formation portions includes a thin-film transistor (TFT) 60 which is a switching element having a gate terminal connected to the gate bus line passing through the corresponding intersection and a source terminal connected to the source bus line passing through this intersection, a pixel electrode connected to a drain terminal of the thin-film transistor 60, a common electrode Ec which is a counter electrode provided in common for the plurality of pixel formation portions, and a liquid crystal layer provided in common for the plurality of pixel formation portions and held between the pixel electrode and the common electrode Ec. Then, a pixel capacitance Cp is configured with a liquid crystal capacitance which is formed by the pixel electrode and the common electrode Ec. Typically, an auxiliary capacitance is provided in parallel to the liquid crystal capacitance such that the pixel capacitance Cp holds electrical charges with reliability. However, since the auxiliary capacitance does not directly concern the present invention, the description and the illustration thereof will not be given here.

The power supply 100 supplies a predetermined power supply voltage to the DC/DC converter 110, the display control circuit 200 and the common electrode drive circuit 500. The DC/DC converter 110 generates, from the power supply voltage, a predetermined DC voltage for operating the source driver 300 and the gate driver 400, and supplies the DC voltage to the source driver 300 and the gate driver 400. The common electrode drive circuit 500 feeds a predetermined potential Vcom to the common electrode Ec.

The display control circuit 200 receives an image signal DAT and a timing signal group TG including a horizontal synchronizing signal, a vertical synchronizing signal and the like, each of which is sent from the outside, and outputs a digital video signal DV as well as a source start pulse signal SSP, a source clock signal SCK, a latch strobe signal LS, a gate start pulse signal GSP, a gate end pulse signal GEP and a gate clock signal GCK for control of image display in the display part 600. Note that, in the present embodiment, the gate start pulse signal GSP is configured with two signals GSP1 (hereinafter, referred to as a "first gate start pulse signal") and GSP2 (hereinafter, referred to as a "second gate start pulse signal"), and the gate clock signal GCK is configured with two-phase clock signals GCK1 (hereinafter, referred to as a "first gate clock signal") and GCK2 (hereinafter, referred to as a "second gate clock signal").

The source driver 300 receives the digital video signal DV, the source start pulse signal SSP, the source clock signal SCK and the latch strobe signal LS, each of which is output from the display control circuit 200, and applies driving video signals S(1) to S(j) to the source bus lines SL1 to SLj respectively.

On the basis of the gate start pulse signal GSP, the gate end pulse signal GEP and the gate clock signal GCK each of which is output from the display control circuit 200, the gate driver 400 applies the active scanning signals GOUT(1) to GOUT(i) to the gate bus lines GL1 to GLi, respectively, in a repeated manner with one vertical scanning period defined as a cycle. Note that the detailed description of the gate driver 400 will be given later.

As described above, the driving video signals S(1) to S(j) are applied to the source bus lines SL1 to SLj respectively and the scanning signals GOUT(1) to GOUT(i) are applied to the gate bus lines GL1 to GLi respectively, so that an image based on the image signal DAT sent from the outside is displayed on the display part 600.

1.2 Configuration and Operations of Gate Driver

Figure 3:
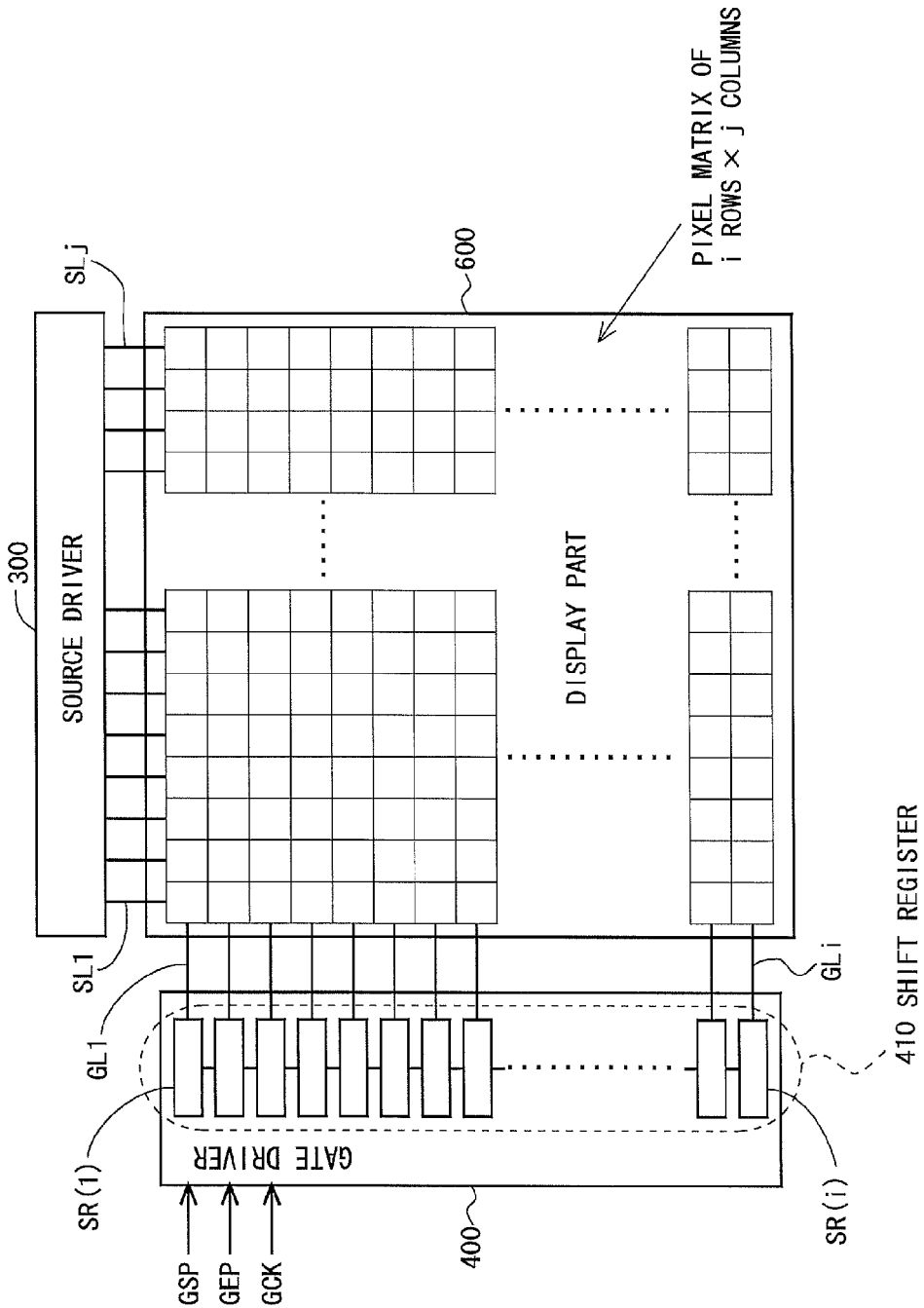
FIG. 3 is a block diagram for illustrating a configuration of the gate driver, in the first embodiment.

With reference to FIGS. 3 to 6, next, description will be given of summaries of a configuration and operations of the gate driver 400 in the present embodiment. As shown in FIG. 3, the gate driver 400 is configured with a shift register 410 including a plurality of stages. The display part 600 includes a pixel matrix having i rows×j columns, and the stages of the shift register 410 are provided in one-to-one correspondence with the rows in the pixel matrix respectively. The shift register 410 includes i stage constituent circuits SR(1) to SR(i). The i stage constituent circuits SR(1) to SR(i) are connected in series to one another.

Figure 4:
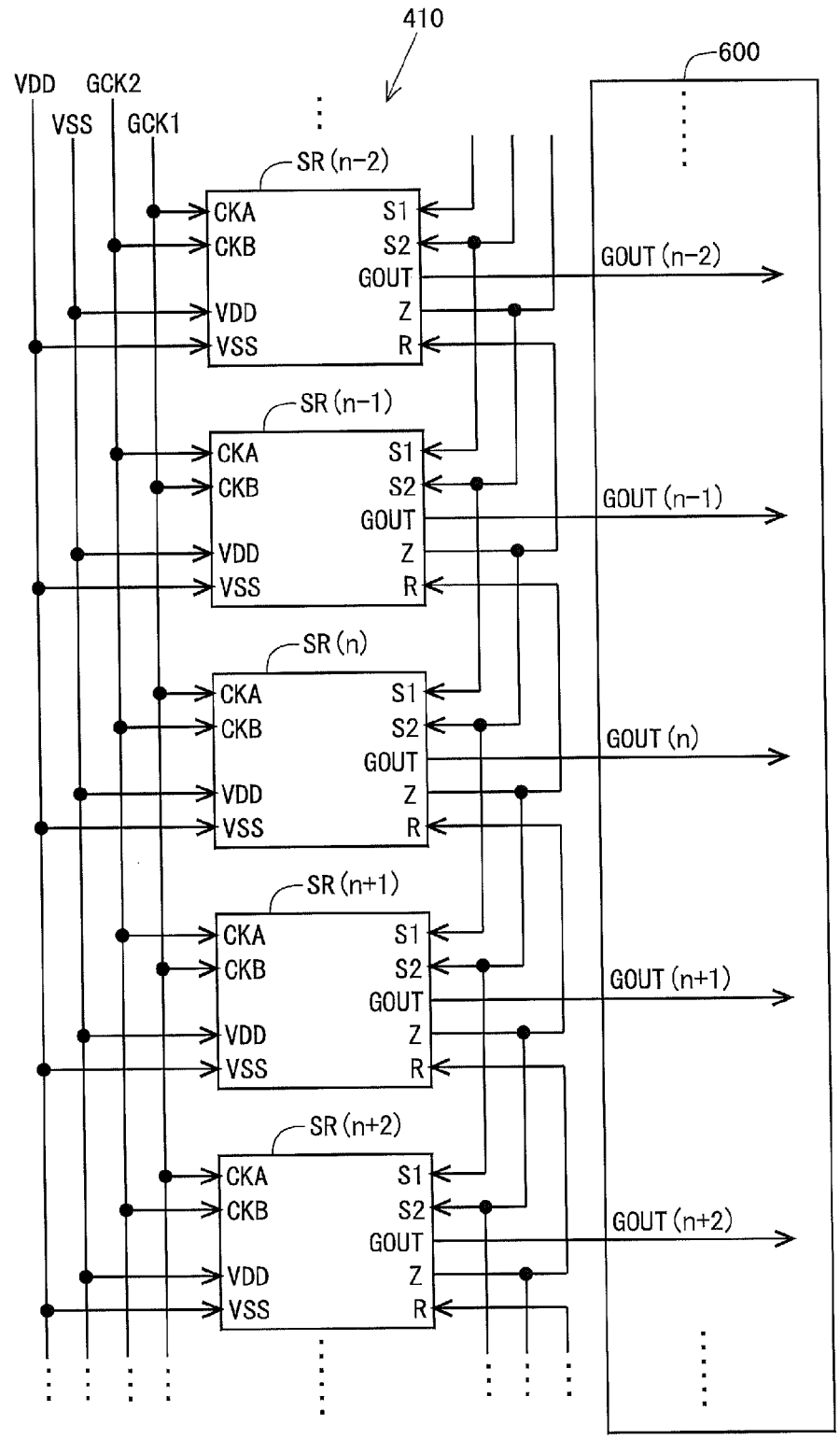
FIG. 4 is a block diagram showing a configuration of the shift register of the gate driver, in the first embodiment.

FIG. 4 is a block diagram showing a configuration of the shift register 410 of the gate driver 400. As described above, the shift register 410 is configured with the i stage constituent circuits SR(1) to SR(i). Note that FIG. 4 shows the stage constituent circuits in the (n−2)th to (n+2)th stages. Each of the stage constituent circuits has an input terminal for receiving a clock signal CKA (hereinafter, referred to as a "first clock"), an input terminal for receiving a clock signal CKB (hereinafter, referred to as a "second clock"), an input terminal for receiving a HIGH-level DC power supply potential VDD (the magnitude of this potential is also referred to as a "VDD potential"), an input terminal for receiving a LOW-level DC power supply potential VSS (the magnitude of this potential is also referred to as a "VSS potential"), an input terminal for receiving a first set signal S1, an input terminal for receiving a second set signal S2, an input terminal for receiving a reset signal R, an output terminal for outputting a scanning signal GOUT, and an output terminal for outputting a signal (hereinafter, referred to as a "different stage control signal") Z that controls the operation of the stage constituent circuit which is different in stage from the relevant stage constituent circuit. Note that the input terminal for receiving the second clock CKB is not necessarily provided.

The signals to be fed to the input terminals of the respective stages (the respective stage constituent circuits) of the shift register 410 are as follows (see FIG. 4). As for the (n−1)th stage, the second gate clock signal GCK2 is fed as the first clock CKA, and the first gate clock signal GCK1 is fed as the second clock CKB. As for the nth stage, the first gate clock signal GCK1 is fed as the first clock CKA, and the second gate clock signal GCK2 is fed as the second clock CKB. The configurations similar to those of the (n−1)th stage to the nth stage are repeated every two stages throughout all the stages of the shift register 410. Moreover, as for an any stage, a different stage control signal Z to be output from the stage prior to the two stages is fed as the first set signal S1, a different stage control signal Z to be output from the preceding stage is fed as the second set signal S2, and a different stage control signal Z to be output from the next stage is fed as the reset signal R. As for the first stage, however, the first gate start pulse signal GSP1 is fed as the first set signal S1, and the second gate start pulse signal GSP2 is fed as the second set signal S2. Moreover, as for the second stage, the second gate start pulse signal GSP2 is fed as the first set signal S1. As for the zth stage (the last stage), further, the gate end pulse signal GEP is fed as the reset signal R. Note that the HIGH-level DC power supply potential VDD and the LOW-level DC power supply potential VSS are fed in common for all the stage constituent circuits.

The scanning signal GOUT and the different stage control signal Z are output from each of the stages (each of the stage constituent circuits) of the shift register 410. The scanning signal GOUT to be output from each of the stages is fed to the corresponding gate bus line. The different stage control signal Z to be output from each of the stages is fed as the reset signal R to the preceding stage, is fed as the second set signal S2 to the next stage, and is fed as the first set signal S1 to the stage subsequent to the two stages.

Figure 5:
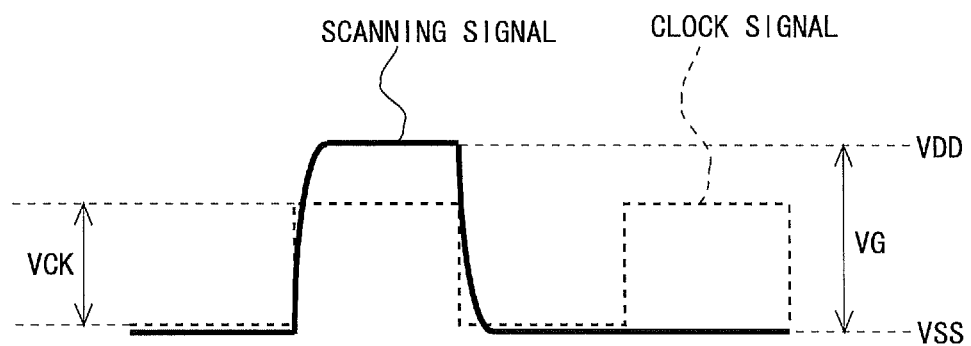
FIG. 5 is a signal waveform chart for illustrating a relation between an amplitude of a scanning signal and an amplitude of a clock signal, in the first embodiment.
Figure 6:
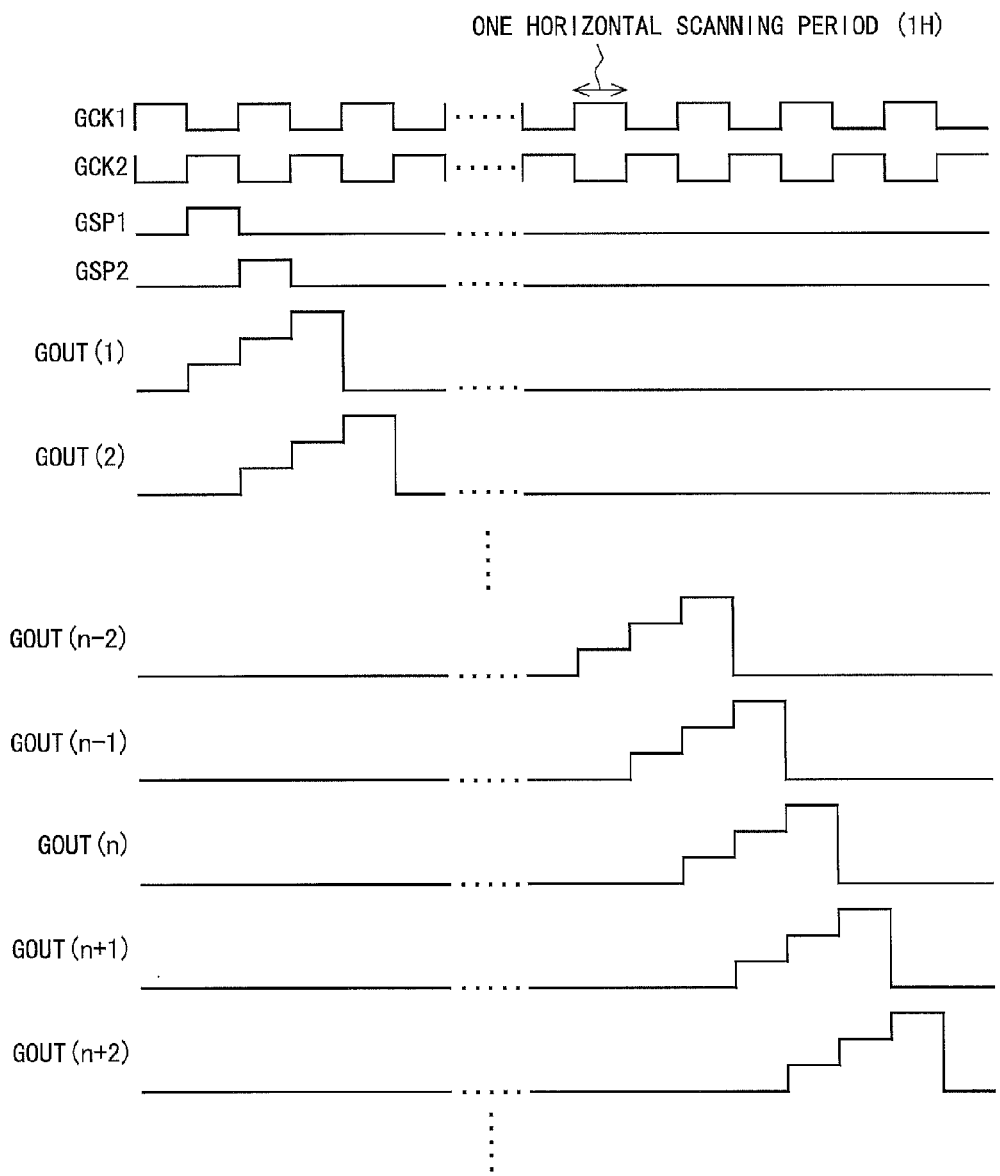
FIG. 6 is a signal waveform chart for illustrating operations of the gate driver, in the first embodiment.

By the way, in the present embodiment, the power supply which is a source to generate the scanning signal GOUT is different in system from the power supply which is a source to generate the clock signal. As shown in FIG. 5, an amplitude VCK of the clock signal is set to be smaller than an amplitude VG (corresponding to a difference between the VDD potential and the VSS potential) of the scanning signal GOUT. For example, the amplitude VCK of the clock signal is set to be 0.7 times as small as the amplitude VG of the scanning signal GOUT. Moreover, the first gate clock signal GCK1 and the second gate clock signal GCK2, which are the two-phase clock signals to be fed to the shift register 410, are shifted in phase by 180 degrees (a period corresponding to almost one horizontal scanning period) with each other, as shown in FIG. 6. Each of the first gate clock signal GCK1 and the second gate clock signal GCK2 is in a HIGH level (H level) state only in almost one horizontal scanning period in the two horizontal scanning periods.

In the configuration described above, when a pulse of the first gate start pulse signal GSP1 as the first set signal S1 and a pulse of the second gate start pulse signal GSP2 as the second set signal S2 are fed to the first stage SR(1) of the shift register 410 and a pulse of the second gate start pulse signal GSP2 as the first set signal S1 is fed to the second stage SR(2) of the shift register 410, a shift pulse included in the different stage control signal Z to be output from each of tages is transferred from the first stage SR(1) to the ith stage SR(i) sequentially, on the basis of the gate clock signals GCK (the first gate clock signal GCK1 and the second gate clock signal GCK2). In accordance with the transfer of the shift pulse, then, the scanning signals GOUT to be output from the respective stages SR(1) to SR(i) are sequentially brought into the HIGH level. At this time, as will be described later, the potential of the scanning signal GOUT rises step by step. Thus, the scanning signals whose waveforms are shown in FIG. 6 are fed to the gate bus lines in the display part 600.

1.3 Configuration of Stage Constituent Circuit

Figure 1:
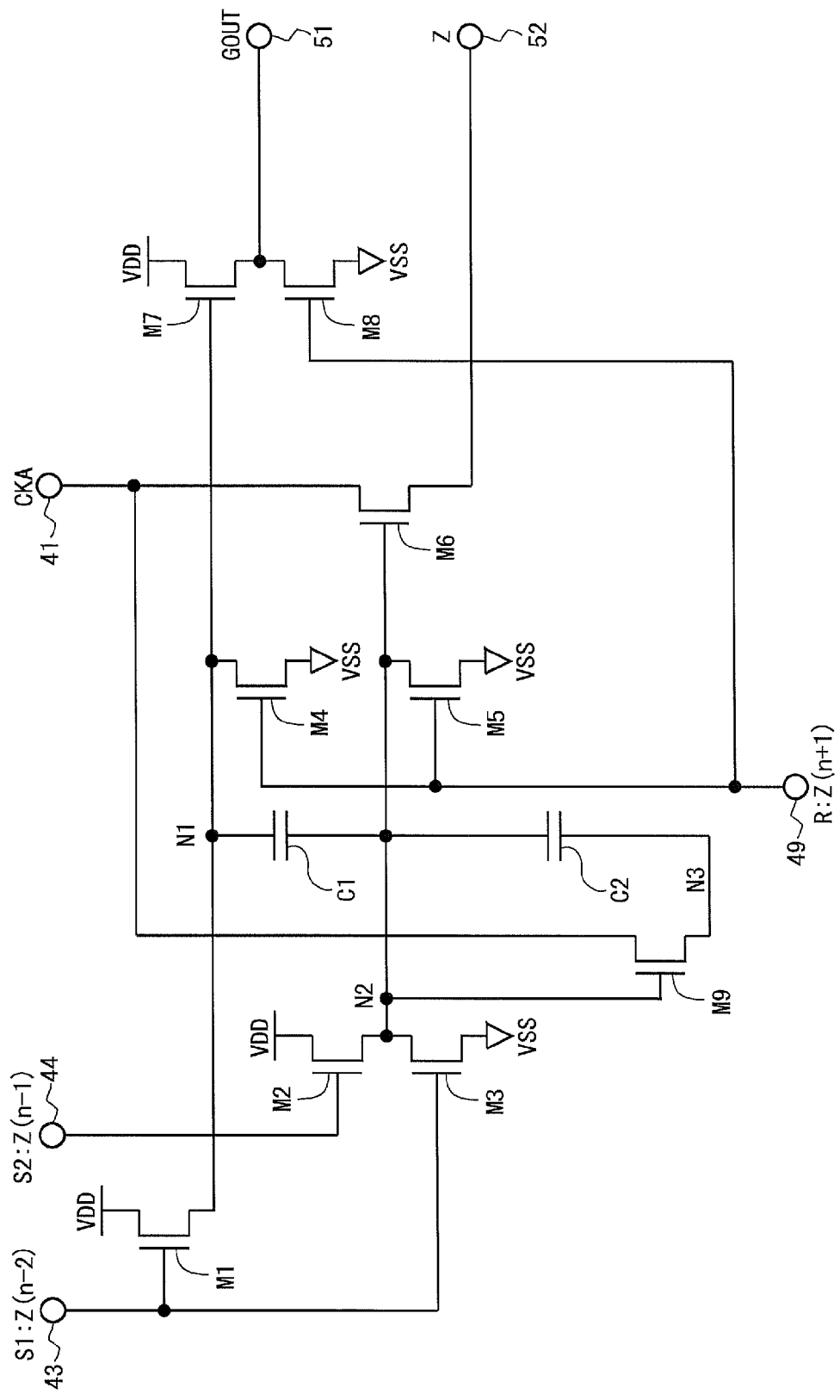
FIG. 1 is a circuit diagram showing a configuration of a stage constituent circuit included in a shift register of a gate driver in a liquid crystal display device according to a first embodiment of the present invention.

FIG. 1 is a circuit diagram showing a configuration of the stage constituent circuit (a configuration corresponding to one stage of the shift register 410) in the present embodiment. As shown in FIG. 1, the stage constituent circuit includes nine thin-film transistors M1 to M9, and two capacitors C1 and C2. Moreover, the stage constituent circuit has four input terminals 41, 43, 44 and 49, and two output terminals 51 and 52 in addition to an input terminal for the HIGH-level DC power supply potential VDD and an input terminal for the LOW-level DC power supply potential VSS. Herein, the input terminal that receives the first clock CKA is denoted with the reference character 41, the input terminal that receives the first set signal S1 is denoted with the reference character 43, the input terminal that receives the second set signal S2 is denoted with the reference character 44, and the input terminal that receives the reset signal R is denoted with the reference character 49. Moreover, the output terminal that outputs the scanning signal GOUT is denoted with the reference character 51, and the output terminal that outputs the different stage control signal Z is denoted with the reference character 52.

Next, description will be given of connection relations among the constituent elements in the stage constituent circuit. A source terminal of the thin-film transistor M1, a drain terminal of the thin-film transistor M4, a gate terminal of the thin-film transistor M7 and one end of the capacitor C1 are connected to one another. Herein, a region (a wire) in which these are connected to one another is referred to as a "first-node" for convenience of the description. A source terminal of the thin-film transistor M2, a drain terminal of the thin-film transistor M3, a drain terminal of the thin-film transistor M5, a gate terminal of the thin-film transistor M6, a gate terminal of the thin-film transistor M9, the other end of the capacitor C1 and one end of the capacitor C2 are connected to one another. Herein, a region (a wire) in which these are connected to one another is referred to as a "second-node" for convenience of the description. The thin-film transistor M9 and the other end of the capacitor C2 are connected to each other. Herein, a region (a wire) in which these are connected to each other is referred to as a "third-node" for convenience of the description. The first-node is denoted with a reference character N1, the second-node is denoted with a reference character N2, and the third-node is denoted with a reference character N3.

As for the thin-film transistor M1, a gate terminal is connected to the input terminal 43, a drain terminal is connected to the input terminal for the DC power supply potential VDD, and the source terminal is connected to the first-node N1. As for the thin-film transistor M2, a gate terminal is connected to the input terminal 44, a drain terminal is connected to the input terminal for the DC power supply potential VDD, and the source terminal is connected to the second-node N2. As for the thin-film transistor M3, a gate terminal is connected to the input terminal 43, the drain terminal is connected to the second-node N2, and a source terminal is connected to the input terminal for the DC power supply potential VSS. As for the thin-film transistor M4, a gate terminal is connected to the input terminal 49, the drain terminal is connected to the first-node N1, and a source terminal is connected to the input terminal for the DC power supply potential VSS. As for the thin-film transistor M5, a gate terminal is connected to the input terminal 49, the drain terminal is connected to the second-node N2, and a source terminal is connected to the input terminal for the DC power supply potential VSS. As for the thin-film transistor M6, the gate terminal is connected to the second-node N2, a drain terminal is connected to the input terminal 41, and a source terminal is connected to the output terminal 52. As for the thin-film transistor M7, the gate terminal is connected to the first-node N1, a drain terminal is connected to the input terminal for the DC power supply potential VDD, and a source terminal is connected to the output terminal 51. As for the thin-film transistor M8, a gate terminal is connected to the input terminal 49, a drain terminal is connected to the output terminal 51, and a source terminal is connected to the input terminal for the DC power supply potential VDD. As for the thin-film transistor M9, the gate terminal is connected to the second-node N2, a drain terminal is connected to the input terminal 41, and a source terminal is connected to the third-node N3. As for the capacitor C1, one end is connected to the first-node N1, and the other end is connected to the second-node N2. As for the capacitor C2, one end is connected to the second-node N2, and the other end is connected to the third-node N3.

Next, description will be given of functions of the respective constituent elements in the stage constituent circuit. The thin-film transistor M1 changes a potential of the first-node N1 toward the VDD potential when the first set signal S1 is in a HIGH level. The thin-film transistor M2 changes a potential of the second-node N2 toward the VDD potential when the second set signal S2 is in the HIGH level.

The thin-film transistor M3 changes the potential of the second-node N2 toward the VSS potential when the first set signal S1 is in the HIGH level. The thin-film transistor M4 changes the potential of the first-node N1 toward the VSS potential when the reset signal R is in the HIGH level. The thin-film transistor M5 changes the potential of the second-node N2 toward the VSS potential when the reset signal R is in the HIGH level. The thin-film transistor M6 feeds a potential of the first clock CKA to the output terminal 52 when the potential of the second-node N2 is in the HIGH level. The thin-film transistor M7 feeds the VDD potential to the output terminal 51 when the potential of the first-node N1 is in the HIGH level. The thin-film transistor M8 changes a potential of the output terminal 51 (the scanning signal GOUT) toward the VSS potential when the reset signal R is in the HIGH level. The thin-film transistor M9 feeds the potential of the first clock CKA to the third-node N3 when the potential of the second-node N2 is in the HIGH level. The capacitor C1 functions to raise the potential of the first-node N1 in accordance with a rise in the potential of the second-node N2. The capacitor C2 functions to raise the potential of the second-node N2 in accordance with a rise in the potential of the third-node N3. That is, the capacitors C1 and C2 function as a bootstrap capacitance.

Note that, in the present embodiment, a first-node turn-off switching element is realized by the thin-film transistor M4, a second-node turn-off switching element is realized by the thin-film transistor M5, a second output control switching element is realized by the thin-film transistor M6, a first output control switching element is realized by the thin-film transistor M7, a first first-output-node turn-off switching element is realized by the thin-film transistor M8, and a third-node control switching element is realized by the thin-film transistor M9. Moreover, a first-output-node is realized by the output terminal 51 that outputs the scanning signal GOUT, and a second-output-node is realized by the output terminal 52 that outputs the different stage control signal Z. Further, a first-node set signal is realized by the first set signal S1, and a second-node set signal is realized by the second set signal S2. Furthermore, a node region is realized by only the second-node N2, a first potential difference holding part is realized by the capacitor C1, and a second potential difference holding part is realized by the capacitor C2.

1.4 Operations of Stage Constituent Circuit

Figure 7:
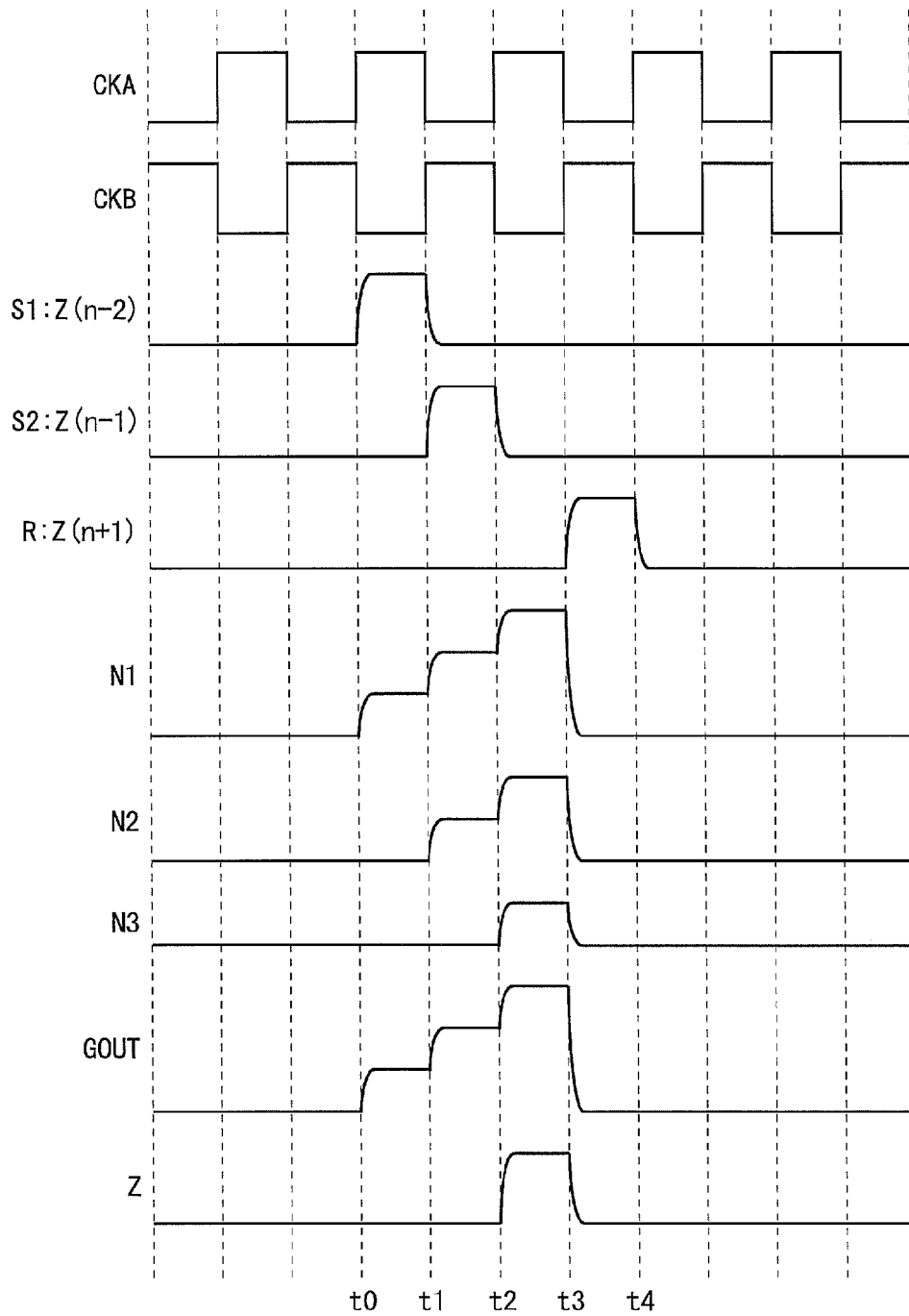
FIG. 7 is a signal waveform chart for illustrating operations of the stage constituent circuit, in the first embodiment.

With reference to FIGS. 1 and 7, next, description will be given of operations of the stage constituent circuit in the present embodiment. Herein, attention is given to the stage constituent circuit in the nth stage. Note that, as described above, a period in which inherent writing is performed on the pixel capacitance is referred to as a "full charge period", and a period from a point in time at which the scanning signal GOUT starts to rise to a point in time at which the scanning signal GOUT starts to fall is referred to as a "writing operation period". Moreover, a period in which an operation for lowering the scanning signal GOUT is performed is referred to as a "reset period", and a period other than the "writing operation period and reset period" is referred to as a "normal operation period". In FIG. 7, a period from a point in time t0 to a point in time t3 corresponds to the writing operation period, a period from a point in time t2 to the point in time t3 corresponds to the full charge period, a period from the point in time t3 to a point in time t4 corresponds to the reset period, and a period before the point in time t0 and a period after the point in time t4 each correspond to the normal operation period.

In the period before the point in time t0, the potential of the first-node N1, the potential of the second-node N2, the potential of the third-node N3, the potential of the scanning signal GOUT(the potential of the output terminal 51) and the potential of the different stage control signal Z (the potential of the output terminal 52) are maintained at a LOW level.

At the point in time t0, the first set signal S1 changes from the LOW level to the HIGH level. Thus, the thin-film transistors M1 and M3 are brought into an ON state. The thin-film transistor M1 is brought into the ON state, so that the potential of the first-node N1 rises, and the thin-film transistor M3 is brought into the ON state, so that the potential of the second-node N2 is drawn into the VSS potential. As the result, the capacitor C1 is electrically charged. Moreover, the potential of the first-node N1 rises, so that the thin-film transistor M7 is brought into the ON state, and the potential of the scanning signal GOUT rises.

At the point in time t1, the second set signal S2 changes from the LOW level to the HIGH level. Thus, the thin-film transistor M2 is brought into the ON state. At the point in time t1, moreover, the first set signal S1 changes from the HIGH level to the LOW level. Thus, the thin-film transistors M1 and M3 are brought into an OFF state. The thin-film transistor M2 is brought into the ON state and the thin-film transistor M3 is brought into the OFF state, so that the potential of the second-node N2 rises. At this time, since the thin-film transistor M1 is in the OFF state and the first-node N1 is in a floating state, the potential of the first-node N1 rises through the capacitor C1 in accordance with the rise in the potential of the second-node N2 (the first-node N1 is bootstrapped). As the result, the potential of the scanning signal GOUT further rises. In a period from the point in time t1 to the point in time t2, the potential of the second-node N2 is brought into the HIGH level and the thin-film transistors M6 and M9 are brought into the ON state. However, since the first clock CKA is in the LOW level, the potential of the third-node N3 and the potential of the different stage control signal Z are maintained at the LOW level.

At the point in time t2, the second set signal S2 changes from the HIGH level to the LOW level. Thus, the thin-film transistor M2 is brought into the OFF state, and the second-node N2 is brought into the floating state. At the point in time t2, moreover, the first clock CKA changes from the LOW level to the HIGH level. At this time, since the thin-film transistor M9 is in the ON state, the potential of the third-node N3 rises. Since the first-node N1 and the second-node N2 are in the floating state, the potential of the second-node N2 rises through the capacitor C2 in accordance with the rise in the potential of the third-node N3, and the potential of the first-node N1 rises through the capacitor C1 in accordance with the rise in the potential of the second-node N2 (the first-node N1 is bootstrapped). Thus, the potential of the first-node N1 becomes higher than the VDD potential, and the potential of the scanning signal GOUT is raised to the VDD potential. Moreover, since the thin-film transistor M6 is in the ON state and the first clock CKA is in the HIGH level, the potential of the first clock CKA is fed to the output terminal 52. Thus, the potential of the different stage control signal Z is brought into the HIGH level.

At the point in time t3, the first clock CKA changes from the HIGH level to the LOW level. Thus, the potential of the different stage control signal Z falls in accordance with the fall in the potential of the input terminal 41. At the point in time t3, moreover, the reset signal R changes from the LOW level to the HIGH level. Thus, the thin-film transistors M4, M5 and M8 are brought into the ON state. The thin-film transistor M4 is brought into the ON state, so that the potential of the first-node N1 is brought into the LOW level, the thin-film transistor M5 is brought into the ON state, so that the potential of the second-node N2 is brought into the LOW level, and the thin-film transistor M8 is brought into the ON state, so that the potential of the scanning signal GOUT is brought into the LOW level. At this time, the potential of the third-node N3 also falls through the capacitor C2.

In the period after the point in time t4, as in the period before the point in time t0, the potential of the first-node N1, the potential of the second-node N2, the potential of the third-node N3, the potential of the scanning signal GOUT and the potential of the different stage control signal Z are maintained at the LOW level.

1.5 Effects

According to the present embodiment, each of the stage constituent circuits in the shift register 410 outputs the scanning signal GOUT that drives the gate bus line connected to the relevant stage constituent circuit, and the different stage control signal Z that controls the stage constituent circuit which is different in stage from the relevant stage constituent circuit. Herein, the HIGH-level DC power supply potential VDD is fed to the drain terminal of the thin-film transistor M7 for controlling the potential of the scanning signal GOUT. On the other hand, the clock signal is fed to the drain terminal of the thin-film transistor M6 for controlling the potential of the different stage control signal Z. In this configuration, the potential of the first-node N1 connected to the gate terminal of the thin-film transistor M7 rises on the basis of the first set signal S1 (the different stage control signal to be output from the stage constituent circuit in the stage prior to the two stages), and then rises two times by the bootstrapping. Therefore, even in the case where the shift register 410 is operated using the clock signal with the relatively small amplitude, the potentials of the scanning signals GOUT(1) to GOUT(i) to be applied to the gate bus lines GL1 to GLi respectively can be satisfactorily raised. As described above, according to the present embodiment, the power consumption in the shift register 410 can be reduced as compared with a conventional one, without lowering the voltage to be applied to the gate bus line in the full charge period as compared with a conventional one.

Typically, a power consumption W in a monolithic gate driver is proportional to a product of a capacitance value C of a parasitic capacitance in a circuit, a square of a voltage (amplitude) V and a frequency f. Herein, since the frequency f of the clock signal is large and the power consumption W is proportional to the square of the voltage V, the power consumption W is largely reduced in such a manner that the amplitude of the clock signal is set to be small. Moreover, typically, the amplitude of the scanning signal GOUT is set to be larger than the voltage amplitude required for the switching operation of the thin-film transistor such that desired electrical charging is performed on the pixel capacitance irrespective of the magnitude of the video signal voltage. Therefore, in the conventional configuration, the amplitude of the clock signal is set to be larger than the voltage amplitude required for the switching operation of the thin-film transistor. With regard to this point, according to the present embodiment, since the amplitude of the clock signal can be set to be small, the power consumption is largely reduced as compared with a conventional one.

Figure 8:
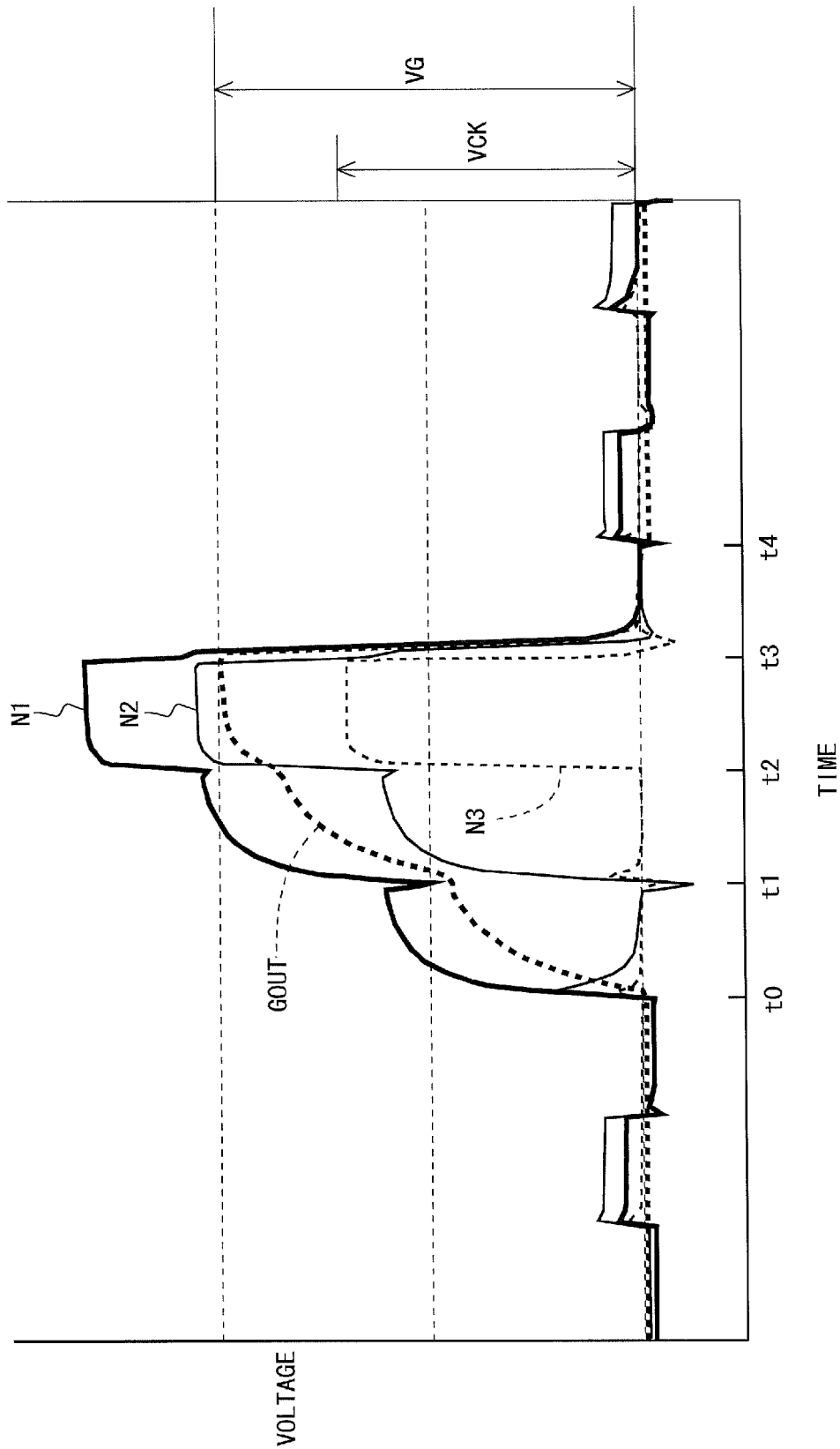
FIG. 8 is a diagram showing results of simulation in the first embodiment.

FIG. 8 is a diagram showing results of simulation in a case where the amplitude VCK of the clock signal is set to be 0.7 times as small as the amplitude VG of the scanning signal GOUT, in the present embodiment. As is apparent from FIG. 8, the potential of the first-node N1 is raised step by step and, in accordance with this raise, the potential of the scanning signal GOUT is also raised step by step. In the period from the point in time t2 to the point in time t3, the potential of the scanning signal GOUT satisfactorily rises. Herein, the amplitude VCK of the clock signal is set to be 0.7 times as small as the amplitude VG of the scanning signal GOUT, and the power consumption W is proportional to the square of the voltage V. Therefore, the power consumption is reduced to almost ½ of a conventional one.

Moreover, typically, a large-size thin-film transistor is adopted as the thin-film transistor for controlling the potential of the scanning signal GOUT. Therefore, in the conventional configuration, a clock wire has a large parasitic capacitance. With regard to this point, according to the present embodiment, the HIGH-level DC power supply potential VDD rather than the clock signal is fed to the drain terminal of the thin-film transistor M7 for controlling the potential of the scanning signal GOUT. Therefore, the parasitic capacitance of the clock wire becomes small and the power consumption is reduced as compared with conventional ones. Further, since an influence to be exerted on the clock signal by the load of the clock wire becomes small, the waveform of the clock signal is restrained from being deformed, and the stability in circuit operation is enhanced. As the result, display quality is improved.

Further, according to the present embodiment, the scanning signal GOUT is raised step by step, before the start of the full charge period (the period from the point in time t2 to the point in time t3 in FIG. 7) that is the period in which the inherent writing into the pixel capacitance is performed. Then, the scanning signal GOUT reaches a relatively high potential immediately before the point in time of the start of the full charge period. Therefore, in the full charge period, the scanning signal GOUT rapidly reaches a satisfactorily high potential, and electrical charging is satisfactorily performed on the pixel capacitance. Thus, the display quality is improved.

Furthermore, the potential of the scanning signal GOUT is raised step by step, so that the maximum value of a gate-source voltage of the thin-film transistor M7 for controlling the potential of the scanning signal GOUT becomes small, and the thin-film transistor M7 is restrained from being broken down.

1.6 Modification Examples

Next, description will be given of modification examples of the first embodiment. Note that, with regard to the respective modification examples, the general configuration and operations of the liquid crystal display device as well as the configuration and operations of the gate driver are similar to those in the first embodiment; therefore, the description thereof will not be given here.

1.6.1 First Modification Example

Figure 9:
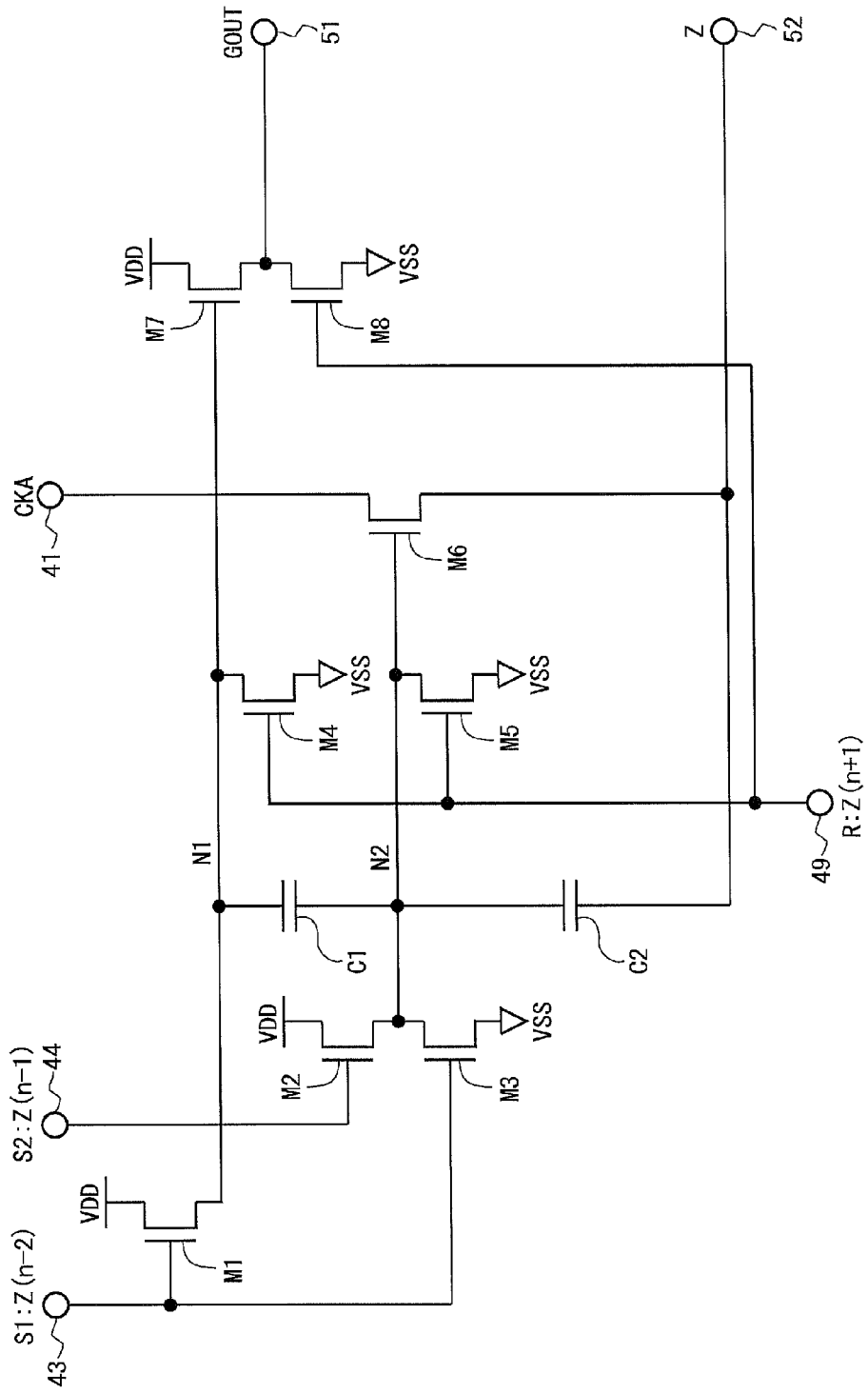
FIG. 9 is a circuit diagram showing a configuration of the stage constituent circuit in a first modification example of the first embodiment.

FIG. 9 is a circuit diagram showing a configuration of the stage constituent circuit in a first modification example of the first embodiment. In the present modification example, the stage constituent circuit does not include the thin-film transistor M9 which is one of the constituent elements in the first embodiment. Instead, the other end of the capacitor C2 and the source terminal of the thin-film transistor M6 are connected to each other. Thus, the output terminal 52 also functions as the third-node N3 in the first embodiment.

Figure 10:
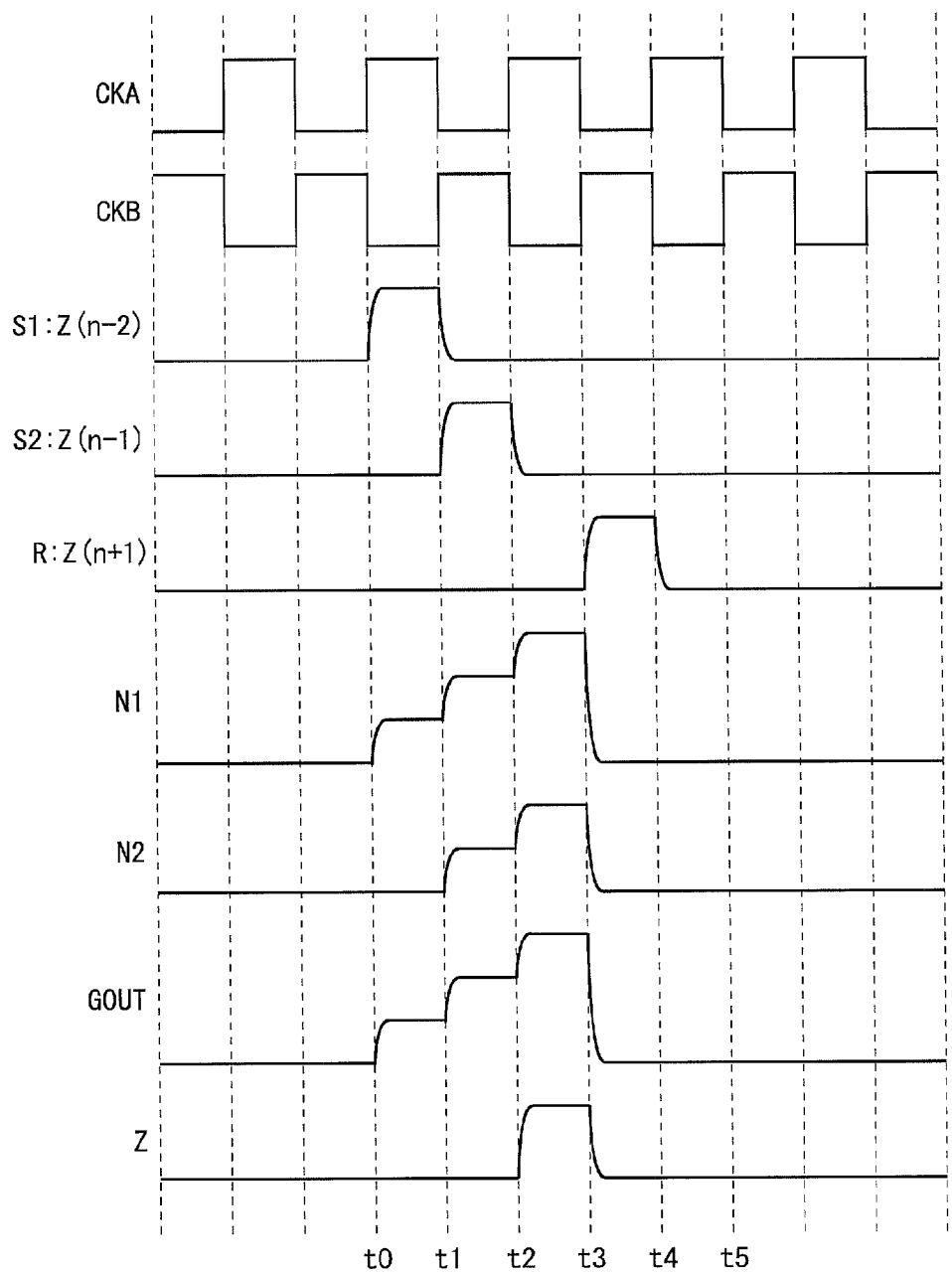
FIG. 10 is a signal waveform chart for illustrating operations of the stage constituent circuit, in the first modification example of the first embodiment.

With reference to FIGS. 9 and 10, next, description will be given of operations of the stage constituent circuit in the present modification example. The period before the point in time t2 and the period after the point in time t3 are similar to those in the first embodiment; therefore, the description thereof will not be given here. At the point in time t2, the second set signal S2 changes from the HIGH level to the LOW level. Thus, the thin-film transistor M2 is brought into the OFF state, and the second-node N2 is brought into the floating state. At the point in time t2, moreover, the first clock CKA changes from the LOW level to the HIGH level. At this time, since the thin-film transistor M6 is in the ON state, the potential of the output terminal 52 rises, and the potential of the different stage control signal Z is brought into the HIGH level. Since the first-node N1 and the second-node N2 are in the floating state, the potential of the second-node N2 rises through the capacitor C2 in accordance with the rise in the potential of the output terminal 52, and the potential of the first-node N1 rises through the capacitor C1 in accordance with the rise in the potential of the second-node N2 (the first-node N1 is bootstrapped). Thus, the potential of the first-node N1 becomes higher than the VDD potential, and the potential of the scanning signal GOUT is raised to the VDD potential.

According to the present modification example, the gate bus lines GL1 to GLi can be driven as in the first embodiment, without the thin-film transistor M9 (see FIG. 1) in the first embodiment. Thus, the number of transistors required for the shift register 410 that forms the gate driver 400 is reduced, so that a mount area is reduced. As the result, the display device can be reduced in size or the display region can be enlarged.

1.6.2 Second Modification Example

Figure 11:
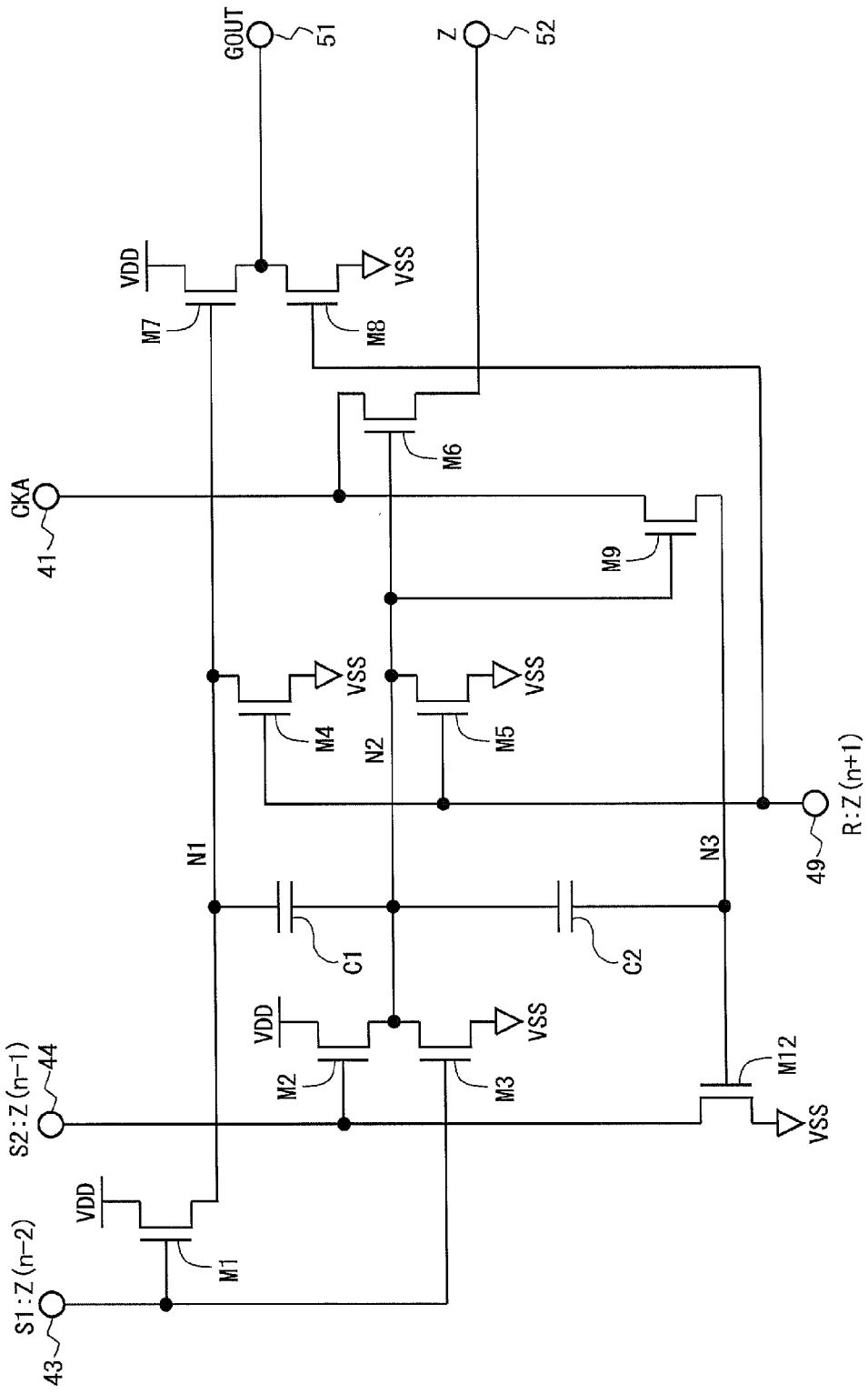
FIG. 11 is a circuit diagram showing a configuration of the stage constituent circuit in a second modification example of the first embodiment.
Figure 12:
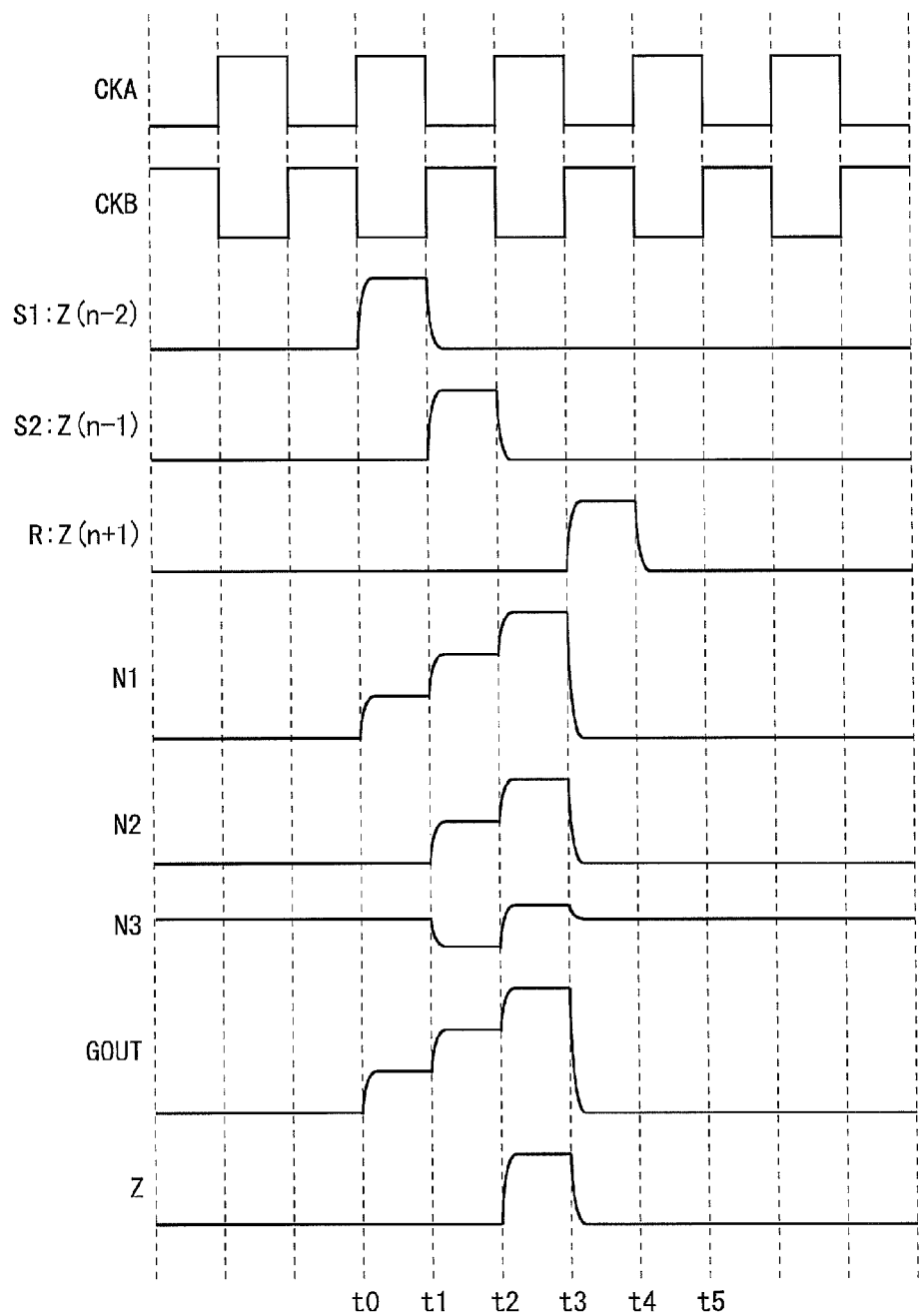
FIG. 12 is a signal waveform chart for illustrating operations of the stage constituent circuit, in the second modification example of the first embodiment.

FIG. 11 is a circuit diagram showing a configuration of the stage constituent circuit in a second modification example of the first embodiment. In the present modification example, a thin-film transistor M12 is provided in addition to the constituent elements in the first embodiment shown in FIG. 1. A second-node set signal turn-off switching element is realized by the thin-film transistor M12. As for the thin-film transistor M12, a gate terminal is connected to the third-node N3, a drain terminal is connected to the input terminal 44, and a source terminal is connected to the input terminal for the DC power supply potential VSS. The thin-film transistor M12 changes the potential of the input terminal 44 toward the VSS potential when the potential of the third-node N3 is in the HIGH level. Note that, in the present modification example, the potential of the third-node N3 needs to be maintained at the HIGH level during the normal operation period as shown in FIG. 12.

According to the present modification example, during the normal operation period, the thin-film transistor M12 is brought into the ON state and the potential of the input terminal 44 is drawn into the VSS potential. Therefore, in each of the stage constituent circuits, an influence of noise from the different stage control signal Z(n−1) to be fed from the preceding stage is restrained, and the stability in circuit operation is improved.

1.6.3 Third Modification Example

Figure 13:
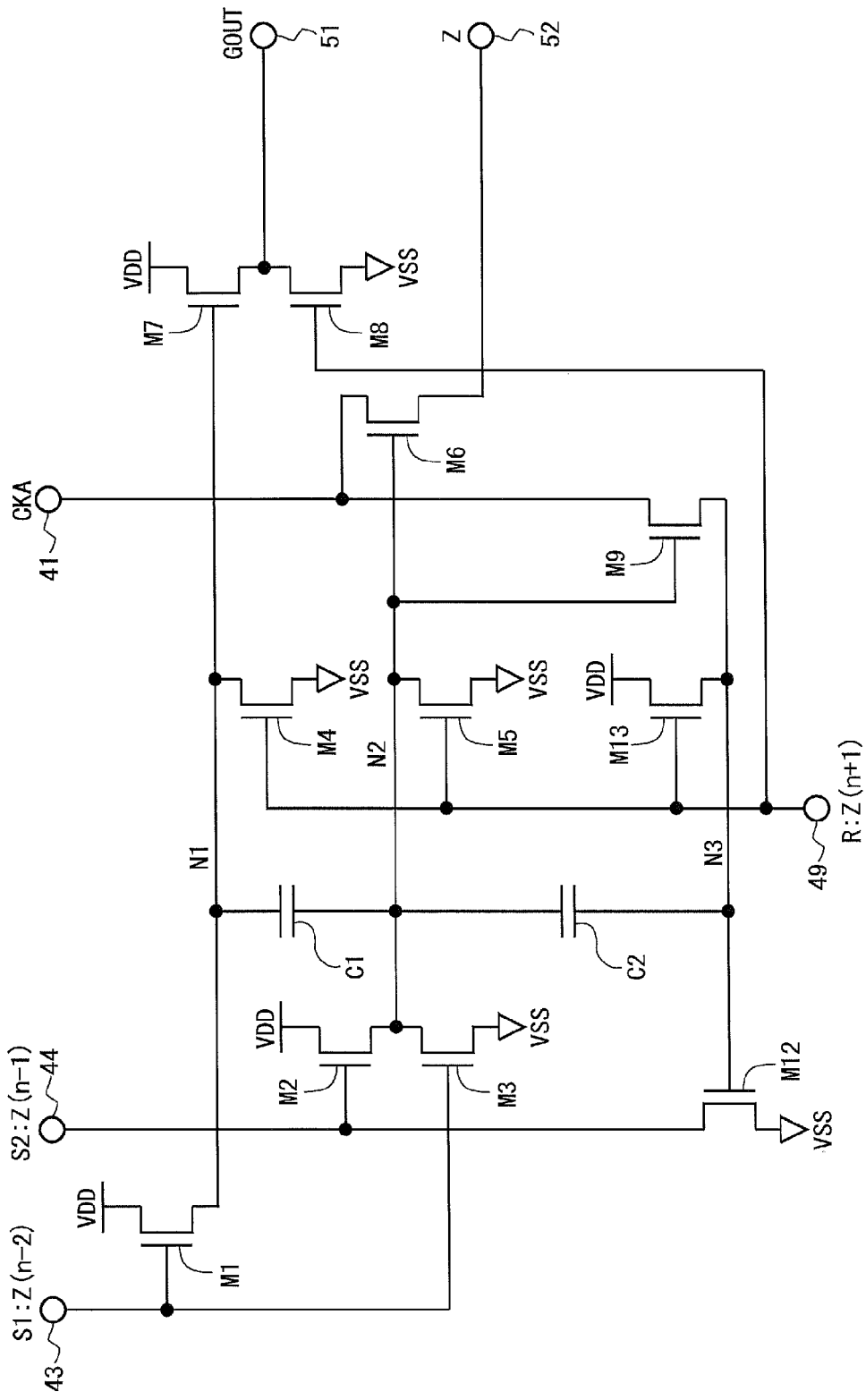
FIG. 13 is a circuit diagram showing a configuration of the stage constituent circuit in a third modification example of the first embodiment.

FIG. 13 is a circuit diagram showing a configuration of the stage constituent circuit in a third modification example of the first embodiment. In the present modification example, a thin-film transistor M13 is further provided in addition to the constituent elements in the second modification example shown in FIG. 11. A second third-node turn-on switching element is realized by the thin-film transistor M13. As for the thin-film transistor M13, a gate terminal is connected to the input terminal 49, a drain terminal is connected to the input terminal for the DC power supply potential VDD, and a source terminal is connected to the third-node N3. The thin-film transistor M13 changes the potential of the third-node N3 toward the VDD potential when the reset signal R is in the HIGH level.

In the second modification example, at the point in time t3, since the potential of the first-node N1 falls, the potential of the third-node N3 also falls through the capacitors C1 and C2 (see FIG. 12). Therefore, there is a possibility that the potential of the third-node N3 falls to the LOW level at the point in time t3. According to the present modification example, however, at the point in time t3, the reset signal R is brought into the HIGH level, so that the thin-film transistor M13 is brought into the ON state, and the potential of the third-node N3 changes toward the VDD potential. Therefore, there is no possibility that the potential of the third-node N3 falls to the LOW level at the point in time t3. Accordingly, the potential of the third-node N3 is maintained at the HIGH level with reliability during the normal operation period. Thus, in each of the stage constituent circuits, an influence of noise from the different stage control signal Z(n−1) to be fed from the preceding stage is restrained with reliability, and the stability in circuit operation is improved.

Figure 14:
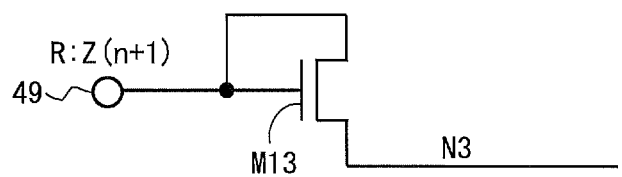
FIG. 14 is a diagram for illustrating the modification example of the first embodiment.

By the way, as shown in FIG. 14, alternatively, a connection may be established between the gate and the drain of the thin-film transistor M13. Since the potential of the third-node N3 is maintained at the HIGH level during the normal operation period as described above, a negative voltage is applied between the gate and the source of the thin-film transistor M13 when the potential of the gate terminal of the thin-film transistor M13 is in the LOW level. Therefore, there is a possibility that the thin-film transistor M13 is degraded. With regard to this point, according to the configuration that the connection is established between the gate and the drain of the thin-film transistor M13, when the potential of the gate terminal is in the LOW level, the potential of the drain terminal is also brought into the LOW level. Thus, a gate-drain voltage of the thin-film transistor M13 is maintained at zero. As the result, a gate-source voltage to be applied to the thin-film transistor M13 becomes zero, so that the thin-film transistor M13 is restrained from being degraded. Note that, as for the thin-film transistors M1 and M2, a connection may also be established between the gate and the drain although the effect of restraining the thin-film transistor from being degraded is not attained.

1.6.4 Fourth Modification Example

Figure 15:
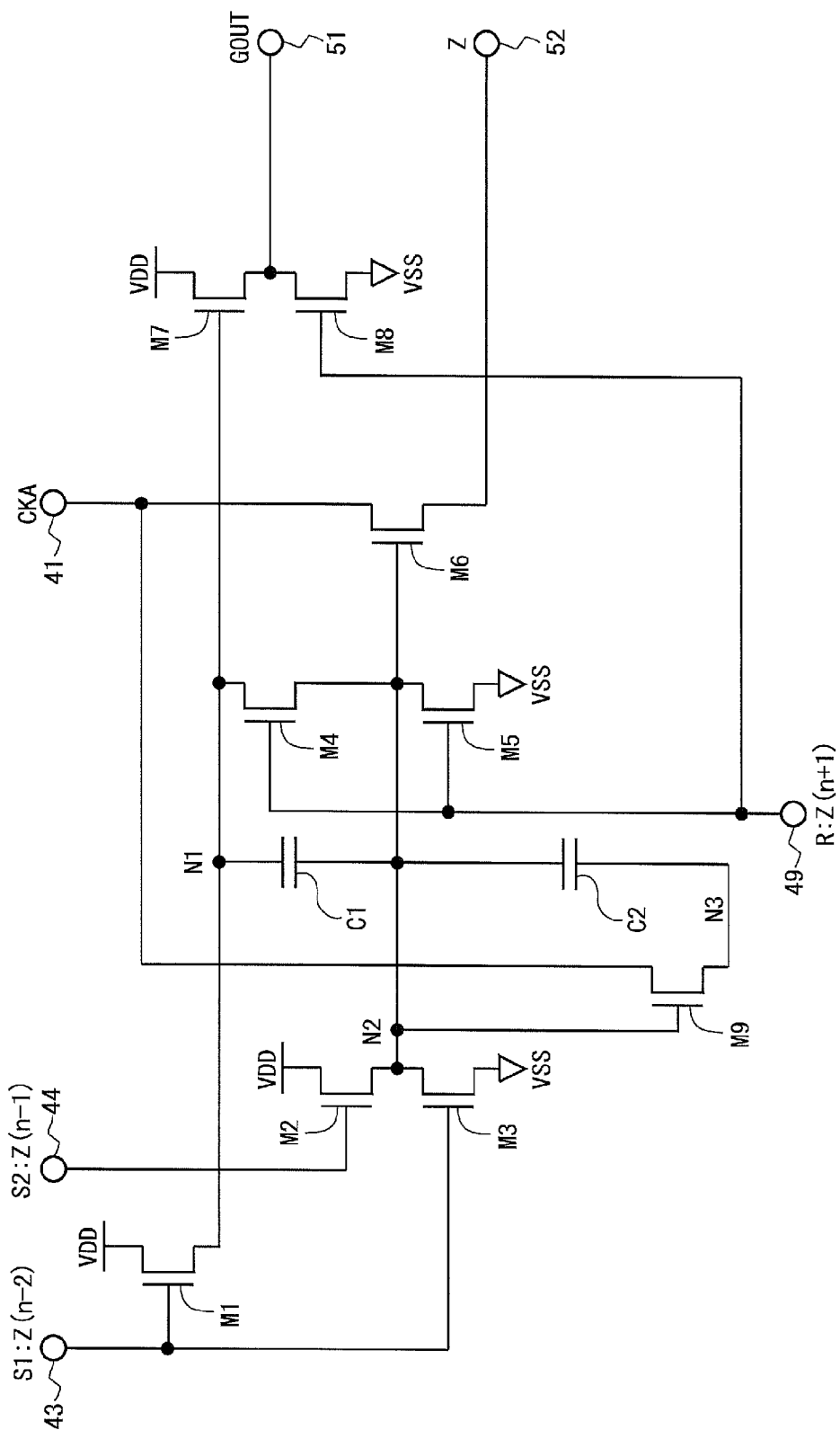
FIG. 15 is a circuit diagram showing a configuration of the stage constituent circuit in a fourth modification example of the first embodiment.

FIG. 15 is a circuit diagram showing a configuration of the stage constituent circuit in a fourth modification example of the first embodiment. In the present modification example, the source terminal of the thin-film transistor M4 is connected to the second-node N2.

According to the present modification example, a voltage corresponding to a difference between the potential of the first-node N1 and the potential of the second-node N2 is applied between the drain and the source of the thin-film transistor M4. Since the potential of the second-node N2 is higher than the VSS potential in the period from the point in time t1 to the point in time t3 as shown in FIG. 7, the drain-source voltage of the thin-film transistor M4 is reduced as compared with the first embodiment in which the DC power supply potential VSS is fed to the source terminal of the thin-film transistor M4. Thus, in the writing operation period, electrical charges are restrained from being flown out from the first-node N1 through the thin-film transistor M4. As the result, the potential of the first-node N1 is restrained from falling in the writing operation period, and the stability in circuit operation is enhanced.

1.6.5 Fifth Modification Example

Figure 16:
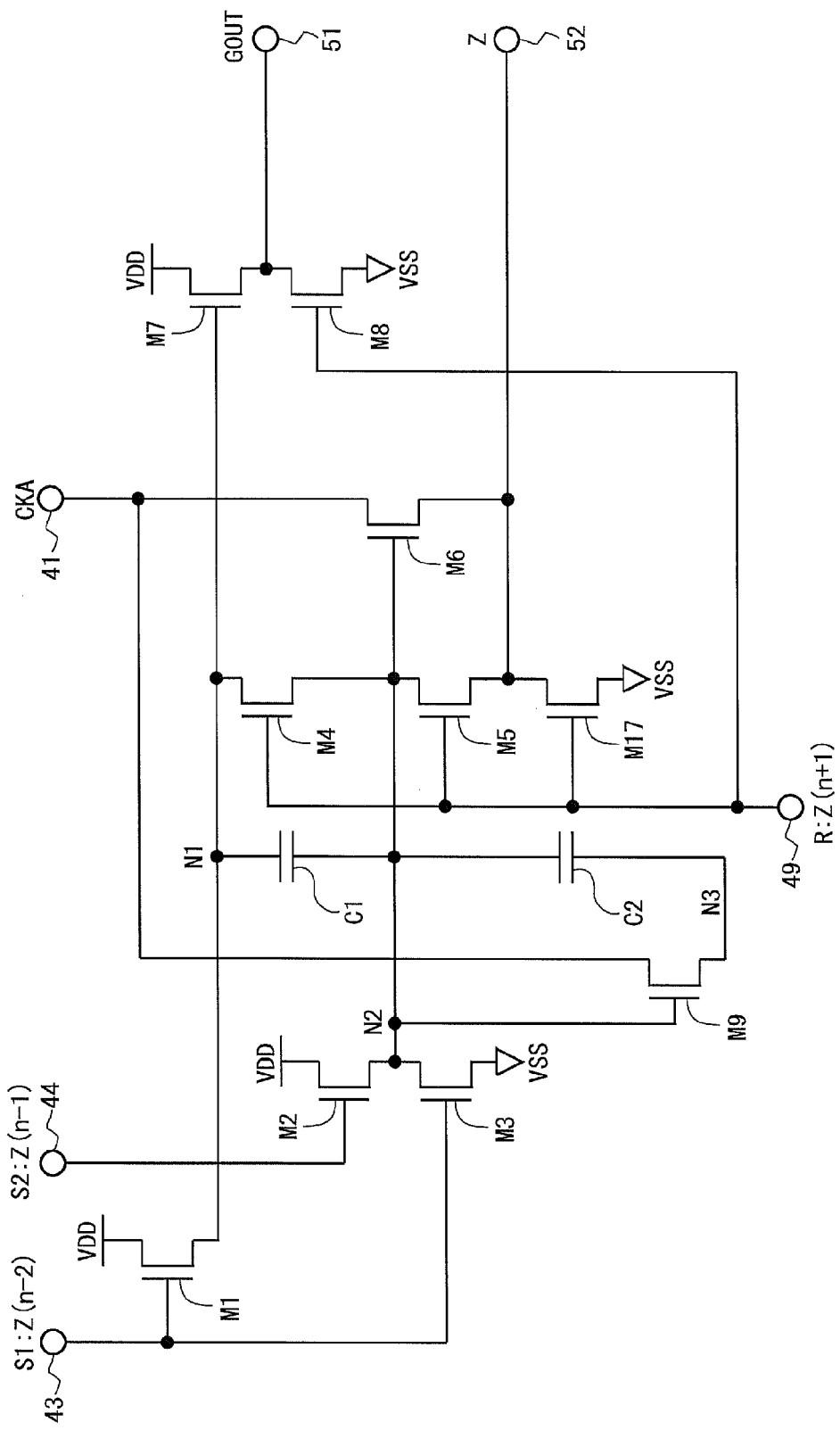
FIG. 16 is a circuit diagram showing a configuration of the stage constituent circuit in a fifth modification example of the first embodiment.

FIG. 16 is a circuit diagram showing a configuration of the stage constituent circuit in a fifth modification example of the first embodiment. In the present modification example, the source terminal of the thin-film transistor M5 is connected to the output terminal 52. Moreover, a thin-film transistor M17 is provided in addition to the constituent elements in the first embodiment shown in FIG. 1. An output-node turn-off switching element is realized by the thin-film transistor M17. As for the thin-film transistor M17, a gate terminal is connected to the input terminal 49, a drain terminal is connected to the output terminal 52, and a source terminal is connected to the input terminal for the DC power supply potential VSS. The thin-film transistor M17 changes the potential of the output terminal 52 (the potential of the different stage control signal Z) toward the VSS potential when the reset signal R is in the HIGH level. Note that the source terminal of the thin-film transistor M5 may be connected to the output terminal 51.

According to the present modification example, a voltage corresponding to a difference between the potential of the second-node N2 and the potential of the different stage control signal Z is applied between the drain and the source of the thin-film transistor M5. Since the potential of the different stage control signal Z is higher than the VSS potential in the period from the point in time t2 to the point in time t3 as shown in FIG. 7, the drain-source voltage of the thin-film transistor M5 becomes low as compared with the first embodiment in which the DC power supply potential VSS is fed to the source terminal of the thin-film transistor M5. Thus, in the writing operation period, electrical charges are restrained from being flown out from the second-node N2 through the thin-film transistor M5. As the result, the potential of the second-node N2 is restrained from falling in the writing operation period, and the stability in circuit operation is enhanced. The thin-film transistor M17 is not necessarily provided. However, when the thin-film transistor M17 is provided, an effect of bringing the different stage control signal Z into the LOW level with reliability after the termination of the writing operation period is attained.

1.6.6 Sixth Modification Example

Figure 17:
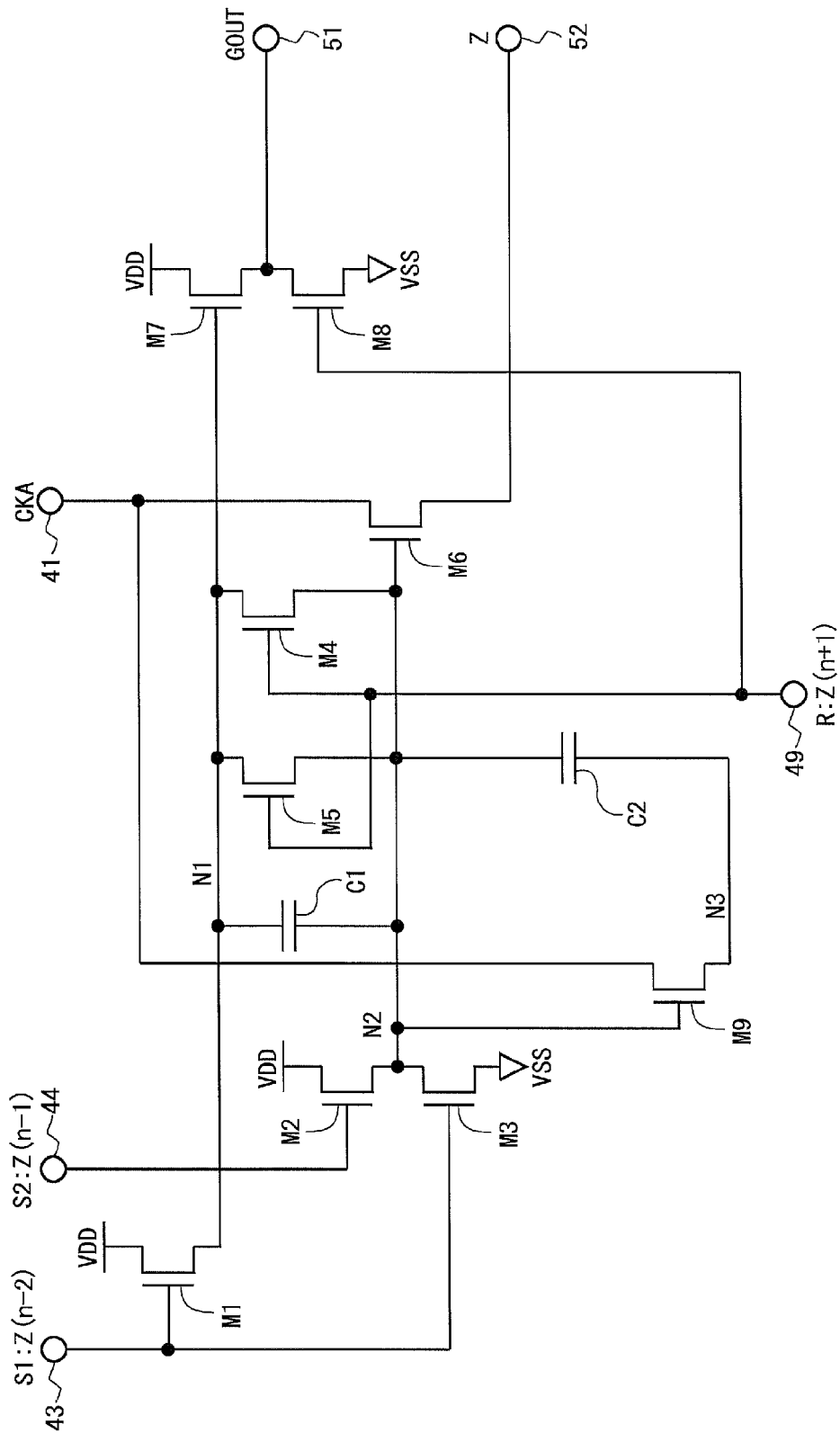
FIG. 17 is a circuit diagram showing a configuration of the stage constituent circuit in a sixth modification example of the first embodiment.

FIG. 17 is a circuit diagram showing a configuration of the stage constituent circuit in a sixth modification example of the first embodiment. In the present modification example, the source terminal of the thin-film transistor M5 is connected to the first-node N1.

In the first embodiment, at the point in time t3, the reset signal R is brought into the HIGH level and the thin-film transistor M5 is brought into the ON state, so that the potential of the second-node N2 directly falls. In contrast to this, according to the present modification example, after the point in time t3, the potential of the first-node N1 falls, so that the potential of the second-node N2 falls. Therefore, a time required until the potential of the second-node N2 is brought into the LOW level after the point in time t3 becomes longer than that in the first embodiment. Thus, the potential of the different stage control signal Z rapidly lowers to the LOW level through the thin-film transistor M6 in the reset period.

1.6.7 Other Modification Examples

In the first embodiment, the potential of the third-node N3 lowers at the timing of the point in time t3; however, the present invention is not limited thereto. The timing at which the potential of the third-node N3 falls is not particularly limited as long as the potential of the third-node N3 rises at the timing of the point in time t2.

In the first embodiment, moreover, the drain terminal of the thin-film transistor M9 is connected to the input terminal 41; however, the drain terminal of the thin-film transistor M9 may be connected to the output terminal 52. That is, it is only necessary to feed either the first clock CKA or the different stage control signal Z to the drain terminal of the thin-film transistor M9. In the first embodiment, further, the gate terminal of the thin-film transistor M9 is connected to the second-node N2; however, the gate terminal of the thin-film transistor M9 may be connected to the first-node N1.

2. Second Embodiment

2.1 Configuration of Stage Constituent Circuit

Figure 18:
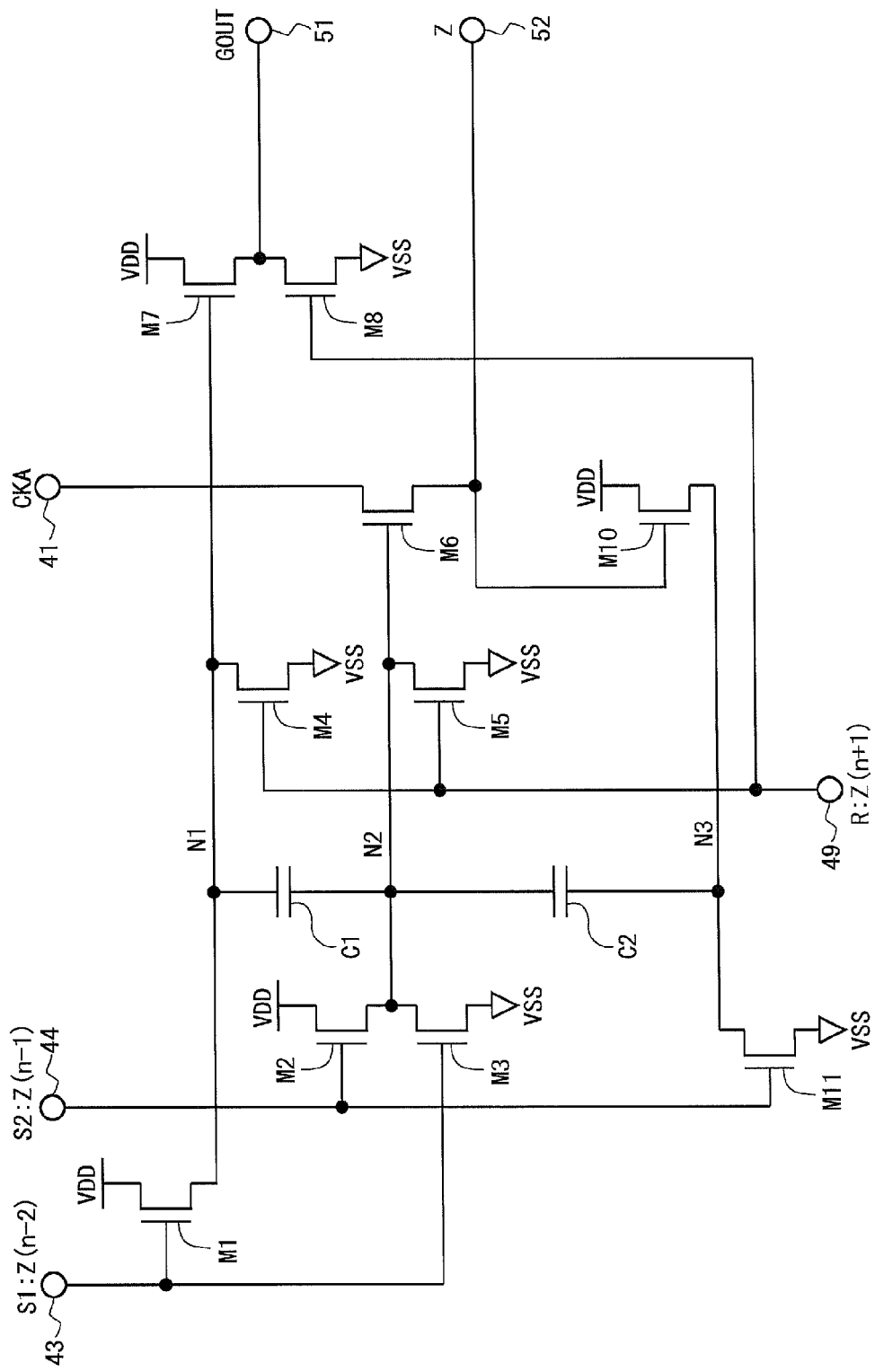
FIG. 18 is a circuit diagram showing a configuration of a stage constituent circuit in a second embodiment of the present invention.

FIG. 18 is a circuit diagram showing a configuration of a stage constituent circuit in a second embodiment of the present invention. A general configuration and operations of a liquid crystal display device as well as a configuration and operations of a gate driver are similar to those in the first embodiment; therefore, the description thereof will not be given here. In the present embodiment, the stage constituent circuit includes thin-film transistors M10 and M11 in place of the thin-film transistor M9 in the first embodiment shown in FIG. 1. A first third-node turn-on switching element is realized by the thin-film transistor M10, and a third-node turn-off switching element is realized by the thin-film transistor M11. As for the thin-film transistor M10, a gate terminal is connected to an output terminal 52, a drain terminal is connected to an input terminal for a DC power supply potential VDD, and a source terminal is connected to a third-node N3. As for the thin-film transistor M11, a gate terminal is connected to an input terminal 44, a drain terminal is connected to the third-node N3, and a source terminal is connected to an input terminal for a DC power supply potential VSS. The thin-film transistor M10 changes a potential of the third-node N3 toward the VDD potential when a different stage control signal Z is in a HIGH level. The thin-film transistor M11 changes the potential of the third-node N3 toward the VSS potential when a second set signal S2 is in the HIGH level.

2.2 Effects

According to the present embodiment, the thin-film transistor M10 for raising the potential of the third-node N3 is brought into an ON state on the basis of the different stage control signal Z. Therefore, as shown in FIG. 12, the potential of the third-node N3 changes from a LOW level to the HIGH level at a point in time t2. Herein, the different stage control signal Z is in the HIGH level during only one horizontal scanning period in one vertical scanning period. Accordingly, a period in which a high voltage is applied between the gate and the source of the thin-film transistor M10 is short, and the thin-film transistor for raising the potential of the third-node N3 is restrained from being degraded. Therefore, a step-up waveform of the potential of the third-node N3 is restrained from being degraded, and the shift register 410 can be operated in a stable manner for a long period.

2.3 Modification Examples

2.3.1 First Modification Example

Figure 19:
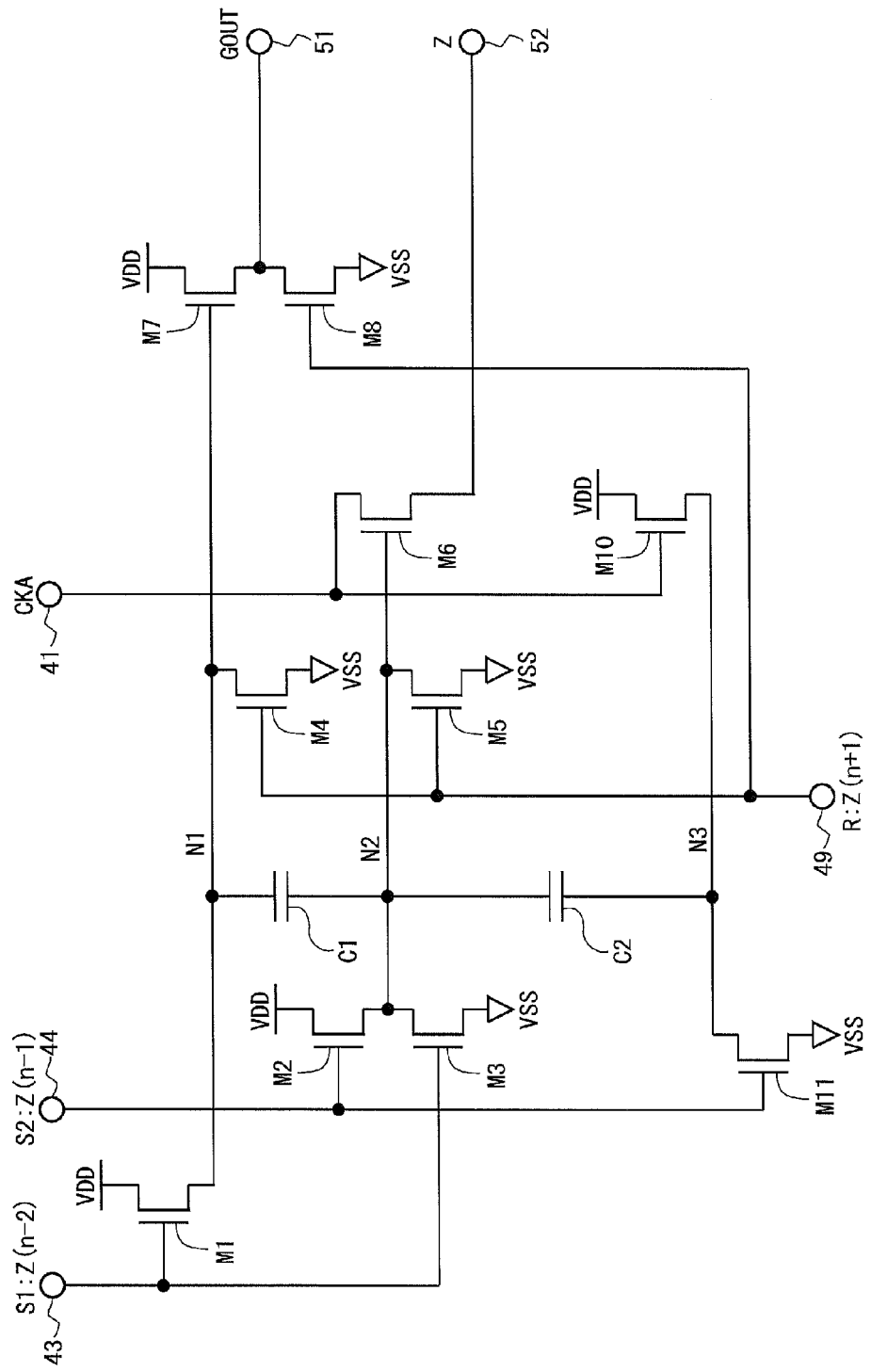
FIG. 19 is a circuit diagram showing a configuration of the stage constituent circuit in a first modification example of the second embodiment.

FIG. 19 is a circuit diagram showing a configuration of the stage constituent circuit in a first modification example of the second embodiment. In the present modification example, the gate terminal of the thin-film transistor M10 is connected to an input terminal 41. Accordingly, in the present modification example, the thin-film transistor M10 changes the potential of the third-node N3 toward the VDD potential when a first clock CKA is in the HIGH level.

According to the present modification example, the thin-film transistor M10 is brought into the ON state each time the first clock CKA is brought into the HIGH level. Therefore, the potential of the third-node N3 is raised toward the VDD potential at a relatively short cycle. Thus, during the normal operation period, even when an electric current is leaked from a thin-film transistor (e.g., the thin-film transistor M11) connected to the third-node N3, the potential of the third-node N3 is maintained at the HIGH level with reliability. Thus, the stability in circuit operation is enhanced.

Figure 20:
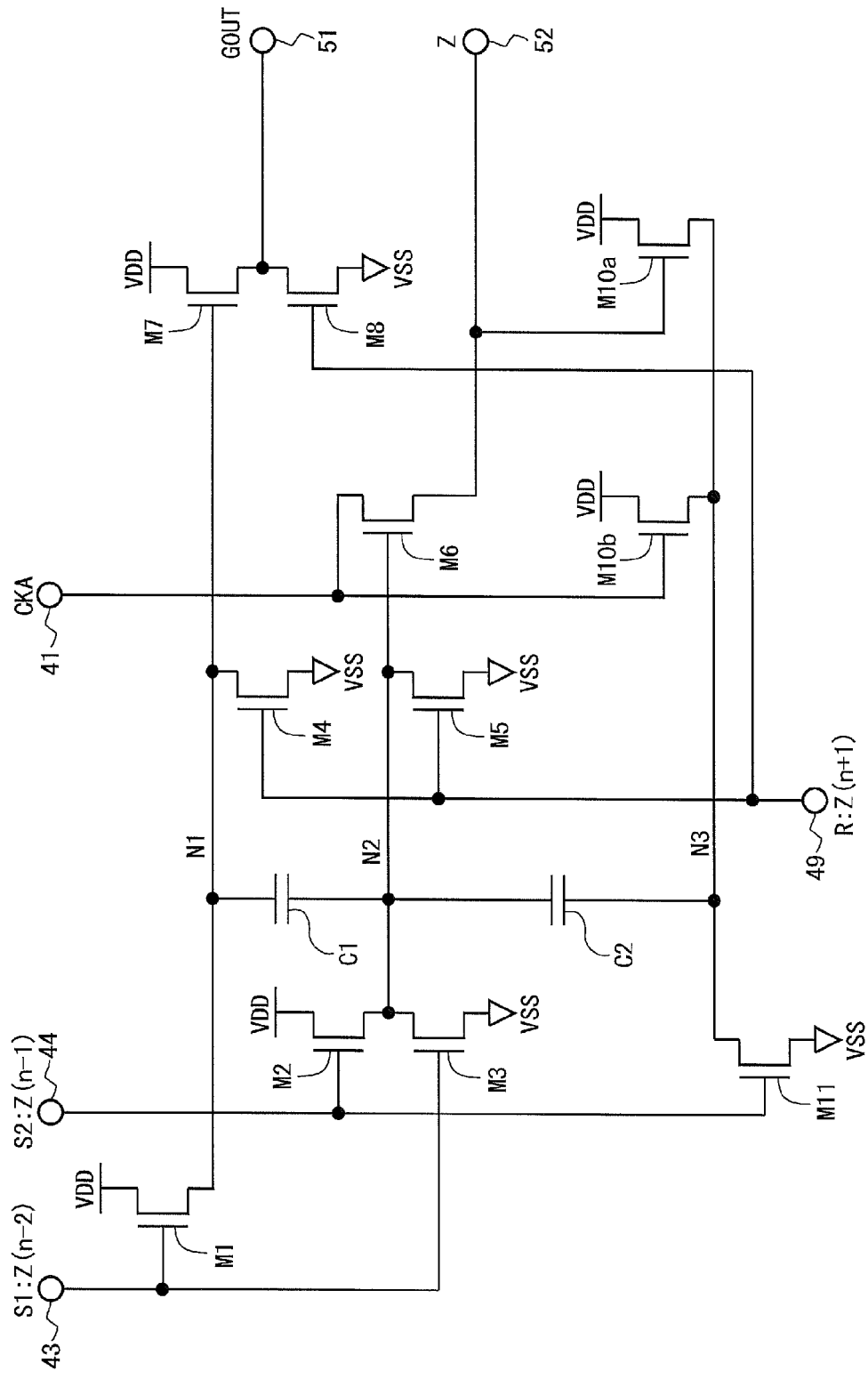
FIG. 20 is a circuit diagram for illustrating the modification example of the second embodiment.

Note that, as shown in FIG. 20, the stage constituent circuit may be configured to include a thin-film transistor M10a having a gate terminal connected to the output terminal 52, a drain terminal connected to the input terminal for the DC power supply potential VDD, and a source terminal connected to the third-node N3, and a thin-film transistor M10b having a gate terminal connected to the input terminal 41, a drain terminal connected to the input terminal for the DC power supply potential VDD, and a source terminal connected to the third-node N3. Thus, the step-up waveform of the potential of the third-node N3 is restrained from being degraded, and the potential of the third-node N3 is maintained at the HIGH level with reliability in the normal operation period.

Figure 21:
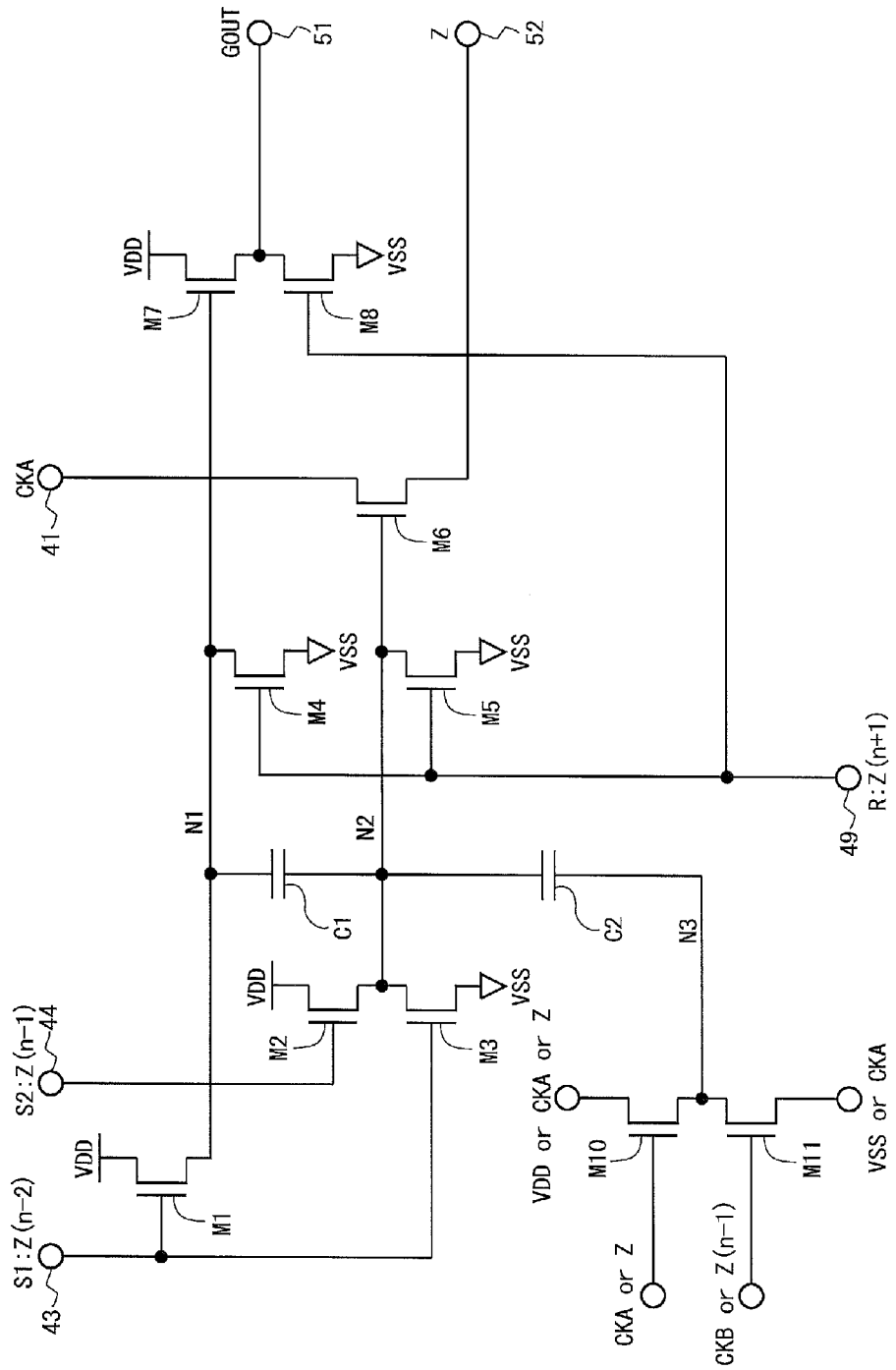
FIG. 21 is a circuit diagram for illustrating the modification example of the second embodiment.

By the way, the configuration in the vicinity of the thin-film transistors M10 and M11 in the second embodiment can be generally represented as shown in FIG. 21. That is, the first clock CKA or the different stage control signal Z may be fed to the gate terminal of the thin-film transistor M10. Moreover, the VDD potential, the first clock CKA or the different stage control signal Z may be fed to the drain terminal of the thin-film transistor M10. Further, a second clock CKB or a different stage control signal Z (n−1) in the preceding stage may be fed to the gate terminal of the thin-film transistor M11. Furthermore, the VSS potential or the first clock CKA may be fed to the source terminal of the thin-film transistor M11.

Figure 22:
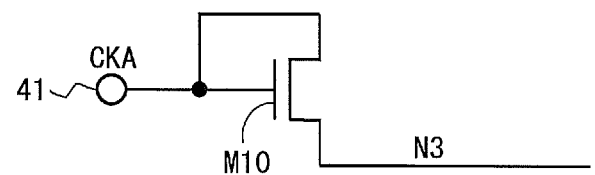
FIG. 22 is a diagram for illustrating the modification example of the second embodiment.

Note that, as shown in FIG. 22, a connection may be established between the gate and the drain of the thin-film transistor M10. Thus, the thin-film transistor M10 is restrained from being degraded as in the foregoing configuration shown in FIG. 14.

2.3.2 Second Modification Example

Figure 23:
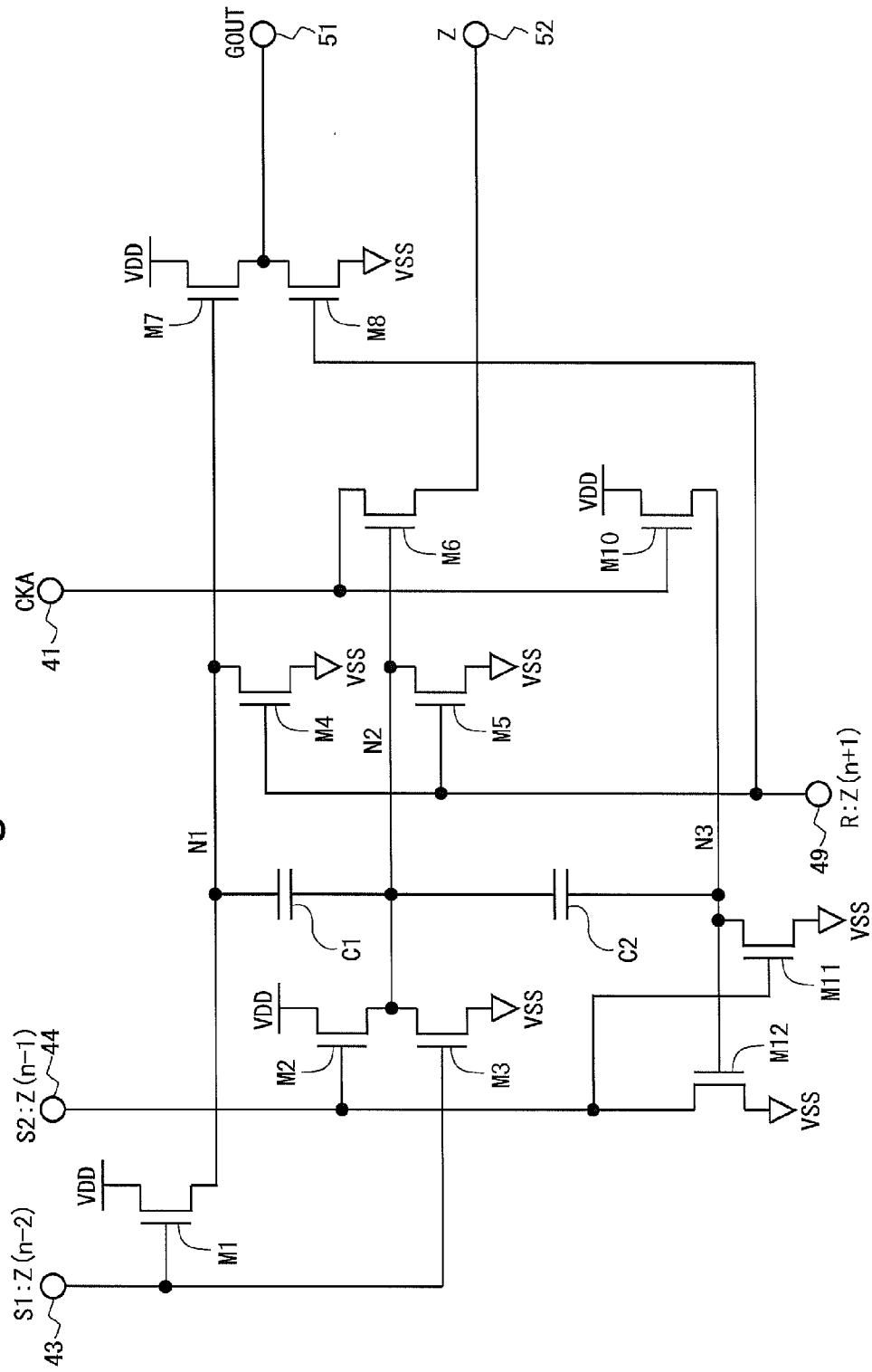
FIG. 23 is a circuit diagram showing a configuration of the stage constituent circuit in a second modification example of the second embodiment.

FIG. 23 is a circuit diagram showing a configuration of the stage constituent circuit in a second modification example of the second embodiment. In the present modification example, a thin-film transistor M12 is provided in addition to the constituent elements in the second embodiment shown in FIG. 18. A second-node set signal turn-off switching element is realized by the thin-film transistor M12. As for the thin-film transistor M12, a gate terminal is connected to the third-node N3, a drain terminal is connected to the input terminal 44, and a source terminal is connected to the input terminal for the DC power supply potential VSS. The thin-film transistor M12 changes the potential of the input terminal 44 toward the VSS potential when the potential of the third-node N3 is in the HIGH level. Moreover, the gate terminal of the thin-film transistor M10 is connected to the input terminal 41, as in the first modification example.

According to the present modification example, during the normal operation period, the thin-film transistor M12 is brought into the ON state and the potential of the input terminal 44 is drawn into the VSS potential. Therefore, in each of the stage constituent circuits, an influence of noise from the different stage control signal Z(n−1) to be fed from the preceding stage is restrained, and the stability in circuit operation is improved.

Figure 24:
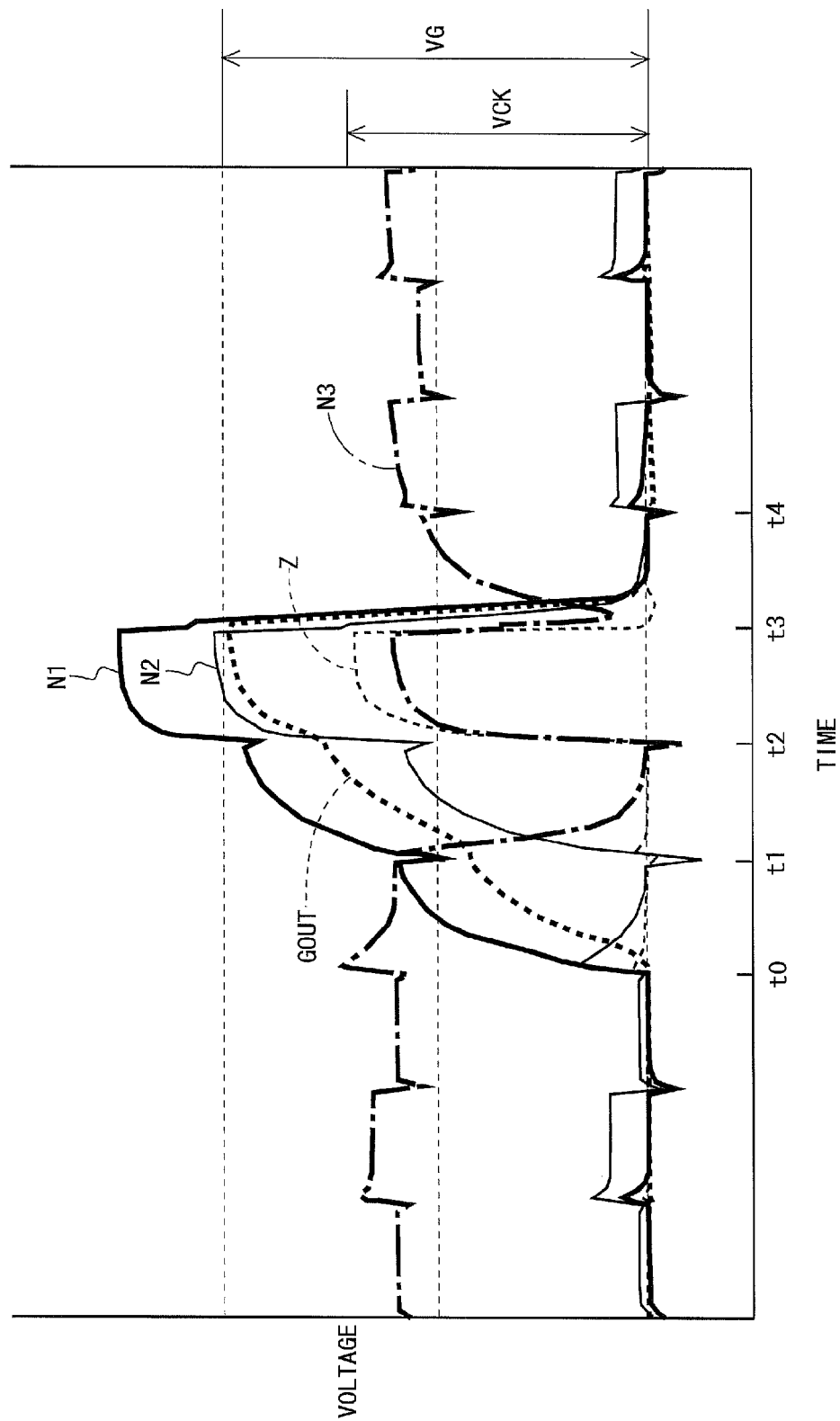
FIG. 24 is a diagram showing results of simulation in the second modification example of the second embodiment.

FIG. 24 is a diagram showing results of simulation in a case where an amplitude VCK of a clock signal is set to be 0.7 times as small as an amplitude VG of a scanning signal GOUT, in the present modification example. As is apparent from FIG. 24, a potential of the scanning signal GOUT is raised step by step, and the potential of the scanning signal GOUT satisfactorily rises in a period from a point in time t2 to a point in time t3. Moreover, the potential of the third-node N3 falls once at the point in time t3, but immediately rises to the HIGH level. From the above, a power consumption in a shift register 410 is reduced as compared with a conventional one without lowering a voltage to be applied to a gate bus line in a full charge period as compared with a conventional one.

2.3.3 Third Modification Example

Figure 25:
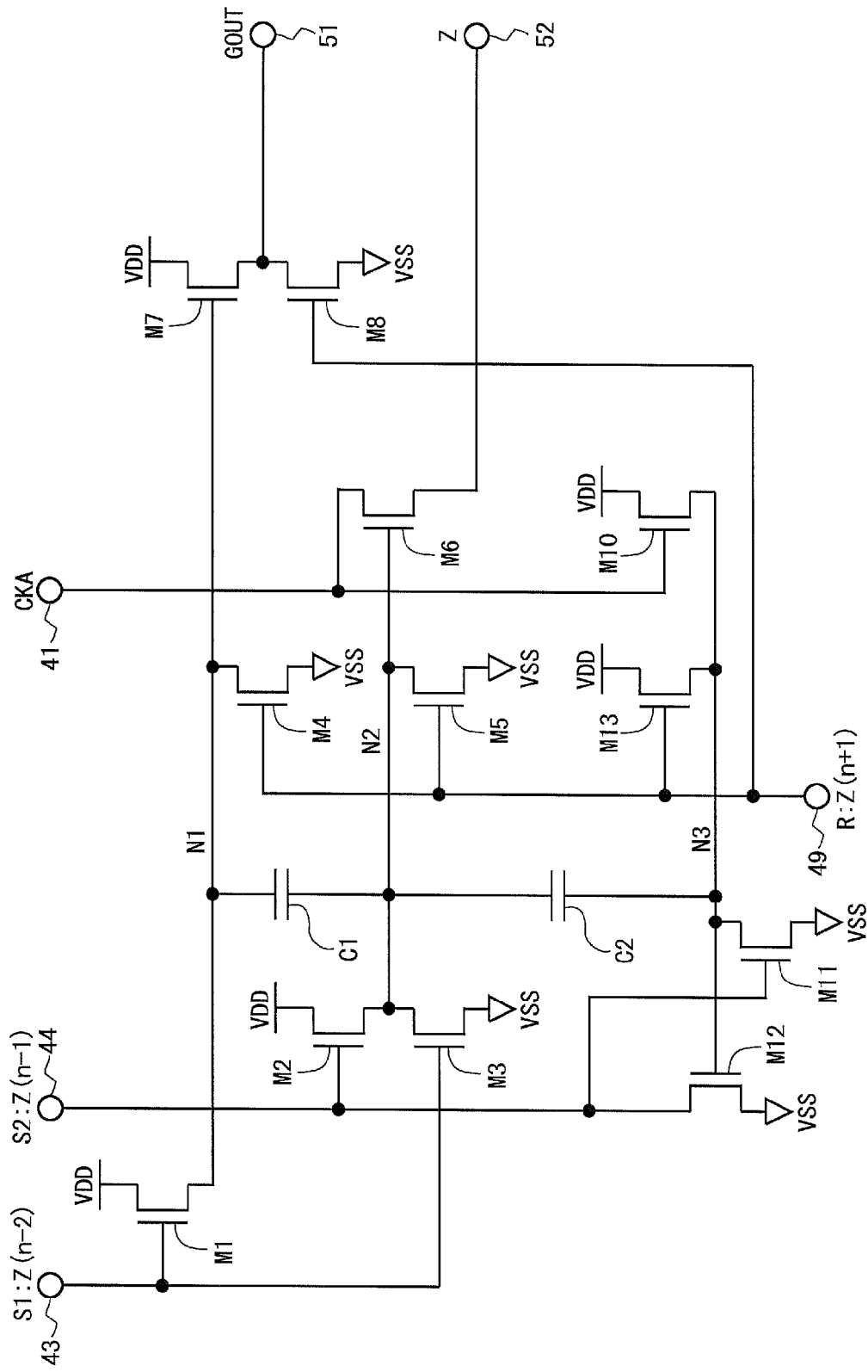
FIG. 25 is a circuit diagram showing a configuration of the stage constituent circuit in a third modification example of the second embodiment.

FIG. 25 is a circuit diagram showing a configuration of the stage constituent circuit in a third modification example of the second embodiment. In the present modification example, a thin-film transistor M13 is further provided in addition to the constituent elements in the second modification example shown in FIG. 23. A second third-node turn-on switching element is realized by the thin-film transistor M13. As for the thin-film transistor M13, a gate terminal is connected to an input terminal 49, a drain terminal is connected to the input terminal for the DC power supply potential VDD, and a source terminal is connected to the third-node N3. The thin-film transistor M13 changes the potential of the third-node N3 toward the VDD potential when the reset signal R is in the HIGH level.

According to the present modification example, the potential of the third-node N3 is maintained at the HIGH level with reliability during the normal operation period. Thus, in each of the stage constituent circuits, an influence of noise from the different stage control signal Z(n−1) to be fed from the preceding stage is restrained with reliability, and the stability in circuit operation is improved.

2.3.4 Other Modification Examples

The stage constituent circuit may be configured to include the thin-film transistor M9 among the constituent elements in the first embodiment shown in FIG. 1, in addition to the constituent elements in the second embodiment shown in FIG. 18. Thus, the potential of the third-node N3 rapidly rises at the point in time t2 (see FIG. 12).

3. Third Embodiment

3.1 Configuration of Stage Constituent Circuit

Figure 26:
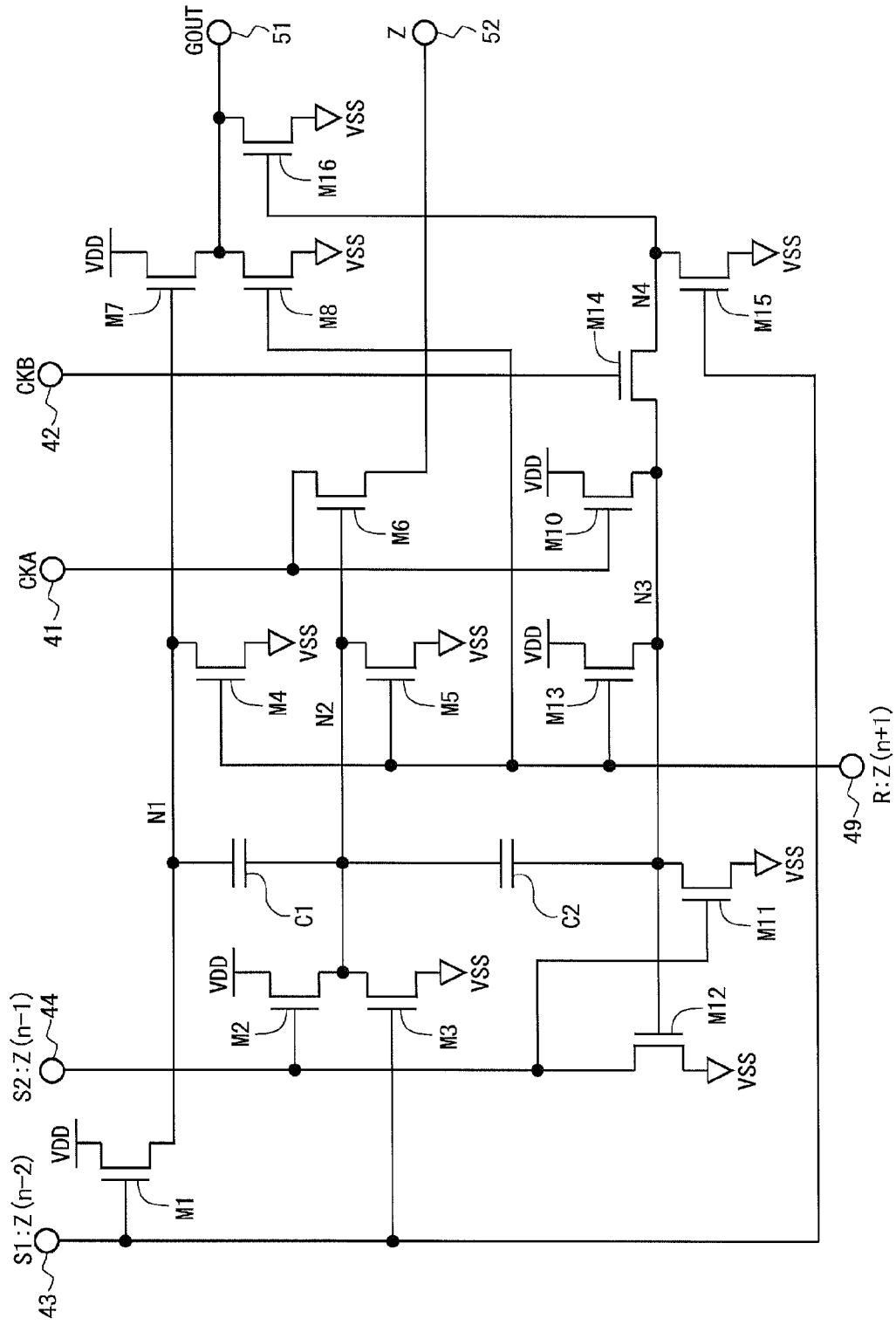
FIG. 26 is a circuit diagram showing a configuration of a stage constituent circuit in a third embodiment of the present invention.

FIG. 26 is a circuit diagram showing a configuration of a stage constituent circuit in a third embodiment of the present invention. A general configuration and operations of a liquid crystal display device as well as a configuration and operations of a gate driver are similar to those in the first embodiment; therefore, the description thereof will not be given here.

As shown in FIG. 26, the stage constituent circuit includes 15 thin-film transistors M1 to M8 and M9 to M16, and two capacitors C1 and C2. Moreover, the stage constituent circuit has five input terminals 41 to 44 and 49, and two output terminals 51 and 52 in addition to an input terminal for a HIGH-level DC power supply potential VDD and an input terminal for a LOW-level DC power supply potential VSS. Herein, the input terminal for receiving a second clock CKB is denoted with the reference character 42. Hereinafter, description will be mainly given of different points from those in the first embodiment.

Next, description will be given of connection relations among constituent elements in the stage constituent circuit. A source terminal of the thin-film transistor M10, a drain terminal of the thin-film transistor M11, a gate terminal of the thin-film transistor M12, a source terminal of the thin-film transistor M13, a drain terminal of the thin-film transistor M14 and the other end of the capacitor C2 are connected to one another through a third-node N3. A source terminal of the thin-film transistor M14, a drain terminal of the thin-film transistor M15 and a gate terminal of the thin-film transistor M16 are connected to one another. A region (a wire) in which these are connected to one another is referred to as a "fourth-node" for convenience of the description. The fourth-node is denoted with a reference character N4.

As for the thin-film transistor M10, a gate terminal is connected to the input terminal 41, a drain terminal is connected to the input terminal for the DC power supply potential VDD, and the source terminal is connected to the third-node N3. As for the thin-film transistor M11, a gate terminal is connected to the input terminal 44, the drain terminal is connected to the third-node N3, and a source terminal is connected to the input terminal for the DC power supply potential VSS. As for the thin-film transistor M12, the gate terminal is connected to the third-node N3, a drain terminal is connected to the input terminal 44, and a source terminal is connected to the input terminal for the DC power supply potential VSS. As for the thin-film transistor M13, a gate terminal is connected to the input terminal 49, a drain terminal is connected to the input terminal for the DC power supply potential VDD, and the source terminal is connected to the third-node N3. As for the thin-film transistor M14, a gate terminal is connected to the input terminal 42, the drain terminal is connected to the third-node N3, and the source terminal is connected to the fourth-node N4. As for the thin-film transistor M15, a gate terminal is connected to the input terminal 43, the drain terminal is connected to the fourth-node N4, and a source terminal is connected to the input terminal for the DC power supply potential VSS. As for the thin-film transistor M16, the gate terminal is connected to the fourth-node N4, a drain terminal is connected to the output terminal 51, and a source terminal is connected to the input terminal for the DC power supply potential VSS. Note that the gate terminal of the thin-film transistor M15 may be connected to the first-node N1.

Next, description will be given of functions of the respective constituent elements in the stage constituent circuit. The thin-film transistor M10 changes a potential of the third-node N3 toward a VDD potential when a first clock CKA is in a HIGH level. The thin-film transistor M11 changes the potential of the third-node N3 toward a VSS potential when a second set signal S2 is in the HIGH level. The thin-film transistor M12 changes a potential of the input terminal 44 toward the VSS potential when the potential of the third-node N3 is in the HIGH level. The thin-film transistor M13 changes the potential of the third-node N3 toward the VDD potential when a reset signal R is in the HIGH level. The thin-film transistor M14 performs charge transfer between the third-node N3 and the fourth-node N4 when a second clock CKB is in the HIGH level. The thin-film transistor M15 changes the potential of the fourth-node N4 toward the VSS potential when a first set signal S1 is in the HIGH level. The thin-film transistor M16 changes a potential of the output terminal 51 toward the VSS potential when the potential of the fourth-node N4 is in the HIGH level.

Note that, in the present embodiment, a first third-node turn-on switching element is realized by the thin-film transistor M10, a third-node turn-off switching element is realized by the thin-film transistor M11, a second-node set signal turn-off switching element is realized by the thin-film transistor M12, a second third-node turn-on switching element is realized by the thin-film transistor M13, a fourth-node control switching element is realized by the thin-film transistor M14, a fourth-node turn-off switching element is realized by the thin-film transistor M15, and a second first-output-node turn-off switching element is realized by the thin-film transistor M16.

3.2 Operations of Stage Constituent Circuit

Figure 27:
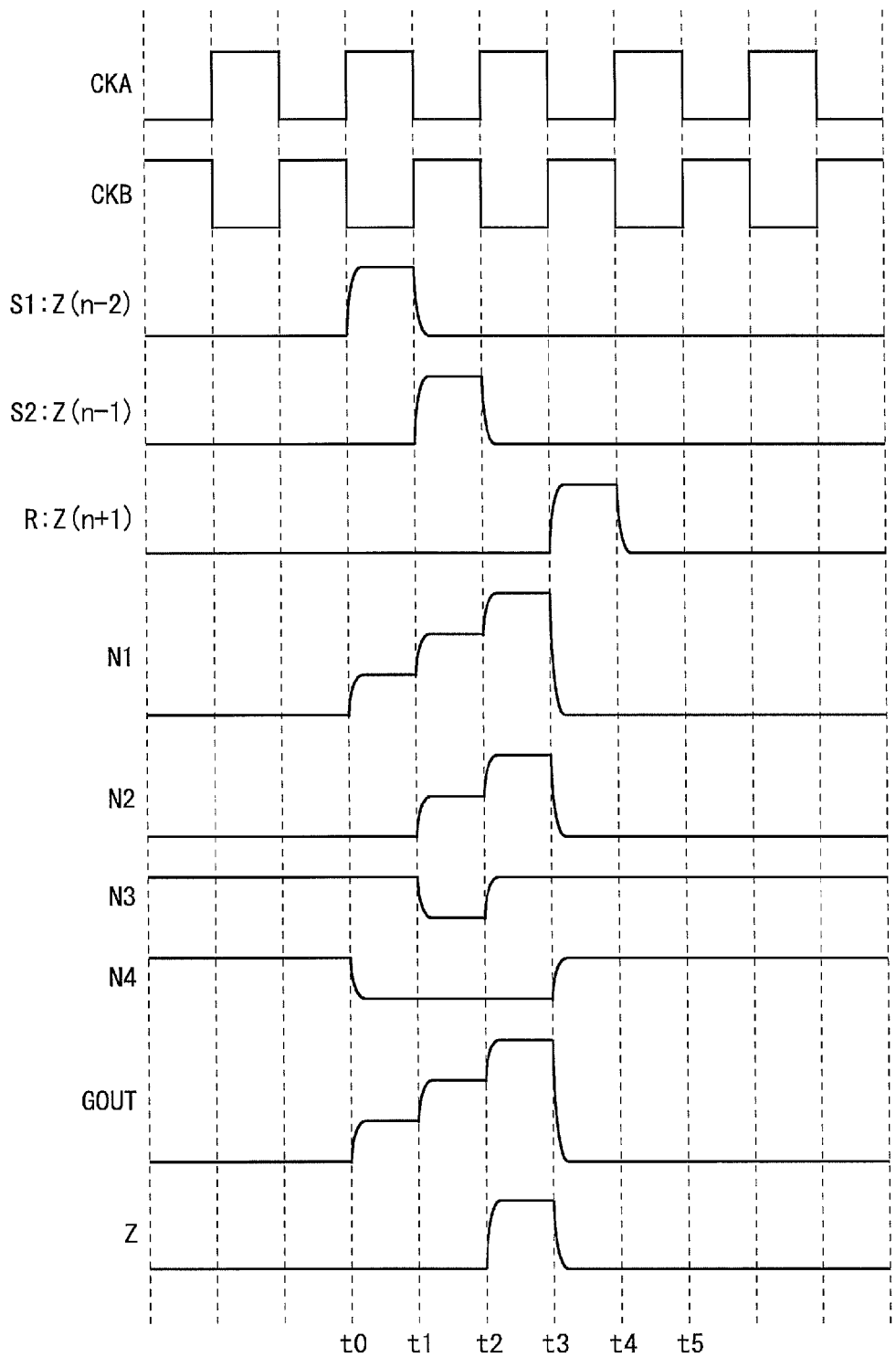
FIG. 27 is a signal waveform chart for illustrating operations of the stage constituent circuit, in the third embodiment.

With reference to FIGS. 26 and 27, next, description will be given of operations of the stage constituent circuit in the present embodiment. Herein, attention is given to the stage constituent circuit in the nth stage. In a period before a point in time t0, the potential of the first-node N1, the potential of the second-node N2, a potential of a scanning signal GOUT (a potential of the output terminal 51), and a potential of a different stage control signal Z (a potential of the output terminal 52) are maintained at a LOW level, and the potential of the third-node N3 and the potential of the fourth-node N4 are maintained at the HIGH level.

At the point in time t0, the first set signal S1 changes from the LOW level to the HIGH level. Thus, the thin-film transistors M1, M3 and M15 are brought into an ON state. The thin-film transistor M1 is brought into the ON state, so that the potential of the first-node N1 rises, and the thin-film transistor M3 is brought into the ON state, so that the potential of the second-node N2 is drawn into the VSS potential. As the result, the capacitor C1 is electrically charged. Moreover, the thin-film transistor M15 is brought into the ON state, so that the potential of the fourth-node N4 is drawn into the VSS potential. Further, the potential of the first-node N1 rises, so that the thin-film transistor M7 is brought into the ON state, and the potential of the scanning signal GOUT rises.

At a point in time t1, the second set signal S2 changes from the LOW level to the HIGH level. Thus, the thin-film transistors M2 and M11 are brought into the ON state. The thin-film transistor M11 is brought into the ON state, so that the potential of the third-node N3 falls. At the point in time t1, moreover, the first set signal S1 changes from the HIGH level to the LOW level. Thus, the thin-film transistors M1, M3 and M15 are brought into an OFF state. The thin-film transistor M2 is brought into the ON state and the thin-film transistor M3 is brought into the OFF state, so that the potential of the second-node N2 rises. At this time, since the thin-film transistor M1 is in the OFF state and the first-node N1 is in a floating state, the potential of the first-node N1 rises through the capacitor C1 in accordance with the rise in the potential of the second-node N2 (the first-node N1 is bootstrapped). As the result, the potential of the scanning signal GOUT further rises. At the point in time t1, moreover, the second clock CKB changes from the LOW level to the HIGH level. Thus, the thin-film transistor M14 is brought into the ON state. At this time, since the potential of the third-node N3 is in the LOW level, the potential of the fourth-node N4 is maintained at the LOW level. In a period from the point in time t1 to a point in time t2, the potential of the second-node N2 is brought into the HIGH level and the thin-film transistor M6 is brought into the ON state. However, since the first clock CKA is in the LOW level, the potential of the different stage control signal Z is maintained at the LOW level.

At the point in time t2, the second set signal S2 changes from the HIGH level to the LOW level. Thus, the thin-film transistor M2 is brought into the OFF state, and the second-node N2 is brought into the floating state. At the point in time t2, moreover, the first clock CKA changes from the LOW level to the HIGH level. Thus, the thin-film transistor M10 is brought into the ON state, and the potential of the third-node N3 rises. Since the first-node N1 and the second-node N2 are in the floating state, the potential of the second-node N2 rises through the capacitor C2 in accordance with the rise in the potential of the third-node N3, and the potential of the first-node N1 rises through the capacitor C1 in accordance with the rise in the potential of the second-node N2 (the first-node N1 is bootstrapped). Thus, the potential of the first-node N1 becomes higher than the VDD potential, and the potential of the scanning signal GOUT is raised to the VDD potential. Moreover, since the thin-film transistor M6 is in the ON state and the first clock CKA is in the HIGH level, the potential of the first clock CKA is fed to the output terminal 52. Thus, the potential of the different stage control signal Z is brought into the HIGH level. Note that, in a period from the point in time t2 to a point in time t3, since the second clock CKB is in the LOW level, the thin-film transistor M14 is brought into the OFF state, and the potential of the fourth-node N4 is maintained at the LOW level.

At the point in time t3, the first clock CKA changes from the HIGH level to the LOW level. Thus, the potential of the different stage control signal Z falls in accordance with the fall in the potential of the input terminal 41. At the point in time t3, moreover, the reset signal R changes from the LOW level to the HIGH level. Thus, the thin-film transistors M4, M5, M8 and M13 are brought into the ON state. The thin-film transistor M4 is brought into the ON state, so that the potential of the first-node N1 is brought into the LOW level, the thin-film transistor M5 is brought into the ON state, so that the potential of the second-node N2 is brought into the LOW level, and the thin-film transistor M8 is brought into the ON state, so that the potential of the scanning signal GOUT is brought into the LOW level. Moreover, the thin-film transistor M13 is brought into the ON state, so that the potential of the third-node N3 is brought into the HIGH level. At this time, since the second clock CKB is in the HIGH level, the thin-film transistor M14 is brought into the ON state, and electrical charges are supplied from the third-node N3 to the fourth-node N4. Thus, the potential of the fourth-node N4 is brought into the HIGH level.

In a period after a point in time t4, as in the period before the point in time t0, the potential of the first-node N1, the potential of the second-node N2, the potential of the scanning signal GOUT(the potential of the output terminal 51) and the potential of the different stage control signal Z (the potential of the output terminal 52) are maintained at the LOW level, and the potential of the third-node N3 and the potential of the fourth-node N4 are maintained at the HIGH level.

By the way, in the period in which the second clock CKB is in the HIGH level among the period before the point in time t1 and the period after the point in time t2, the thin-film transistor M14 is brought into the ON state, so that electrical charges are supplied from the third-node N3 to the fourth-node N4.

3.3 Effects

In the present embodiment, when the potential of the fourth-node N4 is in the HIGH level, the thin-film transistor M16 is brought into the ON state, and the potential of the scanning signal GOUT is drawn into the VSS potential. Herein, in the period from the point in time t0 to the point in time t3, that is a writing operation period, the potential of the fourth-node N4 should be maintained at the LOW level such that the thin-film transistor M16 is brought into the OFF state. With regard to the configuration for raising the potential of the fourth-node N4 at the point in time t3, a different stage control signal Z(n+1) to be output from the stage constituent circuit in the next stage can be used. However, when the leakage of an electric current occurs at the thin-film transistor, the potential of the fourth-node N4 falls in a normal operation period, and circuit operations become unstable. With regard to this point, according to the present embodiment, electrical charges are supplied from the third-node N3 to the fourth-node N4 each time the second clock CKB is brought into the HIGH level. Accordingly, the potential of the fourth-node N4 is maintained at the HIGH level with reliability during the normal operation period. From the above, generation of noise concerning the scanning signal GOUT in the normal operation period is restrained with a simple configuration.

4. Fourth Embodiment

4.1 Configuration of Stage Constituent Circuit

Figure 28:
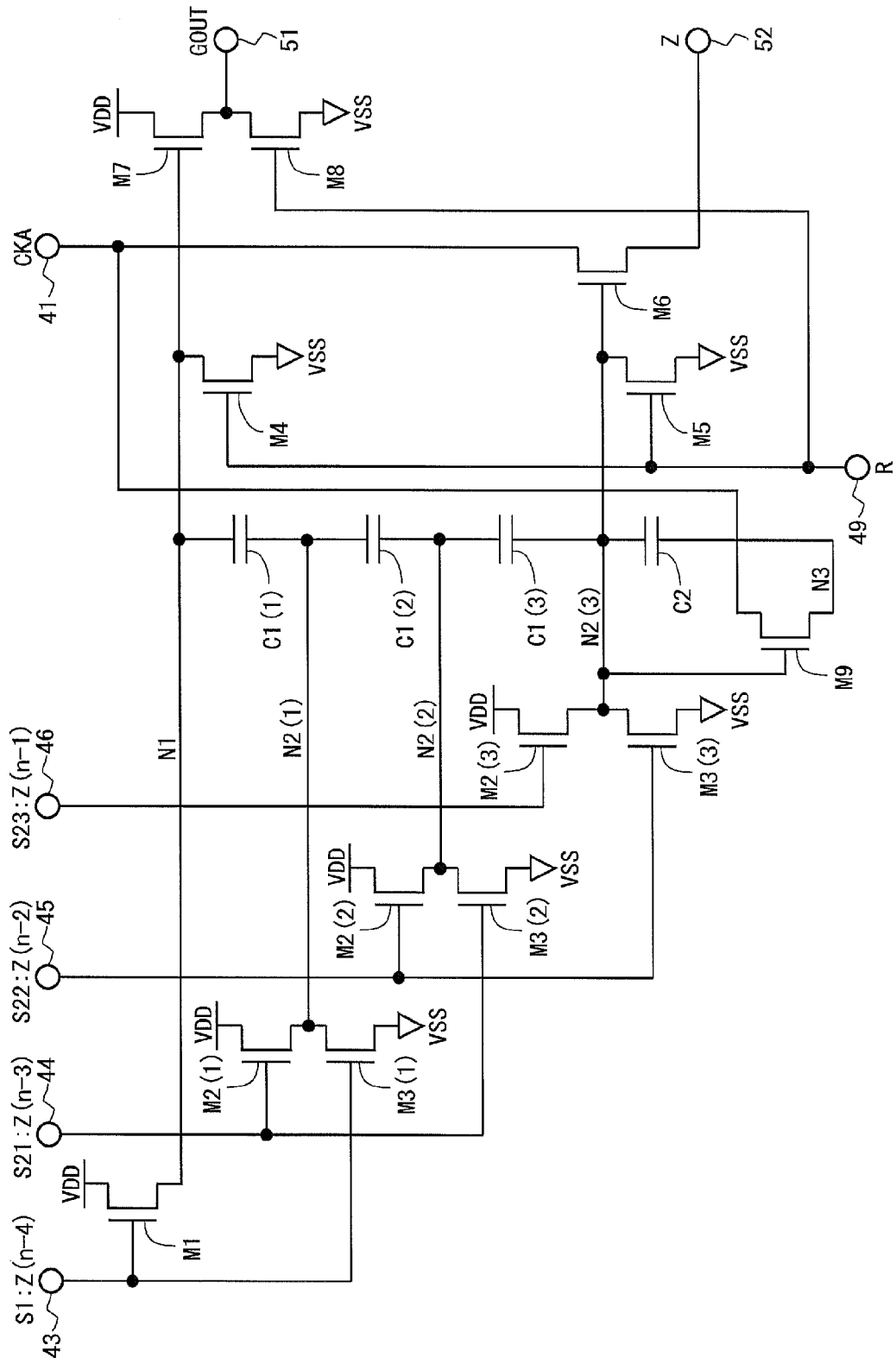
FIG. 28 is a circuit diagram showing a configuration of a stage constituent circuit in a fourth embodiment of the present invention.

FIG. 28 is a circuit diagram showing a configuration of a stage constituent circuit in a fourth embodiment of the present invention. As shown in FIG. 28, the stage constituent circuit includes 13 thin-film transistors M1, M2(1) to M2(3), M3(1) to M3(3) and M4 to M9, and four capacitors C1(1) to C1(3) and C2. Moreover, the stage constituent circuit has six input terminals 41, 43 to 46 and 49, and two output terminals 51 and 52 in addition to an input terminal for a HIGH-level DC power supply potential VDD and an input terminal for a LOW-level DC power supply potential VSS. Hereinafter, description will be mainly given of different points from those in the first embodiment.

In the present embodiment, a different stage control signal Z(n−4) to be output from the stage constituent circuit in the stage prior to the four stages is fed as a set signal S1 to the input terminal 43, a different stage control signal Z(n−3) to be output from the stage constituent circuit in the stage prior to the three stages is fed as a set signal S21 to the input terminal 44, a different stage control signal Z (n−2) to be output from the stage constituent circuit in the stage prior to the two stages is fed as a set signal S22 to the input terminal 45, and a different stage control signal Z (n−1) to be output from the stage constituent circuit in the preceding stage is fed as a set signal S23 to the input terminal 46. A first-node set signal is realized by the set signal S1, a second-node set signal is realized by the set signal S23, and a node region set signal is realized by the set signals S21 to S23.

Next, description will be given of connection relations among constituent elements in the stage constituent circuit. A source terminal of the thin-film transistor M1, a drain terminal of the thin-film transistor M4, a gate terminal of the thin-film transistor M7 and one end of the capacitor C1(1) are connected to one another through a first-node N1. A source terminal of the thin-film transistor M2(1), a drain terminal of the thin-film transistor M3(1), the other end of the capacitor C1(1) and one end of the capacitor C1(2) are connected to one another through a node N2(1). A source terminal of the thin-film transistor M2(2), a drain terminal of the thin-film transistor M3(2), the other end of the capacitor C1(2) and one end of the capacitor C1(3) are connected to one another through a node N2(2). A source terminal of the thin-film transistor M2(3), a drain terminal of the thin-film transistor M3(3), a drain terminal of the thin-film transistor M5, a gate terminal of the thin-film transistor M6, a gate terminal of the thin-film transistor M9, the other end of the capacitor C1(3) and one end of the capacitor C2 are connected to one another through a node N2(3). Note that, in the present embodiment, a second-node is realized by the node N2(3), a node region is realized by the nodes N2(1) to N2(3), and a first potential difference holding part is realized by the capacitors C1(1) to C1(3).

As for the thin-film transistor M2(1), a gate terminal is connected to the input terminal 44, a drain terminal is connected to the input terminal for the DC power supply potential VDD, and the source terminal is connected to the node N2(1). As for the thin-film transistor M3(1), a gate terminal is connected to the input terminal 43, the drain terminal is connected to the node N2(1), and a source terminal is connected to the input terminal for the DC power supply potential VSS. As for the thin-film transistor M2(2), a gate terminal is connected to the input terminal 45, a drain terminal is connected to the input terminal for the DC power supply potential VDD, and the source terminal is connected to the node N2(2). As for the thin-film transistor M3(2), a gate terminal is connected to the input terminal 44, the drain terminal is connected to the node N2(2), and a source terminal is connected to the input terminal for the DC power supply potential VSS. As for the thin-film transistor M2(3), a gate terminal is connected to the input terminal 46, a drain terminal is connected to the input terminal for the DC power supply potential VDD, and the source terminal is connected to the node N2(3). As for the thin-film transistor M3(3), a gate terminal is connected to the input terminal 45, the drain terminal is connected to the node N2(3), and a source terminal is connected to the input terminal for the DC power supply potential VSS. As for the thin-film transistor M5, a gate terminal is connected to the input terminal 49, the drain terminal is connected to the node N2(3), and a source terminal is connected to the input terminal for the DC power supply potential VSS. As for the thin-film transistor M6, the gate terminal is connected to the node N2(3), a drain terminal is connected to the input terminal 41, and a source terminal is connected to the output terminal 52. As for the thin-film transistor M9, the gate terminal is connected to the node N2(3), a drain terminal is connected to the input terminal 41, and a source terminal is connected to the third-node N3. As for the capacitor C1(1), one end is connected to the first-node N1, and the other end is connected to the node N2(1). As for the capacitor C1(2), one end is connected to the node N2(1), and the other end is connected to the node N2(2). As for the capacitor C1(3), one end is connected to the node N2(2), and the other end is connected to the node N2(3). As for the capacitor C2, one end is connected to the node N2(3), and the other end is connected to the third-node N3.

Next, description will be given of functions of the respective constituent elements in the stage constituent circuit. The thin-film transistor M2(1) changes a potential of the node N2(1) toward the VDD potential when the set signal S21 is in a HIGH level. The thin-film transistor M2(2) changes a potential of the node N2(2) toward the VDD potential when the set signal S22 is in the HIGH level. The thin-film transistor M2(3) changes a potential of the node N2(3) toward the VDD potential when the set signal S23 is in the HIGH level. The thin-film transistor M3(1) changes the potential of the node N2(1) toward the VSS potential when the set signal S1 is in the HIGH level. The thin-film transistor M3(2) changes the potential of the node N2(2) toward the VSS potential when the set signal S21 is in the HIGH level. The thin-film transistor M3(3) changes the potential of the node N2(3) toward the VSS potential when the set signal S22 is in the HIGH level. The thin-film transistor M5 changes the potential of the node N2(3) toward the VSS potential when a reset signal R is in the HIGH level. The thin-film transistor M6 feeds a potential of a first clock CKA to the output terminal 52 when the potential of the node N2(3) is in the HIGH level. The thin-film transistor M9 feeds the potential of the first clock CKA to the third-node N3 when the potential of the node N2(3) is in the HIGH level. The capacitor C1(1) functions to raise a potential of the first-node N1 in accordance with the rise in the potential of the node N2(1). The capacitor C1(2) functions to raise the potential of the node N2(1) in accordance with the rise in the potential of the node N2(2). The capacitor C1(3) functions to raise the potential of the node N2(2) in accordance with the rise in the potential of the node N2(3). The capacitor C2 functions to raise the potential of the node N2(3) in accordance with the rise in the potential of the third-node N3. That is, the capacitors C1(1) to C1(3) and C2 function as a bootstrap capacitance.

4.2 Operations of Stage Constituent Circuit

Figure 29:
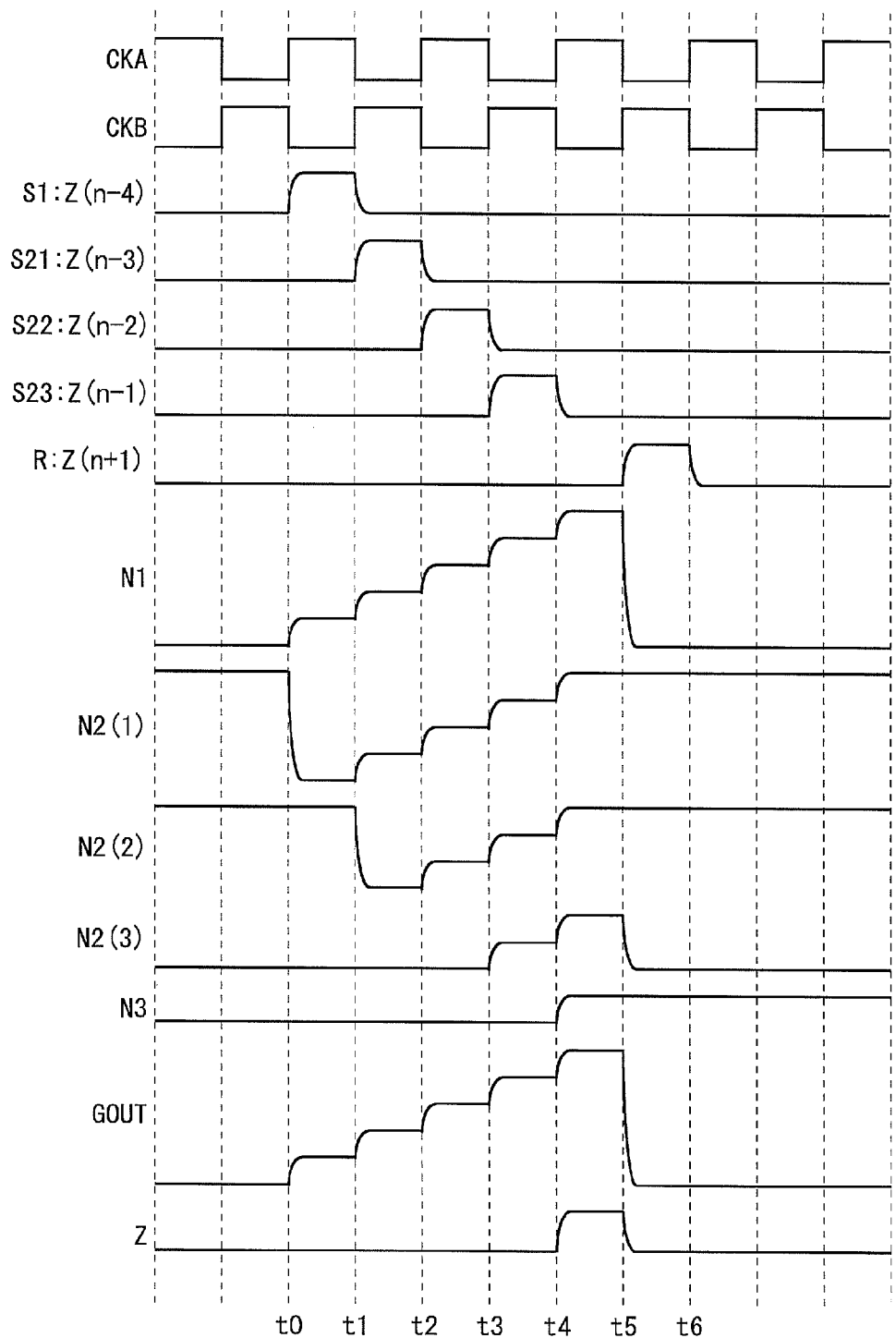
FIG. 29 is a signal waveform chart for illustrating operations of the stage constituent circuit, in the fourth embodiment.

With reference to FIGS. 28 and 29, next, description will be given of operations of the stage constituent circuit in the present embodiment. In a period before a point in time t0 and a period after a point in time t6, the potential of the first-node N1, the potential of the node N2(3), a potential of a scanning signal GOUT(a potential of the output terminal 51) and a potential of a different stage control signal Z (a potential of the output terminal 52) are maintained at a LOW level, and the potential of the node N2(1) and the potential of the node N2(2) are maintained at the HIGH level.

At the point in time t0, the set signal S1 changes from the LOW level to the HIGH level. Thus, the thin-film transistors M1 and M3(1) are brought into an ON state. The thin-film transistor M1 is brought into the ON state, so that the potential of the first-node N1 rises, and the thin-film transistor M3(1) is brought into the ON state, so that the potential of the node N2(1) is drawn into the VSS potential. As the result, the capacitor C1(1) is electrically charged. Moreover, the potential of the first-node N1 rises, so that the thin-film transistor M7 is brought into the ON state, and the potential of the scanning signal GOUT rises.

At a point in time t1, the set signal S21 changes from the LOW level to the HIGH level. Thus, the thin-film transistors M2(1) and M3(2) are brought into the ON state. At the point in time t1, moreover, the set signal S1 changes from the HIGH level to the LOW level. Thus, the thin-film transistors M1 and M3(1) are brought into an OFF state. The thin-film transistor M2(1) is brought into the ON state and the thin-film transistor M3(1) is brought into the OFF state, so that the potential of the node N2(1) rises. At this time, since the thin-film transistor M1 is in the OFF state and the first-node N1 is in a floating state, the potential of the first-node N1 rises through the capacitor C1(1) in accordance with the rise in the potential of the node N2(1) (the first-node N1 is bootstrapped). As the result, the potential of the scanning signal GOUT further rises.

At a point in time t2, the set signal S22 changes from the LOW level to the HIGH level. Thus, the thin-film transistors M2(2) and M3(3) are brought into the ON state. At the point in time t2, moreover, the set signal S21 changes from the HIGH level to the LOW level. Thus, the thin-film transistors M2(1) and M3(2) are brought into the OFF state. The thin-film transistor M2(2) is brought into the ON state and the thin-film transistor M3(2) is brought into the OFF state, so that the potential of the node N2(2) rises. At this time, since the first-node N1 and the node N2(1) are in the floating state, the potential of the first-node N1 rises through the capacitors C1(2) and C1(1) in accordance with the rise in the potential of the node N2(2) (the first-node N1 is bootstrapped). As the result, the potential of the scanning signal GOUT further rises.

At a point in time t3, the set signal S23 changes from the LOW level to the HIGH level. Thus, the thin-film transistor M2(3) is brought into the ON state. At the point in time t3, moreover, the set signal S22 changes from the HIGH level to the LOW level. Thus, the thin-film transistors M2(2) and M3(3) are brought into the OFF state. The thin-film transistor M2(3) is brought into the ON state and the thin-film transistor M3(3) is brought into the OFF state, so that the potential of the node N2(3) rises. At this time, since the first-node N1, the node N2(1) and the node N2(2) are in the floating state, the potential of the first-node N1 rises through the capacitors C1(3), C1(2) and C1(1) in accordance with the rise in the potential of the node N2(3) (the first-node N1 is bootstrapped). As the result, the potential of the scanning signal GOUT further rises. In a period from the point in time t3 to a point in time t4, the node N2(3) is in the HIGH level, and therefore the thin-film transistors M6 and M9 are in the ON state. However, since the first clock CKA is in the LOW level, the potential of the third-node N3 and the potential of the different stage control signal Z are maintained at the LOW level.

At the point in time t4, the set signal S23 changes from the HIGH level to the LOW level. Thus, the thin-film transistor M2(3) is brought into the OFF state, and the node N2(3) is brought into the floating state. At the point in time t4, moreover, the first clock CKA changes from the LOW level to the HIGH level. At this time, since the thin-film transistor M9 is in the ON state, the potential of the third-node N3 rises. Since the first-node N1 and the nodes N2(1) to N2(3) are in the floating state, the potential of the first-node N1 rises through the capacitors C2, C1(3), C1(2) and C1(1) in accordance with the rise in the potential of the third-node N3 (the first-node N1 is bootstrapped). Thus, the potential of the first-node N1 becomes higher than the VDD potential, and the potential of the scanning signal GOUT is raised to the VDD potential. Moreover, since the thin-film transistor M6 is in the ON state and the first clock CKA is in the HIGH level, the potential of the first clock CKA is fed to the output terminal 52. Thus, the potential of the different stage control signal Z is brought into the HIGH level.

At a point in time t5, the first clock CKA changes from the HIGH level to the LOW level. Thus, the potential of the different stage control signal Z falls in accordance with the fall in the potential of the input terminal 41. At the point in time t5, moreover, the reset signal R changes from the LOW level to the HIGH level. Thus, the thin-film transistors M4, M5 and M8 are brought into the ON state. The thin-film transistor M4 is brought into the ON state, so that the potential of the first-node N1 is brought into the LOW level, the thin-film transistor M5 is brought into the ON state, so that the potential of the node N2(3) is brought into the LOW level, and the thin-film transistor M8 is brought into the ON state, so that the potential of the scanning signal GOUT is brought into the LOW level. In the period after the point in time t6, the potential of the first-node N1, the potential of the node N2(3), the potential of the scanning signal GOUT(the potential of the output terminal 51) and the potential of the different stage control signal Z (the potential of the output terminal 52) are maintained at the LOW level, and the potential of the node N2(1) and the potential of the node N2(2) are maintained at the HIGH level.

4.3 Effects

According to the present embodiment, the potential of the first-node N1 rises on the basis of the set signal S1, and then rises four times by the bootstrapping. Therefore, with regard to the clock signal (herein, the first clock CKA), with a small amplitude, the potentials of the scanning signals GOUT(1) to GOUT(i) to be applied to the gate bus lines GL1 to GLi respectively can be satisfactorily raised. Thus, a power consumption in a shift register 410 can be remarkably reduced as compared with a conventional one, without lowering a voltage to be applied to a gate bus line in a full charge period as compared with a conventional one.

4.4 Modification Examples

4.4.1 First Modification Example

Figure 30:
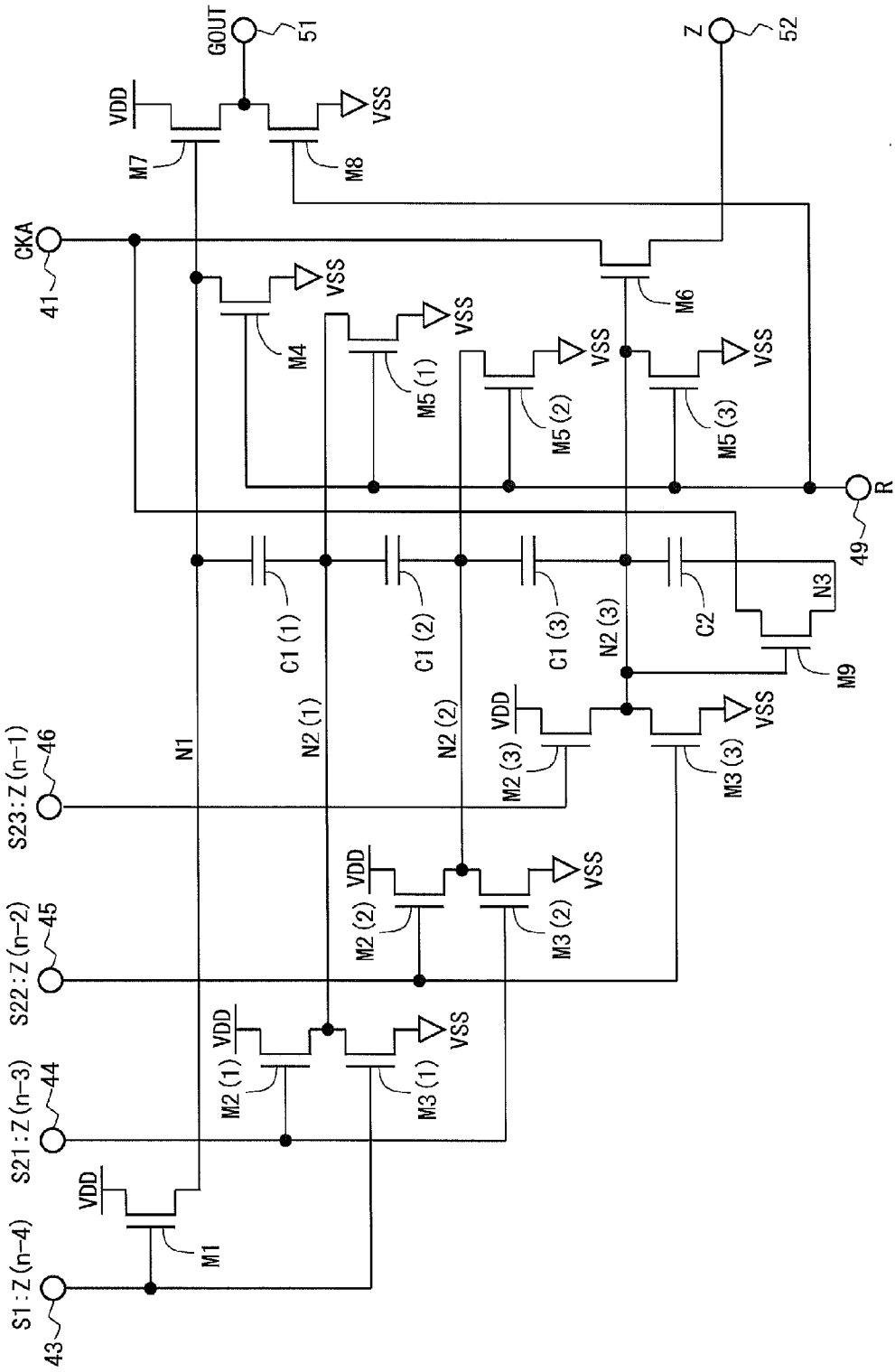
FIG. 30 is a circuit diagram showing a configuration of the stage constituent circuit in a first modification example of the fourth embodiment.

FIG. 30 is a circuit diagram showing a configuration of the stage constituent circuit in a first modification example of the fourth embodiment. In the present modification example, the stage constituent circuit includes thin-film transistors M5(1) to M5(3) in place of the thin-film transistor M5 (see FIG. 28)

in the fourth embodiment. As for the thin-film transistors M5(1) to M5(3), a gate terminal is connected to the input terminal 49, and a source terminal is connected to the input terminal for the DC power supply potential VSS. Moreover, a drain terminal of the thin-film transistor M5(1) is connected to the node N2(1), a drain terminal of the thin-film transistor M5(2) is connected to the node N2(2), and a drain terminal of the thin-film transistor M5(3) is connected to the node N2(3).

Figure 31:
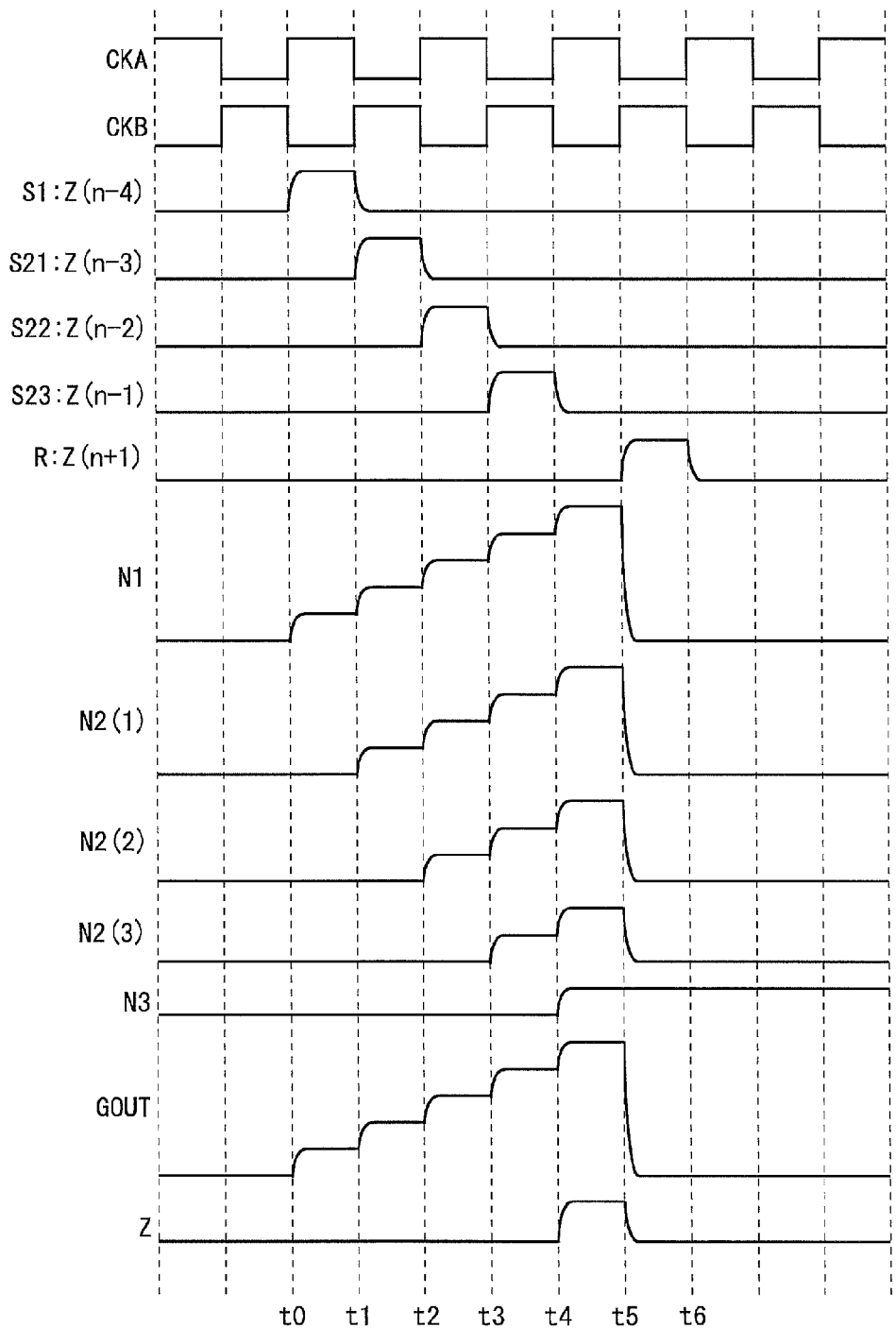
FIG. 31 is a signal waveform chart for illustrating operations of the stage constituent circuit, in the first modification example of the fourth embodiment.

FIG. 31 is a signal waveform chart for illustrating operations of the stage constituent circuit, in the present modification example. In the present modification example, when the reset signal R changes from the LOW level to the HIGH level at the point in time t5, the thin-film transistors M5(1) to M5(3) are brought into the ON state. Thus, the potentials of the nodes N2(1) to N2(3) are brought into the LOW level. As described above, the potentials of the nodes N2(1) to N2(3) are maintained at the LOW level during the normal operation period. As the result, gate-source voltages of the thin-film transistors M2(1) to M2(3) in the normal operation period become low, and the thin-film transistors M2(1) to M2(3) are restrained from being degraded. Thus, the stability in circuit operation is enhanced.

4.4.2 Second Modification Example

Figure 32:
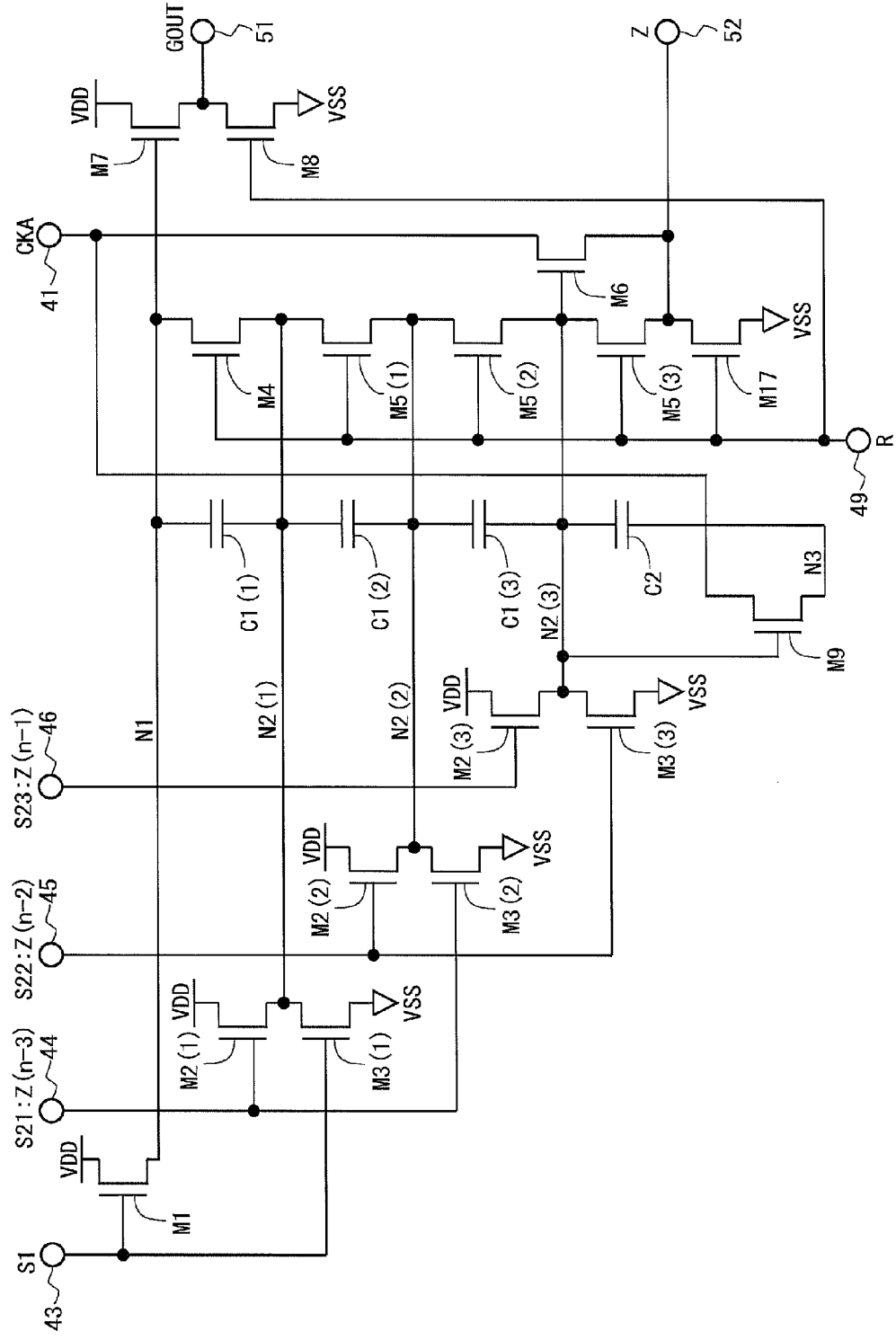
FIG. 32 is a circuit diagram showing a configuration of the stage constituent circuit in a second modification example of the fourth embodiment.

FIG. 32 is a circuit diagram showing a configuration of the stage constituent circuit in a second modification example of the fourth embodiment. In the first modification example shown in FIG. 30, the source terminals of the thin-film transistors M5(1) to M5(3) are connected to the input terminal for the DC power supply potential VSS. In the present modification example, however, the source terminal of the thin-film transistor M5(1) is connected to the node N2(2), the source terminal of the thin-film transistor M5(2) is connected to the node N2(3), and the source terminal of the thin-film transistor M5(3) is connected to the output terminal 52. Moreover, the source terminal of the thin-film transistor M4 is connected to the node N2(1). In the present modification example, further, there is provided a thin-film transistor M17 having a gate terminal connected to the input terminal 49, a drain terminal connected to the output terminal 52, and a source terminal connected to the input terminal for the DC power supply potential VSS.

According to the present modification example, as in the fourth modification example of the first embodiment, the drain-source voltages of the thin-film transistor M4 and thin-film transistors M5(1) to M5(3) are reduced. Thus, electrical charges are restrained from being flown out through the thin-film transistors M4 and M5(1) to M5(3) in the writing operation period. As the result, the potential of the first-node N1 and the potentials of the nodes N2(1) to N3(3) are restrained from falling in the writing operation period, and the stability in circuit operation is enhanced.

4.4.3 Other Modification Examples

The example that the potential of the first-node N1 rises four times by the bootstrapping in the writing operation period is described in the fourth embodiment; however, the present invention is not limited thereto. The potential of the first-node N1 may rise three times or may rise five or more times by the bootstrapping. With regard to this, the configuration should be such that the stage constituent circuit includes thin-film transistors M2(1) to M2(m) and M3(1) to M3(m), capacitors C1(1) to C1(m), and nodes N2(1) to N2(m), on the assumption that m is an integer of 1 or more. Herein, a configuration in a case of "m=1" corresponds to that in the first embodiment. Moreover, a configuration in a case of "m=3" corresponds to that in the fourth embodiment.

5. Set Signal Generation Circuit

In each of the foregoing embodiments, the shift register 410 starts the operations on the basis of the gate start pulse signal GSP sent from the display control circuit 200. With regard to this, in the first embodiment, for example, the first gate start pulse signal GSP1 is fed as the first set signal S1 for the first stage, and the second gate start pulse signal GSP2 is fed as the second set signal S2 for the first stage and the first set signal S1 for the second stage. That is, in each of the foregoing embodiments, two or more signals need to be sent as the gate start pulse signal GSP from the display control circuit 200 to the gate driver 400. Hereinafter, description will be given of a configuration that a circuit for generating a set signal (hereinafter, referred to as a "set signal generation circuit") is provided at the uppermost stage (the stage prior to the first stage) of the shift register. In the case of adopting this configuration, it is only necessary to send one signal as the gate start pulse signal GSP from the display control circuit 200 to the gate driver 400.

Figure 33:
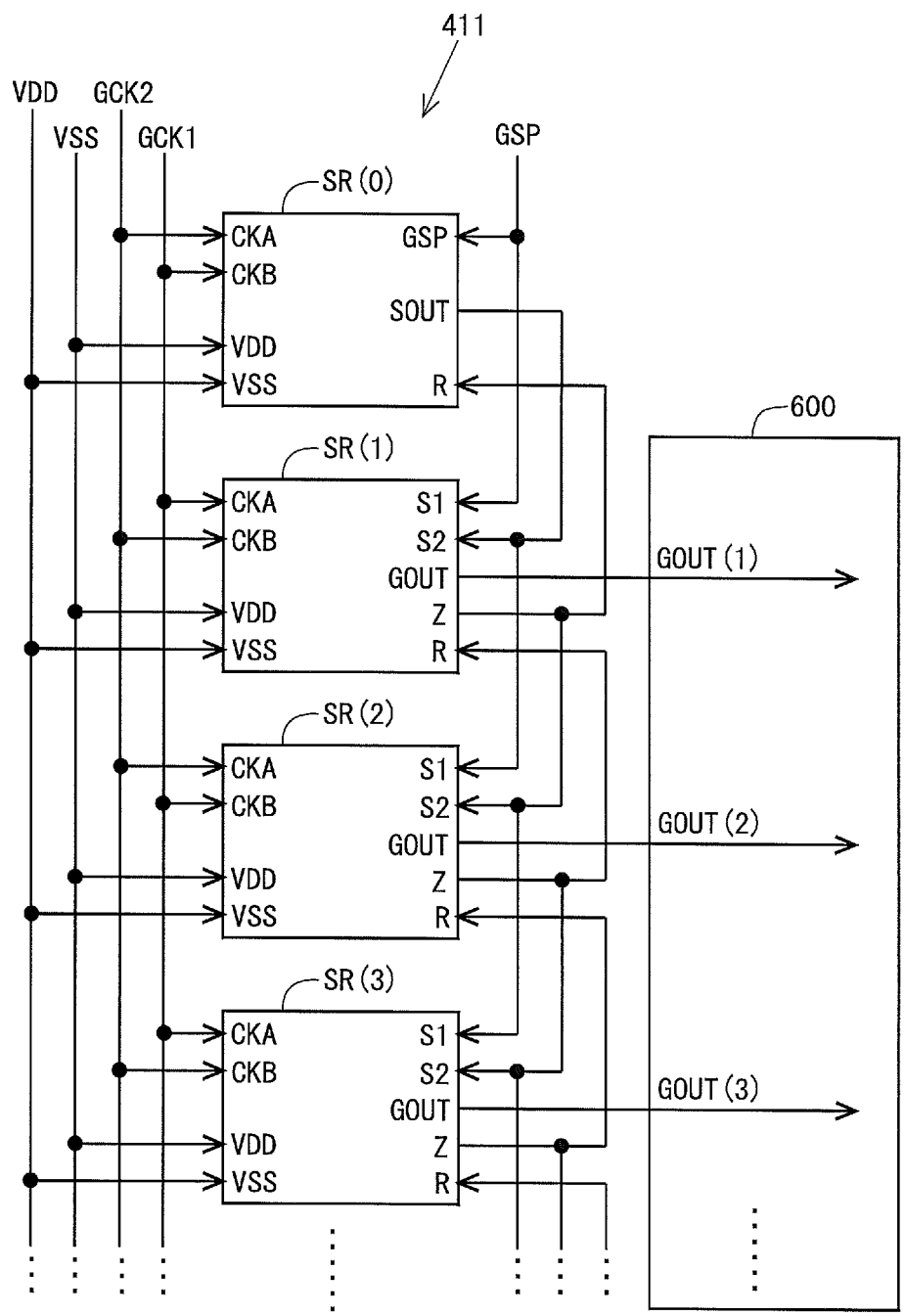
FIG. 33 is a block diagram showing a configuration of a shift register including a set signal generation circuit.

FIG. 33 is a block diagram showing a configuration of a shift register 411 including a set signal generation circuit SR(0). The set signal generation circuit SR(0) has an input terminal for receiving a first clock CKA, an input terminal for receiving a second clock CKB, an input terminal for receiving a HIGH-level DC power supply potential VDD, an input terminal for receiving a LOW-level DC power supply potential VSS, an input terminal for receiving a gate start pulse signal GSP, an input terminal for receiving a reset signal R, and an output terminal for outputting a signal SOUT.

Figure 34:
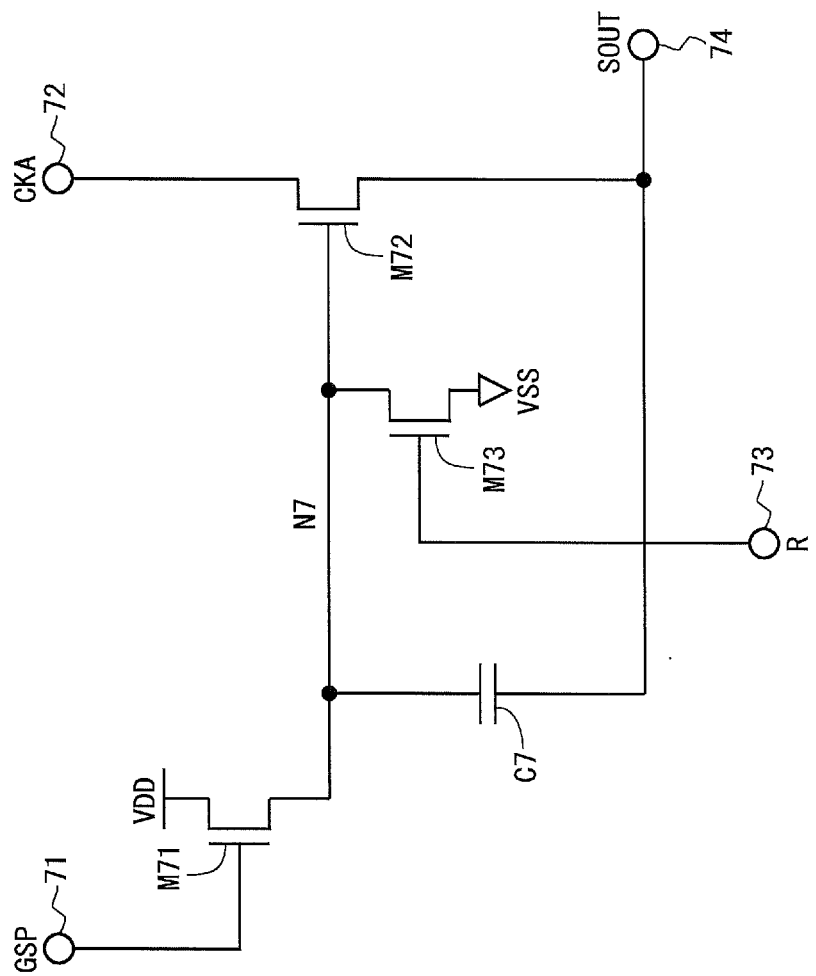
FIG. 34 is a circuit diagram showing a detailed configuration of the set signal generation circuit.

FIG. 34 is a circuit diagram showing a detailed configuration of the set signal generation circuit. As shown in FIG. 34, the set signal generation circuit includes three thin-film transistors M71 to M73, and one capacitor C7. Moreover, the set signal generation circuit has three input terminals 71 to 73, and one output terminal 74 in addition to an input terminal for the HIGH-level DC power supply potential VDD and an input terminal for the LOW-level DC power supply potential VSS. Herein, the input terminal for receiving the gate start pulse signal GSP is denoted with the reference character 71, the input terminal for receiving the first clock CKA is denoted with the reference character 72, the input terminal for receiving the reset signal R is denoted with the reference character 73, and the output terminal for outputting the signal SOUT is denoted with the reference character 74.

Note that the configuration of the set signal generation circuit is equal to the configuration in the vicinity of a location between the second-node N2 and the second-output-node (the output terminal 52) in the stage constituent circuit of the shift register described in each of the foregoing embodiments. In comparison of the constituent elements of the set signal generation circuit with the constituent elements of the stage constituent circuit shown in FIG. 1, for example, the thin-film transistor M71, the thin-film transistor M72, the thin-film transistor M73, the capacitor C7, the input terminal 71, the input terminal 72, the input terminal 73 and the output terminal 74 in the set signal generation circuit correspond to the thin-film transistor M2, the thin-film transistor M6, the thin-film transistor M5, the capacitor C2, the input terminal 44, the input terminal 41, the input terminal 49 and the output terminal 52 in the stage constituent circuit shown in FIG. 1, respectively. Accordingly, even when the set signal generation circuit is configured to be similar to the stage constituent circuit of the shift register and the gate start pulse signal GSP is inputted as the second-node set signal (the second set signal S2), the output of the signal SOUT from the second-output-node is obtained.

Next, description will be given of connection relations among the constituent elements in the set signal generation circuit. A source terminal of the thin-film transistor M71, a gate terminal of the thin-film transistor M72, a drain terminal of the thin-film transistor M73 and one end of the capacitor C7 are connected to one another through a node N7. As for the thin-film transistor M71, a gate terminal is connected to the input terminal 71, a drain terminal is connected to the input terminal for the DC power supply potential VDD, and the source terminal is connected to the node N7. As for the thin-film transistor M72, the gate terminal is connected to the node N7, a drain terminal is connected to the input terminal 72, and a source terminal is connected to the output terminal 74. As for the thin-film transistor M73, a gate terminal is connected to the input terminal 73, the drain terminal is connected to the node N7, and a source terminal is connected to the input terminal for the DC power supply potential VSS. As for the capacitor C7, one end is connected to the node N7, and the other end is connected to the output terminal 74.

Next, description will be given of functions of the respective constituent elements in the set signal generation circuit. The thin-film transistor M71 changes a potential of the node N7 toward the VDD potential when the gate start pulse signal GSP is in a HIGH level. The thin-film transistor M72 feeds a potential of the first clock CKA to the output terminal 74 when the potential of the node N7 is in the HIGH level. The thin-film transistor M73 changes the potential of the node N7 toward the VSS potential when the reset signal R is in the HIGH level. The capacitor C7 functions to also change the potential of the node N7 in accordance with the change of the potential of the output terminal 74 when the node N7 is in a floating state.

Figure 35:
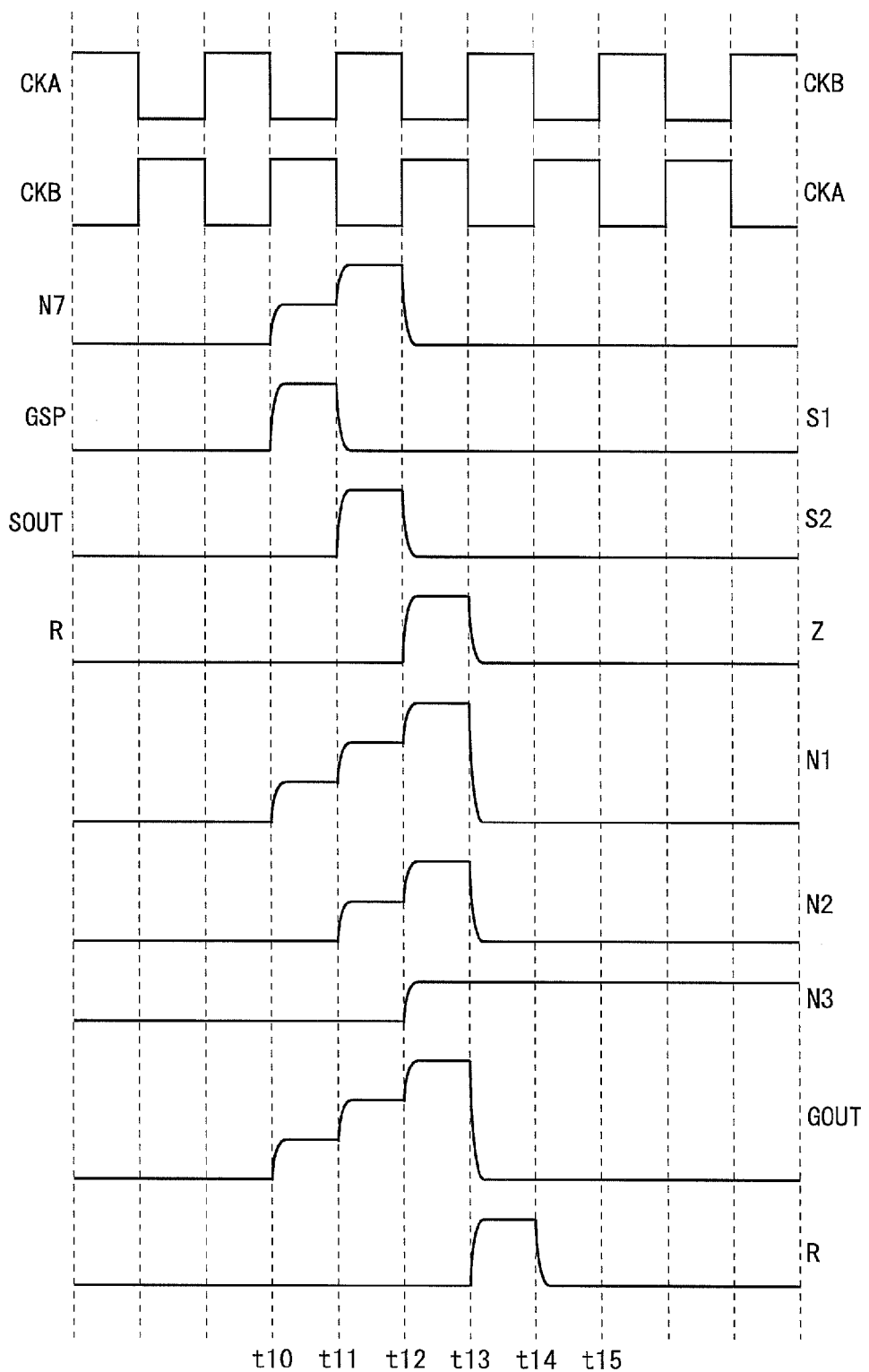
FIG. 35 is a signal waveform chart for illustrating operations of the set signal generation circuit.
Figure 36:
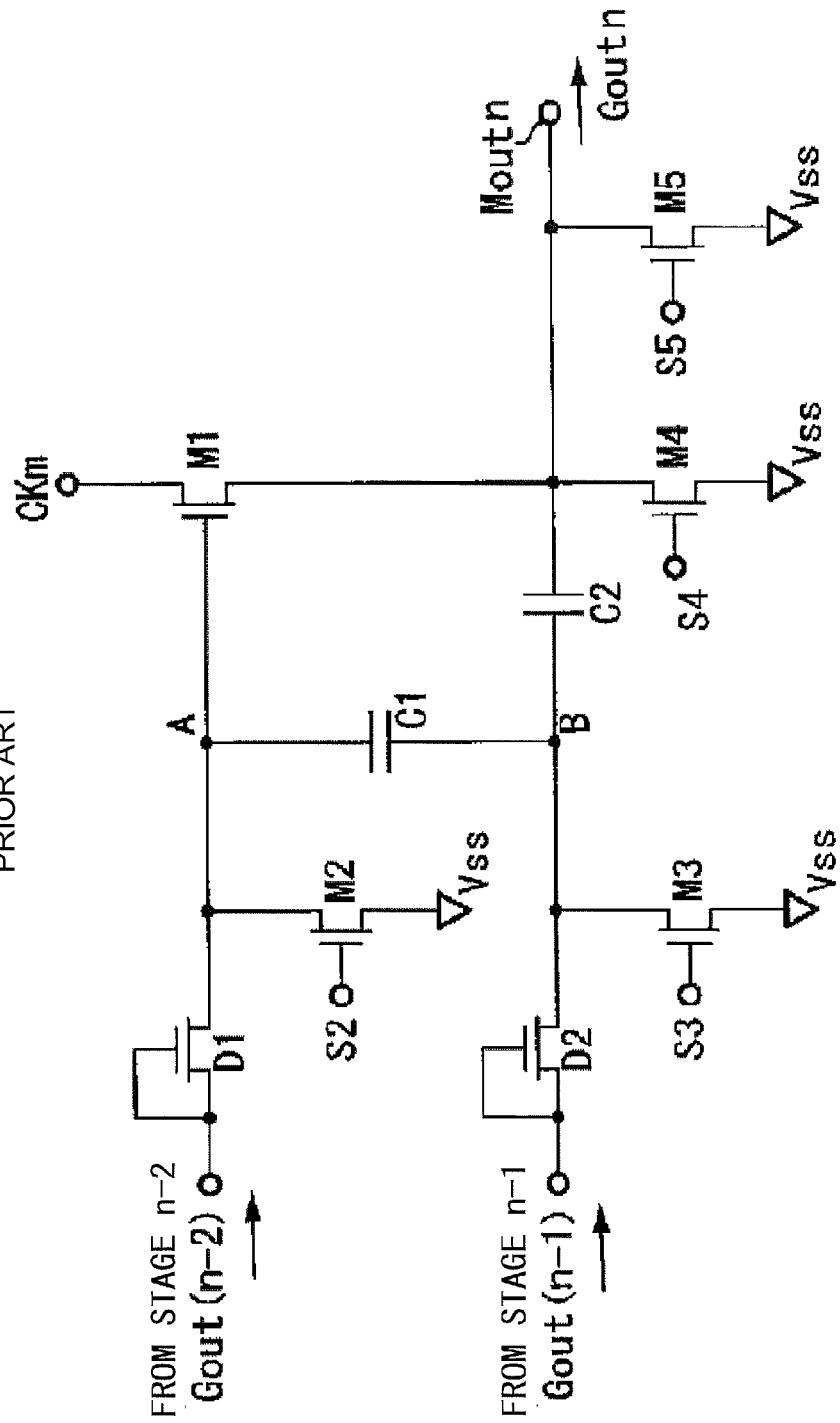
FIG. 36 is a circuit diagram showing a configuration example of one stage of a shift register, in a conventional liquid crystal display device.

With reference to FIGS. 34 and 35, next, description will be given of operations of the set signal generation circuit. Note that, in FIG. 35, designations of signals and the like in a case where attention is given to the set signal generation circuit SR(0) are depicted in the left of the respective signal waveforms, and designations of signals and the like in a case where attention is given to the stage constituent circuit SR(1) in the first stage are depicted in the right of the respective signal waveforms.

At a point in time t10, the gate start pulse signal GSP changes from the LOW level to the HIGH level. The gate start pulse signal GSP is brought into the HIGH level, so that the thin-film transistor M71 is brought into the ON state, and the capacitor C7 is electrically charged. Thus, the potential of the node N7 changes from the LOW level to the HIGH level, and the thin-film transistor M72 is brought into the ON state. In a period from the point in time t10 to a point in time t11, however, since the first clock CKA is in the LOW level, the potential of the signal SOUT is maintained at the LOW level.

At the point in time t11, the gate start pulse signal GSP changes from the HIGH level to the LOW level. Thus, the thin-film transistor M71 is brought into the OFF state, and the node N7 is brought into the floating state. At the point in time t11, the first clock CKA changes from the LOW level to the HIGH level. Since there is a parasitic capacitance between the gate and the drain of the thin-film transistor M72, the potential of the node N7 also rises in accordance with the rise in the potential of the input terminal 72 (the node N7 is bootstrapped). As the result, a high voltage is applied between the gate and the source of the thin-film transistor M72, and the potential of the first clock CKA is fed to the output terminal 74. Thus, the signal SOUT is brought into the HIGH level.

At a point in time t12, the first clock CKA changes from the HIGH level to the LOW level. Since the thin-film transistor M72 is in the ON state at the point in time t12, the potential of the signal SOUT falls in accordance with the fall in the potential of the input terminal 72. The potential of the signal SOUT falls as described above, so that the potential of the node N7 also falls through the capacitor C7. At the point in time 12, moreover, the reset signal R changes from the LOW level to the HIGH level. Therefore, the thin-film transistor M73 is brought into the ON state, and the potential of the node N7 is completely brought into the LOW level.

By the way, as shown in FIG. 33, the gate start pulse signal GSP to be sent from the display control circuit 200 is fed to the set signal generation circuit SR(0), and is also fed as the first set signal 51 to the first stage SR(1) of the shift register 411. Moreover, the signal SOUT output from the set signal generation circuit SR(0) is fed as the second set signal S2 to the first stage SR(1) of the shift register 411, and is also fed as the first set signal S1 to the second stage SR(2) of the shift register 411. Thus, the shift register 410 is allowed to perform desired operations while the number of signals to be fed from the display control circuit 200 to the gate driver 400 is reduced.

6. Others

In the description of each of the foregoing embodiments, a liquid crystal display device is mentioned as an example; however, the present invention is not limited thereto. The present invention is also applicable to other display devices such as organic EL (Electro Luminescence).

DESCRIPTION OF REFERENCE CHARACTERS 41 to 47, 49: Input terminal of (stage constituent circuit)
51, 52: Output terminal of (stage constituent circuit)
300: Source driver (video signal line drive circuit)
400: Gate driver (scanning signal line drive circuit)
410, 411: Shift register
600: Display part
SR(1) to SR(i): Stage constituent circuit
C1, C2: Capacitor (capacitance element)
M1 to M17: Thin-film transistor
N1 to N4: First-node to fourth-node
GL1 to GLi: Gate bus line
SL1 to SLj: Source bus line
GCK1, GCK2: First gate clock signal, second gate clock signal
CKA, CKB: First clock, second clock
S1, S2: First set signal, second set signal
R: Reset signal
Z: Different stage control signal
GOUT: Scanning signal
GSP: Gate start pulse signal
VDD: HIGH-level DC power supply potential
VSS: LOW-level DC power supply potential

The invention claimed is:
1. A scanning signal line drive circuit of a display device, for driving a plurality of scanning signal lines disposed in a display portion, the scanning signal line drive circuit comprising:
a shift register including a plurality of stages and sequentially outputting ON-level scanning signals in order to sequentially drive the plurality of scanning signal lines, on the basis of a plurality of externally input clock signals, wherein
a stage constituent circuit that defines each stage of the shift register includes a first-output-node configured to output the scanning signal that drives the scanning signal line, the first-output-node being connected to the scanning signal line, a second-output-node configured to output a different stage control signal that controls an operation of the stage constituent circuit in the different stage, a first output control switching element including a second electrode to which an ON-level DC power supply potential is fed, and a third electrode connected to the first-output-node, a second output control switching element including a second electrode to which one of the plurality of externally input clock signals is fed, and a third electrode connected to the second-output-node, a first-node connected to a first electrode of the first output control switching element, one or more nodes, including a second-node connected to a first electrode of the second output control switching element, a third-node configured to change from an OFF level to an ON level in a period from a point in time at which the second-node is brought into the ON level to a point in time of termination of a full charge period that is a period in which the scanning signal to be output from the first-output-node should be brought into the ON level, a first potential difference holding portion configured to hold a difference in potential between the first-node and the second-node, and a second potential difference holding portion configured to hold a difference in potential between the second-node and the third-node;

to each of the stage constituent circuits, the different stage control signal to be output from the stage constituent circuit in the stage prior to the two or more stages with respect to the relevant stage constituent circuit is fed as a first-node set signal, and one or more signals among the different stage control signals, which are output from the stage constituent circuits in the prior stages with respect to the relevant stage constituent circuit and are output from the stage constituent circuits in the subsequent stages with respect to the stage constituent circuit that outputs the different stage control signal as the first-node set signal, are fed as a set signal including a second-node set signal;

in each of the stage constituent circuits, the first-node changes from the OFF level to the ON level on the basis of the first-node set signal, the second-node changes from the OFF level to the ON level on the basis of the second-node set signal, the third-node changes from the OFF level to the ON level after the second-node changes from the OFF level to the ON level, the first-node is brought into a floating state in a period in which the one or more nodes change from the OFF level to the ON level and a period in which the third-node changes from the OFF level to the ON level, and the one or more nodes are brought into the floating state in the period in which the third-node changes from the OFF level to the ON level; and an amplitude of the one of the plurality of externally input clock signals is set to be smaller than an amplitude of the scanning signal.

2. The scanning signal line drive circuit according to claim 1, wherein the one or more nodes includes only the second-node;

to each of the stage constituent circuits, only the second-node set signal is fed as the set signal; and the first potential difference holding part includes a capacitor having one end connected to the first-node, and the other end connected to the second-node.

3. The scanning signal line drive circuit according to claim 2, wherein to each of the stage constituent circuits, the different stage control signal to be output from the stage constituent circuit in the next stage with respect to the relevant stage constituent circuit is fed as a reset signal; and each of the stage constituent circuits further includes a first-node turn-off switching element configured to change the level of the first-node toward the OFF level on the basis of the reset signal, and a second-node turn-off switching element configured to change the level of the second-node toward the OFF level on the basis of the reset signal.

4. The scanning signal line drive circuit according to claim 3, wherein the first-node turn-off switching element includes a first electrode to which the reset signal is fed, a second electrode connected to the first-node, and a third electrode connected to the second-node.

5. The scanning signal line drive circuit according to claim 3, wherein the second-node turn-off switching element includes a first electrode to which the reset signal is fed, a second electrode connected to the second-node, and a third electrode connected to the first-output-node or the second-output-node.

6. The scanning signal line drive circuit according to claim 5, wherein each of the stage constituent circuits further includes an output-node turn-off switching element configured to change the level of the node connected to the third electrode of the second-node turn-off switching element toward the OFF level, on the basis of the reset signal.

7. The scanning signal line drive circuit according to claim 3, wherein the second-node turn-off switching element includes a first electrode to which the reset signal is fed, a second electrode connected to the second-node, and a third electrode connected to the first-node.

8. The scanning signal line drive circuit according to claim 2, wherein clock signals, which are set at substantially ½ with regard to an on-duty and are shifted in phase by 180 degrees with each other, are fed to the second electrodes of the two second output control switching elements included in the stage constituent circuits in the adjacent two stages; and each of the stage constituent circuits further includes a first third-node turn-on switching element configured to change the third-node from the OFF level to the ON level at a point in time of a start of the full charge period, on the basis of the different stage control signal to be output from the relevant stage constituent circuit or the clock signal to be fed to the second electrode of the second output control switching element included in the relevant stage constituent circuit, and a third-node turn-off switching element configured to maintain the third-node at the OFF level before the start of the full charge period, on the basis of the different stage control signal to be output from the stage constituent circuit in the preceding stage with respect to the relevant stage constituent circuit or the clock signal to be fed to the second electrode of the second output control switching element included in the stage constituent circuit in the preceding stage with respect to the relevant stage constituent circuit.

9. The scanning signal line drive circuit according to claim 8, wherein
in each of the stage constituent circuits, the third-node changes from the OFF level to the ON level on the basis of the different stage control signal to be output from the relevant stage constituent circuit.

10. The scanning signal line drive circuit claim 8, wherein
in each of the stage constituent circuits, the third-node changes from the OFF level to the ON level on the basis of the clock signal to be fed to the second electrode of the second output control switching element included in the relevant stage constituent circuit.

11. The scanning signal line drive circuit according to claim 8, wherein
each of the stage constituent circuits includes as the first third-node turn-on switching element,
a switching element configured to change the third-node from the OFF level to the ON level on the basis of the different stage control signal to be output from the relevant stage constituent circuit, and
a switching element configured to change the third-node from the OFF level to the ON level on the basis of the clock signal to be fed to the second electrode of the second output control switching element included in the relevant stage constituent circuit.

12. The scanning signal line drive circuit according to claim 8, wherein
each of the stage constituent circuits further includes
a second first-output-node turn-off switching element configured to change the level of the first-output-node toward the OFF level, the second first-output-node turn-off switching including a second electrode connected to the first-output-node and having a third electrode to which an OFF-level DC power supply potential is fed,
a fourth-node connected to a first electrode of the second first-output-node turn-off switching element,
a fourth-node control switching element including a first electrode to which the clock signal to be fed to the second electrode of the second output control switching element included in the stage constituent circuit in the preceding stage with respect to the relevant stage constituent circuit is fed, a second electrode connected to the third-node, and a third electrode connected to the fourth-node, and
a fourth-node turn-off switching element configured to change the level of the fourth-node toward the OFF level on the basis of the first-node set signal or a potential of the first-node.

13. The scanning signal line drive circuit according to claim 8, wherein
in each of the stage constituent circuits,
the different stage control signal to be output from the relevant stage constituent circuit or the clock signal to be fed to the second electrode of the second output control switching element included in the relevant stage constituent circuit is fed to the first electrode and the second electrode of the first third-node turn-on switching element, and
the third electrode of the first third-node turn-on switching element is connected to the third-node.

14. The scanning signal line drive circuit according to claim 8, wherein
each of the stage constituent circuits further includes a third-node control switching element configured to maintain the third-node at the OFF level before the start of the full charge period, and to change the third-node from the OFF level to the ON level at the point in time of the start of the full charge period, on the basis of a potential of the first-node or a potential of the second-node.

15. The scanning signal line drive circuit according to claim 1, wherein
each of the stage constituent circuits further includes a first first-output-node turn-off switching element configured to change the level of the first-output-node toward the OFF level on the basis of the reset signal.

16. The scanning signal line drive circuit according to claim 1, wherein
each of the stage constituent circuits further includes a third-node control switching element configured to maintain the third-node at the OFF level before a start of the full charge period, and to charge the third-node from the OFF level to the ON level in a period from the point in time at which the second-node is brought into the ON level to the point in time of the termination of the full charge period, on the basis of a potential of the first-node or a potential of the second-node.

17. The scanning signal line drive circuit according to claim 1, wherein
the third-node and the second-output-node are identical with each other.

18. The scanning signal line drive circuit according to claim 1, wherein
each of the stage constituent circuits further includes a second-node set signal turn-off switching element configured to change the level of the second-node set signal toward the OFF level on the basis of a potential of the third-node.

19. A display device comprising:
the display portion, and
the scanning signal line drive circuit according to claim 1.

20. A method for driving a plurality of scanning signal lines disposed in a display portion, by a scanning signal line drive circuit including a shift register that includes a plurality of stages and operates on the basis of a plurality of externally input clock signals, the method comprising, as for a stage constituent circuit that constitutes each stage of the shift register:
a first-node turn-on step of changing a first-node included in the stage constituent circuit from an OFF level to an ON level,
a second-node turn-on step of changing a second-node included in the stage constituent circuit from the OFF level to the ON level, and
a third-node turn-on step of changing a third-node included in the stage constituent circuit from the OFF level to the ON level, wherein
the stage constituent circuit includes
a first-output-node configured to output a scanning signal that drives the scanning signal line, the first-output-node being connected to the scanning signal line,
a second-output-node configured to output a different stage control signal that controls an operation of the stage constituent circuit in the different stage, a first output control switching element including a second electrode to which an ON-level DC power supply potential is fed, and a third electrode connected to the first-output-node, a second output control switching element including a second electrode to which one of the plurality of externally input clock signals is fed, and a third electrode connected to the second-output-node, the first-node connected to a first electrode of the first output control switching element, the second-node connected to a first electrode of the second output control switching element, the third-node, a first potential difference holding portion configured to hold a difference in potential between the first-node and the second-node, and a second potential difference holding portion configured to hold a difference in potential between the second-node and the third-node;

in each of the stage constituent circuits, the respective steps are executed in order of the first-node turn-on step, the second-node turn-on step and the third-node turn-on step, in the first-node turn-on step, the first-node changes from the OFF level to the ON level, on the basis of the different stage control signal to be output from the stage constituent circuit in the stage prior to the two or more stages with respect to the relevant stage constituent circuit, in the second-node turn-on step, the second-node changes from the OFF level to the ON level, on the basis of the different stage control signal which is output from the stage constituent circuit in the prior stage with respect to the relevant stage constituent circuit and is output from the stage constituent circuit in the subsequent stage with respect to the stage constituent circuit that outputs the different stage control signal used in the first-node turn-on step, upon execution of the second-node turn-on step, the first-node is brought into a floating state, and upon execution of the third-node turn-on step, the first-node and the second-node are brought into the floating state; and an amplitude of the one of the plurality of externally input clock signals is set to be smaller than an amplitude of the scanning signal.

\* \* \* \* \*